United States Patent
Aoshima et al.

(10) Patent No.: US 8,221,959 B2
(45) Date of Patent: Jul. 17, 2012

(54) LITHOGRAPHIC PRINTING PLATE PRECURSOR AND METHOD FOR PREPARATION OF LITHOGRAPHIC PRINTING PLATE

(75) Inventors: Toshihide Aoshima, Shizuoka (JP); Hidekazu Oohashi, Shizuoka (JP)

(73) Assignee: FUJIFILM Corporation, Tokyo (JP)

( * ) Notice: Subject to any disclaimer, the term of this patent is extended or adjusted under 35 U.S.C. 154(b) by 0 days.

(21) Appl. No.: 11/782,982

(22) Filed: Jul. 25, 2007

(65) Prior Publication Data

US 2008/0026324 A1    Jan. 31, 2008

(30) Foreign Application Priority Data

Jul. 25, 2006    (JP) ................ P.2006-202035

(51) Int. Cl.
G03F 7/00     (2006.01)
G03F 7/26     (2006.01)

(52) U.S. Cl. .............. 430/302; 430/271.1; 430/270.1; 101/453; 101/463.1

(58) Field of Classification Search ............ 430/156, 430/302, 270.1
See application file for complete search history.

(56) References Cited

U.S. PATENT DOCUMENTS

| 5,900,345 | A * | 5/1999 | Platzer et al. ............ 430/156 |
| 5,935,756 | A * | 8/1999 | Kaifu et al. ............. 430/138 |
| 7,029,618 | B2 * | 4/2006 | Pelosi et al. .......... 264/331.21 |
| 2004/0013968 | A1 * | 1/2004 | Teng .................. 430/270.1 |
| 2007/0207411 | A1 * | 9/2007 | Nagase ................. 430/302 |

FOREIGN PATENT DOCUMENTS

| EP | 1070990 A1 | 1/2001 |
| EP | 1091251 A2 * | 4/2001 |
| EP | 1199605 A1 | 4/2002 |
| EP | 1621339 A1 | 2/2006 |
| JP | 2001356474 A | 12/2001 |
| JP | 200665321 A | 3/2006 |

OTHER PUBLICATIONS www.chemyq.com.*
Communication dated Nov. 8, 2011 from the Japanese Patent Office in counterpart Japanese application No. 2007-190807.

* cited by examiner

Primary Examiner — Cynthia Kelly
Assistant Examiner — Chanceity Robinson
(74) Attorney, Agent, or Firm — Sughrue Mion, PLLC

(57) ABSTRACT

A lithographic printing plate precursor comprising: an aluminum support having a hydrophilic surface; and a photosensitive layer comprising a binder polymer having an acid value of 0.3 meq/g or less, wherein the photosensitive layer comprises a pigment dispersed with a pigment dispersant which is free from a —COOH group, a —$PO_3H_2$ group and a —$OPO_3H_2$ group.

22 Claims, 1 Drawing Sheet

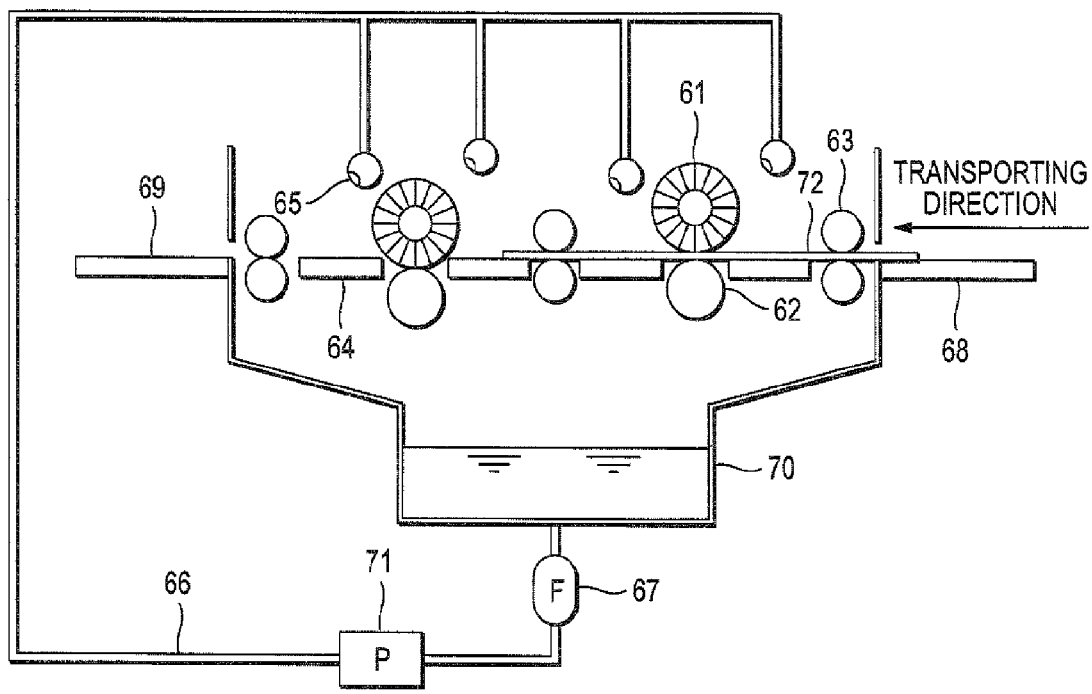

LITHOGRAPHIC PRINTING PLATE PRECURSOR AND METHOD FOR PREPARATION OF LITHOGRAPHIC PRINTING PLATE

FIELD OF THE INVENTION

The present invention relates to a lithographic printing plate precursor using a binder having substantially no acid group, particularly to a lithographic printing plate precursor excellent in view of stain and residual color. The invention also relates to a method for preparation of a lithographic printing plate using the lithographic printing plate precursor.

BACKGROUND OF THE INVENTION

Heretofore, a lithographic printing plate precursor comprises a photosensitive resin layer provided on a support having a hydrophilic surface. As for the plate-making method thereof, the lithographic printing plate precursor is ordinarily subjected to open frame exposure (mask exposure) via a lith film and then removal of the non-image area with a developer to obtain a desired printing plate. However, with the recent progress of digitized techniques, a computer-to-plate (CTP) technique of directly conducting exposure process on the surface of the lithographic printing plate precursor by scanning according to digitized image data with highly convergent light, for example, a laser beam, without using a lith film has been developed. Photosensitive lithographic printing plates (lithographic printing plate precursors) adapted for the technique have also been developed.

As the lithographic printing plate precursors suitable for exposure with a laser beam, lithographic printing plate precursors having a polymerizable photosensitive layer are exemplified. In the polymerizable photosensitive layer, it is easily enable to increase sensitivity by appropriately selecting a polymerization initiator or a polymerization initiation system (hereinafter also simply referred to as an "initiator" and an "initiation system", respectively) in comparison with other conventional photosensitive layers.

As the laser light source, for example, a semiconductor laser of 405 nm or 830 nm or an FD-YAG laser can be used. In recent years, a CTP system equipped with a semiconductor laser of 405 nm has become widespread in view of handling properties.

In the hitherto known plate-making process of lithographic printing plate precursor, after the exposure as described above, the step of removing the unnecessary photosensitive layer by dissolving, for example, with a developer is required. However, it is one of the subjects to save or simplify such an additional wet treatment described above. Particularly, since disposal of liquid wastes discharged accompanying the wet treatment has become a great concern throughout the field of industry in view of the consideration for global environment in recent years, the demand for the solution of the above-described subject has been increased more and more.

As one of simple plate-making methods in response to the above-described requirement, a simple development processing with an aqueous non-alkaline solution without using an aqueous alkaline solution has been proposed. In such a development processing, an aqueous solution having pH of 10 or less is ordinarily used. For instance, in U.S. Patent Publication No. 2004/0013968 is described a processing method of lithographic printing plate precursor which comprises preparing a lithographic printing plate precursor comprising (i) a hydrophilic support and (ii) an oleophilic heat-sensitive layer which contains a radical-polymerizable ethylenically unsaturated monomer, a radical polymerization initiator and an infrared absorbing dye, is hardened with infrared laser exposure and is developable with an aqueous developer containing 60% by weight or more of water and having pH of 2.0 to 10.0, exposing imagewise the lithographic printing plate precursor with an infrared laser, and removing the unhardened region of the heat-sensitive layer with the aqueous developer.

On the other hand, as for the lithographic printing plate precursor, it is ordinarily conducted to incorporate a plate-inspecting agent (a coloring agent, for example, a dye or pigment) into the photosensitive layer of lithographic printing plate precursor in order to easily check the image-forming property.

Among them, as the plate-inspecting agent incorporated into the photosensitive layer of lithographic printing plate precursor of photopolymerization type, a pigment is often used because the pigment has an advantage of not inhibiting the photopolymerization. In order to improve dispersibility of the pigment, it is conventional to coat the pigment with a polymer or to substitute the surface of pigment with an acid group, base group or the like. However, for the lithographic printing plate precursor of simple development processing type with an aqueous non-alkaline solution, the pigment in the non-image area can not be completely removed after the development and a problem arises in that the color remains in the non-image area and stain occurs during printing.

SUMMARY OF THE INVENTION

An object of the invention is to provide a lithographic printing plate precursor of simple development processing type with an aqueous non-alkaline solution in which pigment in the non-image area can be well removed after the development, so that the plate-inspecting property can be improved due to elimination of residual color in the non-image area and the occurrence of stain during printing can be prevented, and a method for preparation of a lithographic printing plate using the lithographic printing plate precursor.

As a result of the intensive investigations to achieve the above-described object, the inventor has found that the above-described object can be achieved by a lithographic printing plate precursor comprising an aluminum support having a hydrophilic surface and a photosensitive layer containing a binder polymer having an acid value of 0.3 meq/g or less, wherein the photosensitive layer contains a pigment dispersed using a pigment dispersant which does not have any of a —COOH group, a —PO$_3$H$_2$ group and a —OPO$_3$H$_2$ group to complete the present invention.

Specifically, the invention includes the following items.

(1) A lithographic printing plate precursor comprising: an aluminum support having a hydrophilic surface; and a photosensitive layer containing a binder polymer having an acid value of 0.3 meq/g or less, wherein the photosensitive layer contains a pigment dispersed using a pigment dispersant which does not have (is free from) any of a —COOH group, a —PO$_3$H$_2$ group and a —OPO$_3$H$_2$ group.

(2) The lithographic printing plate precursor as described in (1) above, wherein the pigment dispersant is a compound comprising at least a unit having (a) a functional group adsorbing to the pigment and a unit having (b) a functional group imparting dispersibility in an organic solvent.

(3) The lithographic printing plate precursor as described in (2) above, wherein the functional group adsorbing to the pigment included in the unit (a) is a functional group selected from groups represented by the following formulae:

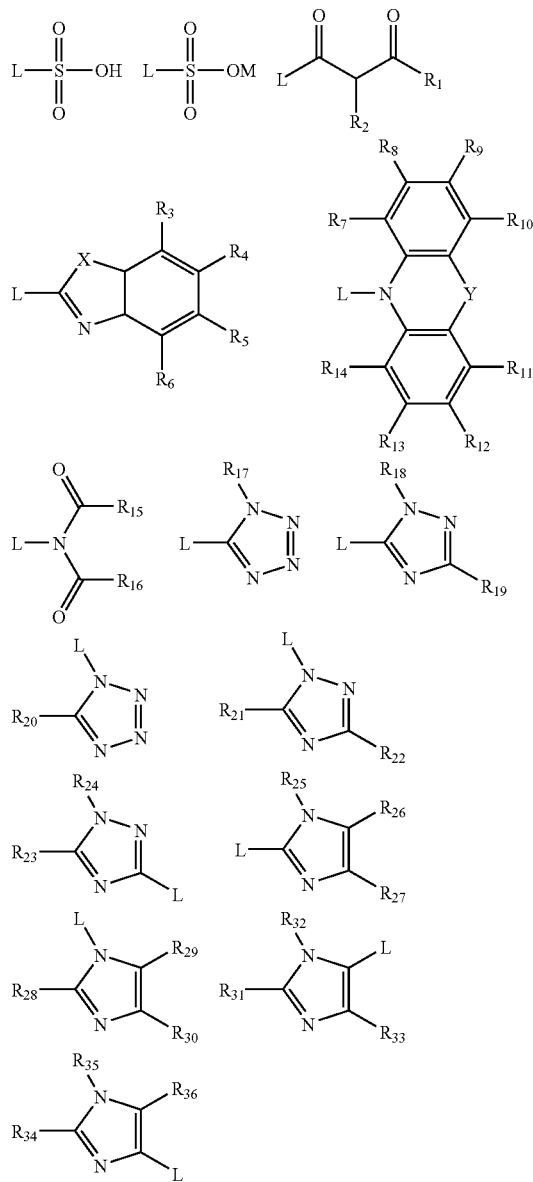

In the formulae, $R_1$ to $R_{36}$ each independently represents an alkyl group which may have a substituent, an aryl group which may have a substituent, an alkenyl group which may have a substituent, an alkynyl group which may have a substituent, —OR, —NRR', —SR, —COR, —COOR, —CONRR', —OCOR, —OCONRR', —OCOOR, —NRCOR', —NRCOOR', —NRCONR'R", —N=R, —$SO_2$R, —$SO_3$R, —$SO_2$NRR', a hydrogen atom, a halogen atom, a cyano group, a nitro group, a hydroxy group or a mercapto group (wherein R, R' or R" each represents an alkyl group, an aryl group, an alkenyl group, an alkynyl group or a hydrogen atom or may be connected with each other to form a ring, provided that a —COOH group is not formed) or $R_1$ to $R_{36}$ may be connected with each other to form a ring, L represents a divalent connecting group for connecting to a compound skeleton and comprising one or more atoms selected from a carbon atom, an oxygen atom, a nitrogen atom, a sulfur atom, a phosphorus atom, a silicon atom, a hydrogen atom, a halogen atom and a boron atom, X represents an oxygen atom, a sulfur atom, a selenium atom or $NR_{37}$ (wherein $R_{37}$ has the same meaning as $R_1$), Y represents a covalent bond, an oxygen atom, a sulfur atom, $NR_{38}$ (wherein $R_{38}$ has the same meaning as $R_1$), CO or $SO_2$, and M represents an alkali metal.

(4) The lithographic printing plate precursor as described in (2) above, wherein the functional group imparting dispersibility in an organic solvent included in the unit (b) contains a hydrocarbon group having 6 or more carbon atoms.

(5) The lithographic printing plate precursor as described in any one of (1) to (4) above, wherein the photosensitive layer further contains a radical polymerizable compound.

(6) The lithographic printing plate precursor as described in any one of (1) to (5) above, wherein the binder polymer having an acid value of 0.3 meq/g or less has a weight average molecular weight of 10,000 or more.

(7) The lithographic printing plate precursor as described in any one of (1) to (6) above, wherein the photosensitive layer further contains a sensitizing dye having absorption in a wavelength range of 360 to 450 nm.

(8) The lithographic printing plate precursor as described in any one of (1) to (7) above which further comprises a protective layer on the photosensitive layer.

(9) A method for preparation of a lithographic printing plate comprising exposing imagewise the lithographic printing plate precursor as claimed in any one of (1) to (8) above with a laser having an oscillation wavelength in a wavelength range of 360 to 450 nm and rubbing a surface of the exposed lithographic printing plate precursor with a rubbing member in the presence of a developer having pH of 2 to 10 in an automatic processor equipped with the rubbing member to remove the protective layer and an unexposed area of the photosensitive layer.

(10) A method for preparation of a lithographic printing plate comprising exposing imagewise the lithographic printing plate precursor as claimed in any one of (1) to (8) above with a laser having an oscillation wavelength in a wavelength range of 360 to 450 nm, heating the exposed lithographic printing plate precursor at temperature of 70° C. or more and rubbing a surface of the heated lithographic printing plate precursor with a rubbing member in the presence of a developer having pH of 2 to 10 in an automatic processor equipped with the rubbing member to remove the protective layer and an unexposed area of the photosensitive layer.

(11) A method for preparation of a lithographic printing plate comprising exposing imagewise with a laser a lithographic printing plate precursor comprising an aluminum support having a hydrophilic surface and a photosensitive layer containing a binder polymer, wherein the photosensitive layer contains a pigment dispersed using a pigment dispersant comprising at least (a) a unit having a functional group adsorbing to the pigment and (b) a unit having a functional group imparting dispersibility in an organic solvent, and developing the exposed lithographic printing plate precursor with a developer having pH of 2 to 10.

According to the invention, the following embodiments are also preferable.

(12) The lithographic printing plate precursor as described in any one of (1) to (8) above which comprises a pigment dispersion comprising a basic pigment dispersed using a pigment dispersant of a copolymer wherein the unit (a) having a functional group adsorbing to the pigment is a structural unit derived from a polymerizable unsaturated monomer having a sulfonic acid group or a salt thereof and the unit (b) having a functional group imparting dispersibility in an organic solvent is a structural unit derived from a nonionic polymerizable unsaturated monomer having a polyoxyalkylene chain.

(13) The lithographic printing plate precursor as described in any one of (1) to (8) above which comprises a pigment dispersion comprising an acidic pigment dispersed using a pigment dispersant of a copolymer wherein the unit (a) having a functional group adsorbing to the pigment is a structural unit derived from a polymerizable unsaturated monomer having an amino group and the unit (b) having a functional group imparting dispersibility in an organic solvent is a structural unit derived from a nonionic polymerizable unsaturated monomer having a polyoxyalkylene chain.

(14) The lithographic printing plate precursor as described in any one of (1) to (8) above which comprises a pigment dispersion comprising a basic pigment dispersed using a pigment dispersant of a graft copolymer wherein the unit (a) having a functional group adsorbing to the pigment is a structural unit derived from a polymerizable unsaturated monomer having a sulfonic acid group or a salt thereof and the unit (b) having a functional group imparting dispersibility in an organic solvent is a graft chain.

As a result of the investigations according to the inventor, it becomes clear that the problem of residual color after development and stain during printing is caused by a —COOH group, a —PO$_3$H$_2$ group or a —OPO$_3$H$_2$ group included in a pigment dispersant. Although these functional groups have a function capable of well dispersing pigment, they are apt to adsorb on the surface of an aluminum support and as a result, it is believed that the pigment remains on the surface of an aluminum support after development to cause the above-described problem of residual color and stain. For lithographic printing plate precursors using conventional alkali development, on the other hand, the problem of residual color and stain does not occur even when the pigment dispersant including the above-described functional group is used because of two reasons that the surface of aluminum support is slightly dissolved with an aqueous alkali solution at the development and that the above-described functional group is neutralized with the aqueous alkali solution to lose the adsorbing property onto the surface of aluminum support. Thus, it can be said that the above-described problem is an inherent phenomenon in the lithographic printing plate precursor using the non-alkaline developer. According to the lithographic printing plate precursor of the invention, a photosensitive layer containing a pigment dispersed using a pigment dispersant which does not have any of a —COOH group, a —PO$_3$H$_2$ group and a —OPO$_3$H$_2$ group is provided on an aluminum support having a hydrophilic surface to prevent the adsorption of pigment dispersant onto the aluminum support, whereby the above-described problems can be solved.

According to the present invention, a lithographic printing plate precursor of simple development processing type with an aqueous non-alkaline solution in which pigment in the non-image area can be well removed after the development, so that the plate-inspecting property can be improved due to elimination of residual color in the non-image area and the occurrence of stain during printing can be prevented, and a method for preparation of a lithographic printing plate using the lithographic printing plate precursor plate can be provided.

BRIEF DESCRIPTION OF THE DRAWINGS

FIG. 1 shows a structure of an automatic development processor.

DESCRIPTION OF REFERENCE NUMERALS

61: Rotating brush roller
62: Backing roller
63: Transport roller
64: Transport guide plate
65: Spray pipe
66: Pipe line
67: Filter
68: Plate supply table
69: Plate discharge table
70: Developer tank
71: Circulating pump
72: Plate

DETAILED DESCRIPTION OF THE INVENTION

Now, the lithographic printing plate precursor and plate-making method thereof according to the present invention are described in more detail below.

Aluminum Support Having Hydrophilic Surface

The aluminum support having a hydrophilic surface for use in the lithographic printing plate precursor according to the invention is produced from an aluminum plate which has good dimensional stability and is relatively inexpensive.

The aluminum plate includes a pure aluminum plate, an alloy plate comprising aluminum as a main component and containing a trace amount of hetero elements and a thin film of aluminum or aluminum alloy laminated with plastic. The hetero element contained in the aluminum alloy includes, for example, silicon, iron, manganese, copper, magnesium, chromium, zinc, bismuth, nickel and titanium. The content of the hetero element in the aluminum alloy is preferably 10% by weight or less. Although a pure aluminum plate is preferred in the invention, since completely pure aluminum is difficult to be produced in view of the refining technique, the aluminum plate may slightly contain the hetero element. The composition is not specified for the aluminum plate and those materials known and used conventionally can be appropriately utilized.

The thickness of the support is preferably from 0.1 to 0.6 mm, more preferably from 0.15 to 0.4 mm, and still more preferably from 0.2 to 0.3 mm.

Prior to the use of aluminum plate, a surface treatment, for example, roughening treatment or anodizing treatment is preferably performed. The surface treatment facilitates improvement in the hydrophilic property and ensures adhesion between the photosensitive layer and the support. In advance of the roughening treatment of the aluminum plate, a degreasing treatment, for example, with a surfactant, an organic solvent or an aqueous alkaline solution is conducted for removing rolling oil on the surface thereof, if desired.

The roughening treatment of the surface of the aluminum plate is conducted by various methods and includes, for example, mechanical roughening treatment, electrochemical roughening treatment (roughening treatment of electrochemically dissolving the surface) and chemical roughening treatment (roughening treatment of chemically dissolving the surface selectively).

As the method of the mechanical roughening treatment, a known method, for example, a ball grinding method, a brush grinding method, a blast grinding method or a buff grinding method can be used.

The electrochemical roughening treatment method includes, for example, a method of conducting it by passing alternating current or direct current in an electrolyte containing an acid, for example, hydrochloric acid or nitric acid. Also, a method of using a mixed acid described in JP-A-54-63902 can be used.

The aluminum plate after the roughening treatment is then subjected, if desired, to an alkali etching treatment using an aqueous solution, for example, of potassium hydroxide or sodium hydroxide and further subjected to a neutralizing treatment, and then subjected to an anodizing treatment in order to enhance the abrasion resistance, if desired.

As the electrolyte used for the anodizing treatment of the aluminum plate, various electrolytes capable of forming porous oxide film can be used. Ordinarily, sulfuric acid, hydrochloric acid, oxalic acid, chromic acid or a mixed acid thereof is used. The concentration of the electrolyte can be appropriately determined depending on the kind of the electrolyte.

Since the conditions of the anodizing treatment are varied depending on the electrolyte used, they cannot be defined generally. However, it is ordinarily preferred that electrolyte concentration in the solution is from 1 to 80% by weight, liquid temperature is from 5 to 70° C., current density is from 5 to 60 A/dm$^2$, voltage is from 1 to 100 V, and electrolysis time is from 10 seconds to 5 minutes. The amount of the anodized film formed is preferably from 1.0 to 5.0 g/m$^2$ and more preferably from 1.5 to 4.0 g/m$^2$. In the above-described range, good printing durability and favorable scratch resistance in the non-image area of lithographic printing plate can be achieved.

The aluminum plate subjected to the surface treatment and having the anodized film is used as it is as the support in the invention. However, in order to more improve adhesion to a layer provided thereon, hydrophilicity, resistance to stain, heat insulating property or the like, other treatment, for example, a treatment for enlarging micropores or a sealing treatment of micropores of the anodized film described in JP-A-2001-253181 and JP-A-2001-322365, or a surface hydrophilizing treatment by immersing in an aqueous solution containing a hydrophilic compound, may be appropriately conducted. Needless to say, the enlarging treatment and sealing treatment are not limited to those described in the above-described patents and any conventionally known method may be employed.

As the sealing treatment, as well as a sealing treatment with steam, a sealing treatment with an aqueous solution containing an inorganic fluorine compound, for example, fluorozirconic acid alone or sodium fluoride, a sealing treatment with steam having added thereto lithium chloride or a sealing treatment with hot water may be employed.

Among them, the sealing treatment with an aqueous solution containing an inorganic fluorine compound, the sealing treatment with water vapor and a sealing treatment with hot water are preferred.

The hydrophilizing treatment includes an alkali metal silicate method described in U.S. Pat. Nos. 2,714,066, 3,181,461, 3,280,734 and 3,902,734. In the method, the support is subjected to an immersion treatment or an electrolytic treatment in an aqueous solution, for example, of sodium silicate. In addition, the hydrophilizing treatment includes, for example, a method of treating with potassium fluorozirconate described in JP-B-36-22063 and a method of treating with polyvinylphosphonic acid described in U.S. Pat. Nos. 3,276,868, 4,153,461, and 4,689,272.

The support preferably has a center line average roughness of 0.10 to 1.2 μm. In the above-described range, good adhesion to the photosensitive layer, good printing durability, and good stain resistance can be achieved.

The color density of the support is preferably from 0.15 to 0.65 in terms of the reflection density value. In the above-described range, good image-forming property by preventing halation at the image exposure and good plate-inspecting property after development can be achieved.

Photosensitive Layer

The photosensitive layer of the lithographic printing plate precursor according to the invention is a photosensitive layer capable of being removed by rubbing a surface of the exposed lithographic printing plate precursor with a rubbing member in the presence of a developer having pH of 2 to 10 in an automatic processor and includes as the essential components, a binder polymer having an acid value of 0.3 meq/g or less and a pigment dispersed using a pigment dispersant which does not have any of a —COOH group, a —PO$_3$H$_2$ group and a —OPO$_3$H$_2$ group. According to a preferable embodiment, a radical polymerizable compound is added to the photosensitive layer. Further, the photosensitive layer may contain a sensitizing dye having absorption in a wavelength range of 360 to 450 nm and a polymerization initiator, and moreover, a coloring agent and other appropriate components, if desired.

The control of developing speed in the unexposed area of the photosensitive layer and penetration speed of a developer into the photosensitive layer after curing can be performed in a conventional manner in addition to the method of using the above-described binder polymer. For instance, in order to increase the developing speed in the unexposed area, the addition of a hydrophilic compound is useful, and to restrain the penetration of developer into the exposed area, the addition of a hydrophobic compound is useful.

In the lithographic printing plate precursor according to the invention, an intermediate layer (also referred to as an "undercoat layer") may be provided between the photosensitive layer and the support for the purpose of increasing the adhesion property therebetween and improving the stain resistance. Further, a protective layer (also referred to as an "overcoat layer") is provided on the photosensitive layer. The protective layer prevents a low molecular weight compound, for example, oxygen or a basic substance present in the atmosphere, which inhibits the image-forming reaction initiated in the photosensitive layer upon the exposure, from permeating into the photosensitive layer, whereby the protective layer makes it possible to perform the exposure in the atmosphere.

Each of the components constituting the photosensitive composition for forming the photosensitive layer of the lithographic printing plate precursor according to the invention will be described in detail below.

Binder Polymer

The binder polymer for use in the invention is not particularly restricted and a binder polymer having an acid value of 0.3 meq/g or less as described below is preferably used.

The binder polymer having an acid value of 0.3 meq/g or less for use in the invention is a binder polymer containing an acidic group capable of being titrated with KOH, for example, a carboxylic acid group, a sulfonic acid group, a phosphoric acid group, a phenolic hydroxy group or a sulfonamido group only in an amount of 0.3 meq/g or less. The acid value is preferably 0.1 meq/g or less. Specifically, the binder polymer which can be used in the invention is preferably insoluble in an aqueous solution having pH of 10 or less. The solubility of the binder polymer in the aqueous solution having pH of 10 or less is preferably 0.5% by weight or less, more preferably 0.1% by weight or less. By using such a binder polymer, film strength, water resistance and ink-receptive property of the photosensitive layer are increased and improvement in printing durability can be achieved.

As for the binder polymer, conventionally known binder polymers preferably having the solubility in the above-described range can be used without limitation as long as the performance of the lithographic printing plate precursor according to the invention is not impaired, and a linear organic polymer having film-forming property is preferred.

Preferable examples of such a binder polymer include a polymer selected from an acrylic resin, a polyvinyl acetal resin, a polyurethane resin, a polyamide resin, an epoxy resin, a methacrylic resin, a styrene-based resin and a polyester resin. Among these, an acrylic resin is preferred, and a (meth) acrylic acid ester copolymer is more preferred. More specifically, a copolymer of a (meth)acrylic acid alkyl or aralkyl ester with a (meth)acrylic acid ester containing a —CH$_2$CH$_2$O— or —CH$_2$CH$_2$NH— unit in R of the ester residue (—COOR) of the (meth)acrylic acid ester is particularly preferred. The alkyl group in the (meth)acrylic acid alkyl ester is preferably an alkyl group having from 1 to 5 carbon atoms, more preferably a methyl group. Preferred examples of the (meth)acrylic acid aralkyl ester include benzyl (meth) acrylate.

The binder polymer can be imparted with a crosslinking property in order to increase the film strength of the image area.

In order to impart the crosslinking property to the binder polymer, a crosslinkable functional group, for example, an ethylenically unsaturated bond is introduced into a main chain or side chain of the polymer. The crosslinkable functional group may be introduced by copolymerization or a polymer reaction.

The term "crosslinkable group" as used herein means a group capable of crosslinking the binder polymer in the process of a radical polymerization reaction which is caused in the photosensitive layer, when the lithographic printing plate precursor is exposed to light. The crosslinkable group is not particularly restricted as long as it has such a function and includes, for example, an ethylenically unsaturated bonding group, an amino group or an epoxy group as a functional group capable of conducting an addition polymerization reaction. Also, a functional group capable of forming a radical upon irradiation with light may be used and such a crosslinkable group includes, for example, a thiol group, a halogen atom and an onium salt structure. Among them, the ethylenically unsaturated bonding group is preferable, and functional groups represented by formulae (1) to (3) shown below are particularly preferable.

Formula (1):

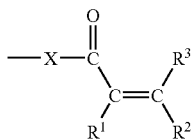

In formula (1), $R^1$ to $R^3$ each independently represents a hydrogen atom or a monovalent organic group. $R^1$ preferably includes, for example, a hydrogen atom or an alkyl group which may have a substituent. Among them, a hydrogen atom or a methyl group is preferable because of high radical reactivity. $R^2$ and $R^3$ each independently preferably includes, for example, a hydrogen atom, a halogen atom, an amino group, a carboxyl group, an alkoxycarbonyl group, a sulfo group, a nitro group, a cyano group, an alkyl group which may have a substituent, an aryl group which may have a substituent, an alkoxy group which may have a substituent, an aryloxy group which may have a substituent, an alkylamino group which may have a substituent, an arylamino group which may have a substituent, an alkylsulfonyl group which may have a substituent and an arylsulfonyl group which may have a substituent. Among them, a hydrogen atom, a carboxyl group, an alkoxycarbonyl group, an alkyl group which may have a substituent or an aryl group which may have a substituent is preferable because of high radical reactivity.

X represents an oxygen atom, a sulfur atom or —N(R$^{12}$)—, and R$^{12}$ represents a hydrogen atom or a monovalent organic group. The monovalent organic group represented by R$^{12}$ includes, for example, an alkyl group which may have a substituent. Among them, a hydrogen atom, a methyl group, an ethyl group or an isopropyl group is preferable because of high radical reactivity.

Examples of the substituent introduced include an alkyl group, an alkenyl group, an alkynyl group, an aryl group, an alkoxy group, an aryloxy group, a halogen atom, an amino group, an alkylamino group, an arylamino group, a carboxyl group, an alkoxycarbonyl group, a sulfo group, a nitro group, a cyano group, an amido group, an alkylsulfonyl group and an arylsulfonyl group.

Formula (2):

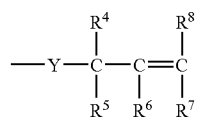

In formula (2), $R^4$ to $R^8$ each independently represents a hydrogen atom or a monovalent organic group. $R^4$ to $R^8$ each independently preferably includes, for example, a hydrogen atom, a halogen atom, an amino group, a dialkylamino group, a carboxyl group, an alkoxycarbonyl group, a sulfo group, a nitro group, a cyano group, an alkyl group which may have a substituent, an aryl group which may have a substituent, an alkoxy group which may have a substituent, an aryloxy group which may have a substituent, an alkylamino group which may have a substituent, an arylamino group which may have a substituent, an alkylsulfonyl group which may have a substituent and an arylsulfonyl group which may have a substituent. Among them, a hydrogen atom, a carboxyl group, an alkoxycarbonyl group, an alkyl group which may have a substituent or an aryl group which may have a substituent is preferable.

Examples of the substituent introduced include those described in Formula (1). Y represents an oxygen atom, a sulfur atom or —N(R$^{12}$)—, and R$^{12}$ has the same meaning as R$^{12}$ defined in Formula (1). Preferable examples for R$^{12}$ are also same as those described in Formula (1).

Formula (3):

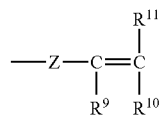

In formula (3), $R^9$ preferably represents a hydrogen atom or an alkyl group which may have a substituent. Among them, a hydrogen atom or a methyl group is preferable because of high radical reactivity. $R^{10}$ and $R^{11}$ each independently represents, for example, a hydrogen atom, a halogen atom, an amino group, a dialkylamino group, a carboxyl group, an alkoxycarbonyl group, a sulfo group, a nitro group, a cyano group, an alkyl group which may have a substituent, an aryl group which may have a substituent, an alkoxy group which may have a substituent, an aryloxy group which may have a substituent, an alkylamino group which may have a substituent, an arylamino group which may have a substituent, an alkylsulfonyl group which may have a substituent and an arylsulfonyl group which may have a substituent. Among them, a hydrogen atom, a carboxyl group, an alkoxycarbonyl group, an alkyl group which may have a substituent or an aryl group which may have a substituent is preferable because of high radical reactivity.

Examples of the substituent introduced include those described in Formula (1). Z represents an oxygen atom, a sulfur atom, $—N(R^{13})—$ or a phenylene group which may have a substituent. $R^{13}$ includes an alkyl group which may have a substituent or the like. Among them, a methyl group, an ethyl group or an isopropyl group is preferable because of high radical reactivity.

Among the polymers, a (meth)acrylic acid copolymer and a polyurethane each having a crosslinkable group in the side chain thereof are more preferable.

In the binder polymer having a crosslinking property, for example, a free radical (a polymerization initiating radical or a propagating radical in the process of polymerization of the polymerizable compound) is added to the crosslinkable functional group to cause an addition-polymerization between polymers directly or through a polymerization chain of the polymerizable compound, as a result, crosslinking is formed between polymer molecules to effect curing. Alternatively, an atom (for example, a hydrogen atom on the carbon atom adjacent to the functional crosslinkable group) in the polymer is withdrawn by a free radical to produce a polymer radical and the polymer radicals combine with each other to form crosslinking between polymer molecules to effect curing.

The content of the crosslinkable group (content of radical-polymerizable unsaturated double bond determined by iodine titration) in the binder polymer is preferably from 0.1 to 10.0 mmol, more preferably from 1.0 to 7.0 mmol, and most preferably from 2.0 to 5.5 mmol, per g of the binder polymer.

In view of improvement in the developing property with an aqueous solution, the binder polymer is preferably hydrophilic. On the other hand, in view of increasing the printing durability, it is important that the binder polymer has good compatibility with the polymerizable compound contained in the photosensitive layer, that is, the binder polymer is preferably oleophilic. From these standpoints, it is also effective in the invention to copolymerize a hydrophilic group-containing component and an oleophilic group-containing component in the binder polymer in order to improve the developing property and the printing durability. Examples of the hydrophilic group-containing component which can be preferably used include those having a hydrophilic group, for example, a hydroxy group, a carboxylate group, a hydroxyethyl group, an ethyleneoxy group, a hydroxypropyl group, a polyoxyethyl group, a polyoxypropyl group, an amino group, an aminoethyl group, an aminopropyl group, an ammonium group, an amido group and a carboxymethyl group.

The binder polymer preferably has a weight average molecular weight of 5,000 or more, more preferably of 10,000 or more, and still more preferably from 10,000 to 300,000, and a number average molecular weight of 1,000 or more, more preferably from 2,000 to 250,000. The polydispersity (weight average molecular weight/number average molecular weight) is preferably from 1.1 to 10.

The binder polymer may be any of a random polymer, a block polymer, a graft polymer and the like, and it is preferably a random polymer.

The binder polymers may be used individually or in combination of two or more thereof.

The content of the binder polymer is ordinarily from 5 to 90% by weight, preferably from 10 to 70% by weight, more preferably from 10 to 60% by weight, based on the total solid content of the photosensitive layer. In the above-described range, preferable strength of the image area and good image-forming property can be obtained.

Pigment Dispersant Which Does Not Have Any of —COOH Group, —PO$_3$H$_2$ Group and —OPO$_3$H$_2$ Group As the pigment dispersant for use in the invention, any compound which does not have any of a —COOH group, a —PO$_3$H$_2$ group and a —OPO$_3$H$_2$ group can be suitably used. The pigment dispersant is preferably a compound comprising at least (a) a unit having a functional group adsorbing to the pigment and (b) a unit having a functional group imparting dispersibility in an organic solvent, and more preferably a polymer compound.

The functional group adsorbing to the pigment included in the unit (a) can be variously selected depending on the kind of pigment. In the case where the surface of pigment is substituted with an acidic functional group, the functional group in the unit (a) is preferably a basic functional group, for example, an amino group or an anilino group, and in the case where the surface of pigment is substituted with a basic functional group, the functional group in the unit (a) is preferably an acidic functional group other than a —COOH group, a —PO$_3$H$_2$ group and a —OPO$_3$H$_2$ group, for example, a sulfonic acid group. Also, in the case where the pigment contains a metal atom, the functional group is preferably a functional group having affinity with the metal atom (capable of forming a coordinate bond, ionic bond or covalent bond to the metal atom), and in the case where the pigment includes an aromatic group, the functional group is preferably an aromatic group or a heteroaromatic cyclic group. Further, a functional group (for example, a heterocyclic group) having a skeleton similar to the pigment to be used is also preferable. Of the functional groups, a functional group having an adsorbing amount to pigment of 0.01 mmol/g or more is more preferable. The term "adsorbing amount to pigment" as used herein means a value obtained by the following method.

Specifically, a low molecular compound (having a molecular weight of 1,000 or less) having the functional group is dissolved in an appropriate solvent to prepare Solution 1. To Solution 1 is added 1 g of a pigment to be used and the mixture is stirred at room temperature for 4 hours and filtered with a filter to prepare Solution 2. The amounts of the low molecular compound having the functional group included in Solution 1 and Solution 2 are determined by HPLC and from the amount decreased, an amount of the low molecular compound adsorbed to 1 g of the pigment is obtained.

As the functional group adsorbing to the pigment, any of the functional groups as described above may be suitably used and functional groups represented by formulae shown below are particularly preferable.

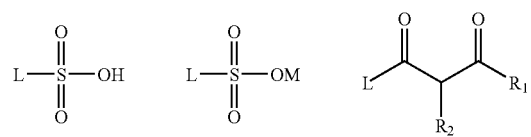

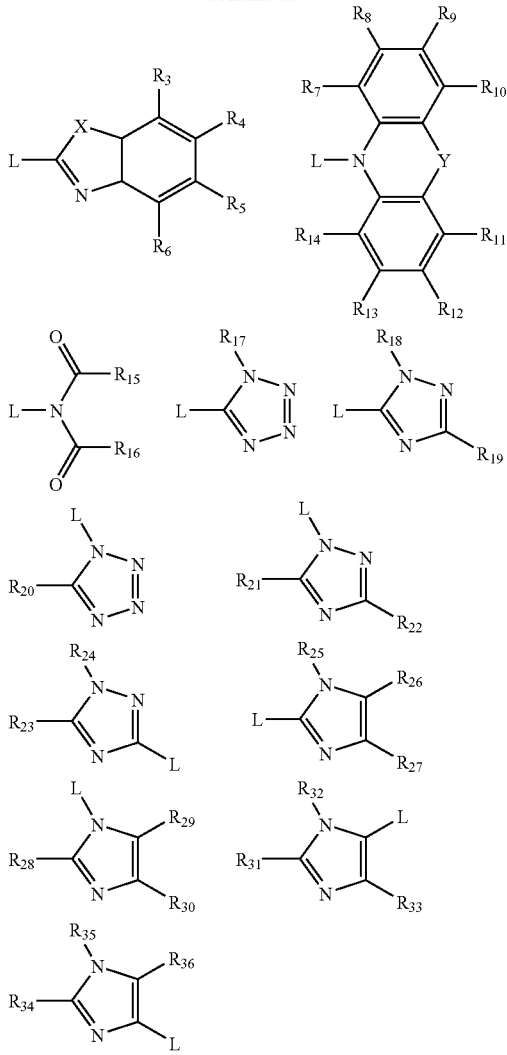

In the formulae, $R_1$ to $R_{36}$ each independently represents an alkyl group which may have a substituent, an aryl group which may have a substituent, an alkenyl group which may have a substituent, an alkynyl group which may have a substituent, —OR, —NRR', —SR, —COR, —COOR, —CONRR', —OCOR, —OCONRR', —OCOOR, —NRCOR', —NRCOOR', —NRCONR'R", —N=R, —SO$_2$R, —SO$_3$R, —SO$_2$NRR', a hydrogen atom, a halogen atom, a cyano group, a nitro group, a hydroxy group or a mercapto group (wherein R, R' or R" each represents an alkyl group, an aryl group, an alkenyl group, an alkynyl group or a hydrogen atom or may be connected with each other to form a ring, provided that a —COOH group is not formed) or $R_1$ to $R_{36}$ may be connected with each other to form a ring, L represents a divalent connecting group for connecting to a compound skeleton and comprising one or more atoms selected from a carbon atom, an oxygen atom, a nitrogen atom, a sulfur atom, a phosphorus atom, a silicon atom, a hydrogen atom, a halogen atom and a boron atom, X represents an oxygen atom, a sulfur atom, a selenium atom or NR$_{37}$ (wherein $R_{37}$ has the same meaning as $R_1$), Y represents a covalent bond, an oxygen atom, a sulfur atom, NR$_{38}$ (wherein $R_{38}$ has the same meaning as $R_1$), CO or SO$_2$, and M represents an alkali metal.

As the alkali metal represented by M, sodium and potassium are particularly preferable.

Specific examples of the alkyl group include a straight-chain, branched or cyclic alkyl group having from 1 to 30 carbon atoms, for example, a methyl group, an ethyl group, a propyl group, a butyl group, a pentyl group, a hexyl group, a heptyl group, an octyl group, a nonyl group, a decyl group, an undecyl group, a dodecyl group, a tridecyl group, a hexadecyl group, an octadecyl group, an eicosyl group, an isopropyl group, an isobutyl group, a sec-butyl group, a tert-butyl group, an isopentyl group, a neopentyl group, a 1-methylbutyl group, an isohexyl group, a 2-ethylhexyl group, a 2-methylhexyl group, a cyclopentyl group, a cyclohexyl group, a 1-adamantyl group or a 2-norbornyl group.

Specific examples of the alkenyl group include a straight-chain, branched or cyclic alkenyl group having from 1 to 30 carbon atoms, for example, a vinyl group, a 1-propenyl group, a 1-butenyl group, a 1-methyl-1-propenyl group, a 1-cyclopentenyl group or a 1-cyclohexenyl group.

Specific examples of the alkynyl group include a straight-chain, branched or cyclic alkynyl group having from 1 to 30 carbon atoms, for example, an ethynyl group, a 1-propynyl group, a 1-butynyl group or 1-octynyl group.

The aryl group includes a condensed ring of one to four benzene rings and a condensed ring of a benzene ring and a 5-membered unsaturated ring. Specific examples of the aryl group include an aryl group having from 1 to 30 carbon atoms, for example, a phenyl group, a naphthyl group, an anthryl group, a phenanthryl group, an indenyl group, an acenaphthenyl group, a fluorenyl group or a pyrenyl group. Also, a heteroaryl group containing one or more hetero atoms selected from the group consisting of a nitrogen atom, an oxygen atom and a sulfur atom is exemplified. Specific examples of the heteroaryl group include a heteroaryl group derived from a heteroaryl ring, for example, pyrrole, furan, thiophene, pyrazole, imidazole, triazole, oxazole, isooxazole, oxadiazole, thiazole, thiadiazole, indole, carbazole, benzofuran, dibenzofuran, thianaphthene, dibenzothiophene, indazole, benzimidazole, anthranil, benzisooxazole, benzoxazole, benzothiazole, purine, pyridine, pyridazine, pyrimidine, pyradine, triazine, quinoline, acridine, isoquinoline, phthalazine, quinazoline, quinoxazine, naphthylidine, phenanthroline or pteridine.

The hydrocarbon group having from 1 to 30 carbon atoms may be substituted with one or more appropriate substituents. Examples of the substituent include a monovalent non-metallic atomic group exclusive of a hydrogen atom, for example, a halogen atom (e.g., —F, —Br, —Cl or —I), a hydroxy group, an alkoxy group, an aryloxy group, a mercapto group, an alkylthio group, an arylthio group, an alkyldithio group, an aryldithio group, an amino group, an N-alkylamino group, an N,N-dialkylamino group, an N-arylamino group, an N,N-diarylamino group, an N-alkyl-N-arylamino group, an acyloxy group, a carbamoyloxy group, an N-alkylcarbamoyloxy group, an N-arylcarbamoyloxy group, an N,N-dialkylcarbamoyloxy group, an N,N-diarylcarbamoyloxy group, an N-alkyl-N-arylcarbamoyloxy group, an alkylsulfoxy group, an arylsulfoxy group, an acylthio group, an acylamino group, an N-alkylacylamino group, an N-arylacylamino group, a ureido group, an N'-alkylureido group, an N',N'-dialkylureido group, N'-arylureido group, an N',N'-diarylureido group, an N'-alkyl-N'-arylureido group, an N-alkylureido group, N-arylureido group, an N'-alkyl-N-alkylureido group, an N'-alkyl-N-arylureido group, an N',N'-dialkyl-N-alkylureido group, an N',N'-dialkyl-N-arylureido group, an N'-aryl-N-alkylureido group, an N'-aryl-N-arylureido group, an N',N'-diaryl-N-alkylureido group, an N',N'-diaryl-N-arylureido group, an N'-alkyl-N'-aryl-N-alkylureido group, an N'-alkyl-N'-aryl-N-arylureido group, an alkoxycarbonylamino group, an aryloxycarbonylamino group, an N-alkyl-N-alkoxycarbonylamino group, an N-alkyl-N-aryloxycarbonylamino group, an N-aryl-N-alkoxycarbonylamino group, an N-aryl-N-aryloxycarbonylamino group, a formyl group, an acyl group, a conjugate base group of a carboxyl group, an alkoxycarbonyl group, an aryloxycarbonyl group, a carbamoyl group, an N-alkylcarbamoyl group, an N,N-dialkylcarbamoyl group, an N-arylcarbamoyl group, an N,N-diarylcarbamoyl group, an N-alkyl-N-arylcarbamoyl group, an alkylsulfinyl group, an arylsulfinyl group, an alkylsulfonyl group, an arylsulfonyl group, a sulfo group (—$SO_3H$) and a conjugate base group thereof, an alkoxysulfonyl group, an aryloxysulfonyl group, a sulfinamoyl group, an N-alkylsulfinamoyl group, an N,N-dialkylsulfinamoyl group, an N-arylsulfinamoyl group, an N,N-diarylsulfinamoyl group, an N-alkyl-N-arylsulfinamoyl group, a sulfamoyl group, an N-alkylsulfamoyl group, an N,N-dialkylsulfamoyl group, an N-arylsulfamoyl group, an N,N-diarylsulfamoyl group, an N-alkyl-N-arylsulfamoyl group, an N-acylsulfamoyl group and a conjugate base group thereof, an N-alkylsulfonylsulfamoyl group (—$SO_2NHSO_2$(alkyl)) and a conjugate base group thereof, an N-arylsulfonylsulfamoyl group (—$SO_2NHSO_2$(aryl)) and a conjugate base group thereof, an N-alkylsulfonylcarbamoyl group (—$CONHSO_2$(alkyl)) and a conjugate base group thereof, an N-arylsulfonylcarbamoyl group (—$CONHSO_2$(alrl)) and a conjugate base group thereof, an alkoxysilyl group (—Si(O-alkyl)$_3$), an aryloxysilyl group (—Si(O-aryl)$_3$), a hydroxysilyl group (—Si(OH)$_3$) and a conjugate base group thereof, a conjugate base group of a phosphono group (—$PO_3H_2$), a dialkylphosphono group (—$PO_3$(alkyl)$_2$), a diarylphosphono group (—$PO_3$(aryl)$_2$), an alkylarylphosphono group (—$PO_3$(alkyl)(aryl)), a monoalkylphosphono group (—$PO_3H$(alkyl)) and a conjugate base group thereof, a monoarylphosphono group (—$PO_3H$(aryl)) and a conjugate base group thereof, a conjugate base group of a phosphonoxy group (—$OPO_3H_2$), a dialkylphosphonoxy group (—$OPO_3$(alkyl)$_2$), a diarylphosphonoxy group (—$OPO_3$(aryl)$_2$), an alkylarylphosphonoxy group (—$OPO_3$(alkyl)(aryl)), a monoalkylphosphonoxy group (—$OPO_3H$(alkyl)) and a conjugate base group thereof, a monoarylphosphonoxy group (—$OPO_3H$(aryl)) and a conjugate base group thereof, a cyano group, a nitro group, an aryl group, an alkyl group, an alkenyl group or an alkynyl group.

The functional groups adsorbing to the pigment may be used individually or in combination of two or more thereof The amount of the functional group adsorbing to the pigment present in the pigment dispersant is preferably 0.05 mmol or more, more preferably 0.1 mmol or more, per g of the pigment dispersant.

As the functional group imparting dispersibility in an organic solvent in the unit (b), any functional group capable of imparting dispersibility in an organic solvent to the pigment exclusive of a —COOH group, a —$PO_3H_2$ group and a —$OPO_3H_2$ group can be preferably used. Specific examples of the functional group imparting dispersibility in an organic solvent in the unit (b) include an alkyl group which may have a substituent, an aryl group which may have a substituent, an alkenyl group which may have a substituent, an alkynyl group which may have a substituent, —OR, —NRR', —SR, —COR, —COOR, —CONRR', —OCOR, —OCONRR', —OCOOR, —NRCOR', —NRCOOR', —NRCONR'R", —N=R, —$SO_2R$, —$SO_3R$, —$SO_2NRR'$, a hydrogen atom, a halogen atom, a cyano group, a nitro group, a hydroxy group or a mercapto group (wherein R, R' or R" each represents an alkyl group, an aryl group, an alkenyl group, an alkynyl group or a hydrogen atom or may be connected with each other to form a ring). Specific examples of the alkyl group, aryl group, alkenyl group and alkynyl group are same as those described above. As the functional group imparting dispersibility in an organic solvent, a functional group including a hydrocarbon (alkyl, aryl, alkenyl or alkynyl) group having 6 or more carbon atoms is preferable and a functional group including a hydrocarbon group having 9 or more carbon atoms is more preferable. The functional groups imparting dispersibility in an organic solvent may be used individually or in combination of two or more thereof.

The pigment dispersants having the following features are particularly preferable.

(1) For a basic dye, a pigment dispersant of a copolymer mandatorily containing as the unit (a) having a functional group adsorbing to the pigment, a structural unit derived from a polymerizable unsaturated monomer having a sulfonic acid group or a salt thereof and as the unit (b) having a functional group imparting dispersibility in an organic solvent, a structural unit derived from a nonionic polymerizable unsaturated monomer having a polyoxyalkylene chain.

The polyoxyalkylene chain is not particularly restricted and a polyethylene chain or a polypropylene chain is preferably used. The number of the polyoxyalkylene unit in the polyoxyalkylene chain is preferably from 5 to 50, more preferably from 10 to 40, and most preferably from 20 to 35.

(2) For an acidic dye, a pigment dispersant of a copolymer mandatorily containing as the unit (a) having a functional group adsorbing to the pigment, a structural unit derived from a polymerizable unsaturated monomer having an amino group and as the unit (b) having a functional group imparting dispersibility in an organic solvent, a structural unit derived from a nonionic polymerizable unsaturated monomer having a polyoxyalkylene chain.

The polyoxyalkylene chain is not particularly restricted and a polyethylene chain or a polypropylene chain is preferably used. The number of the polyoxyalkylene unit in the polyoxyalkylene chain is preferably from 5 to 50, more preferably from 10 to 40, and most preferably from 20 to 35.

(3) For a basic dye, a pigment dispersant of a graft copolymer mandatorily containing as the unit (a) having a functional group adsorbing to the pigment, a structural unit derived from a polymerizable unsaturated monomer having a sulfonic acid group or a salt thereof and as the unit (b) having a functional group imparting dispersibility in an organic solvent, a graft chain.

The graft chain in the graft copolymer can be prepared by copolymerization of a macromonomer having a polymerizable group at one terminal of a polymer molecule mainly containing a hydrophobic monomer unit with a polymerizable unsaturated monomer constituting the unit (a). The hydrophobic monomer is not particularly restricted and, for example, an alkyl ester of (meth)acrylic acid or a cycloalkyl ester of (meth)acrylic acid is particularly preferably used. The number of the repeating unit derived from the hydrophobic monomer is not particularly restricted and is preferably from 20 to 80, more preferably from 30 to 70, and most preferably from 40 to 65.

It is preferred that the copolymer described above contains the structural unit (a) and structural unit (b) of 80% by weight or more in total based on the whole structural unit and the ratio of structural unit (a)/structural unit (b) is from 1/99 to 70/30 (by weight).

Specific examples of the pigment dispersant for use in the invention are set forth below, but the invention should not be construed as being limited thereto. In the specific examples set forth below, x and y each indicates an appropriate molar ratio.

DB-1
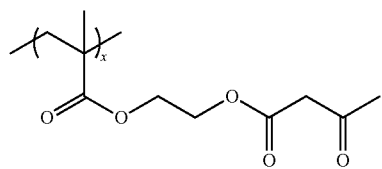 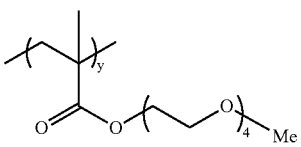
DB-2
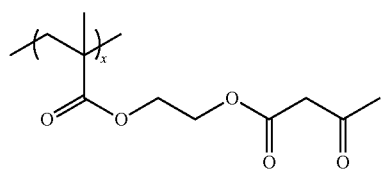 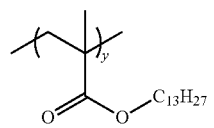
DB-3
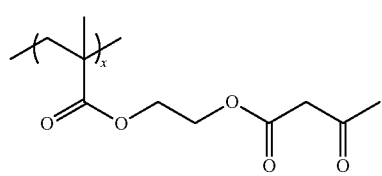 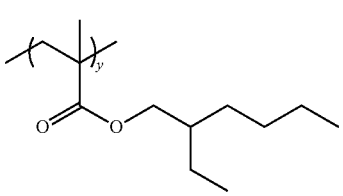
DB-4
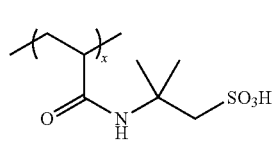 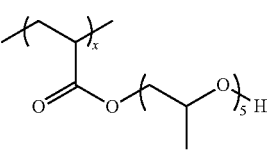
DB-5
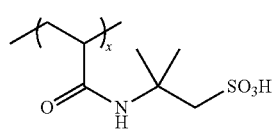 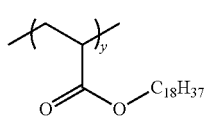
DB-6
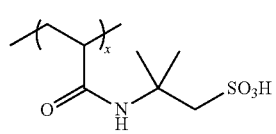 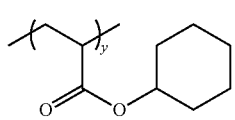
DB-7
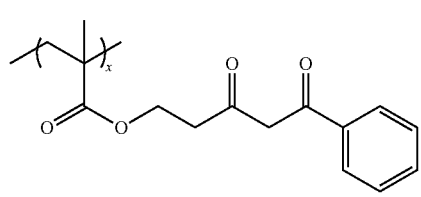 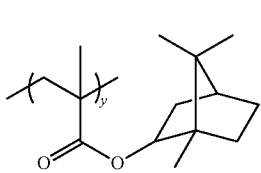
DB-8
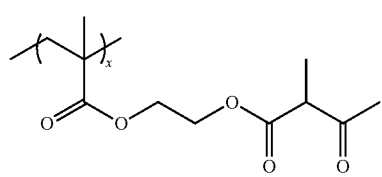 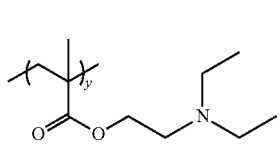
DB-9
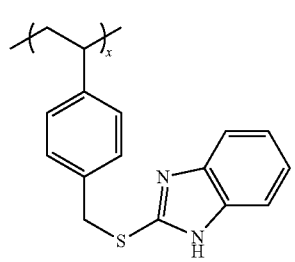 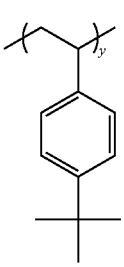
DB-10
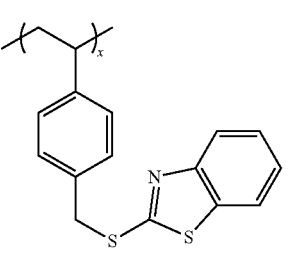 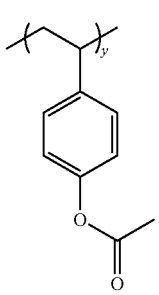

-continued
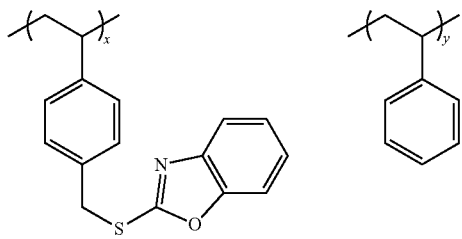
DB-11
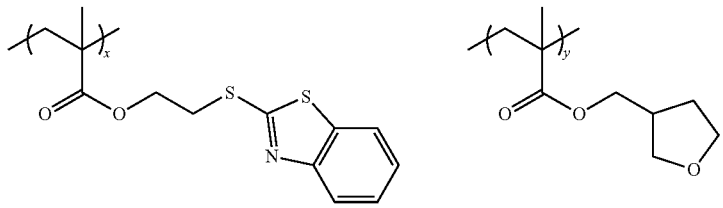
DB-12
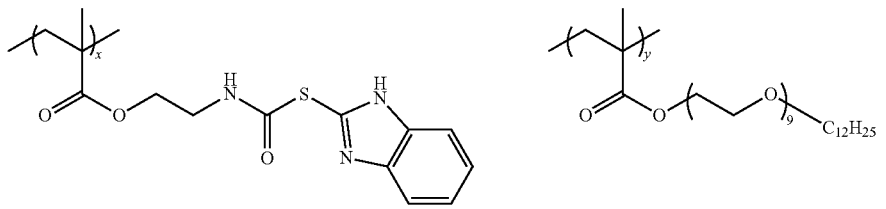
DB-13
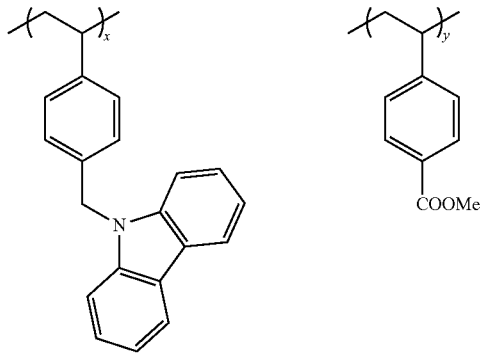
DB-14
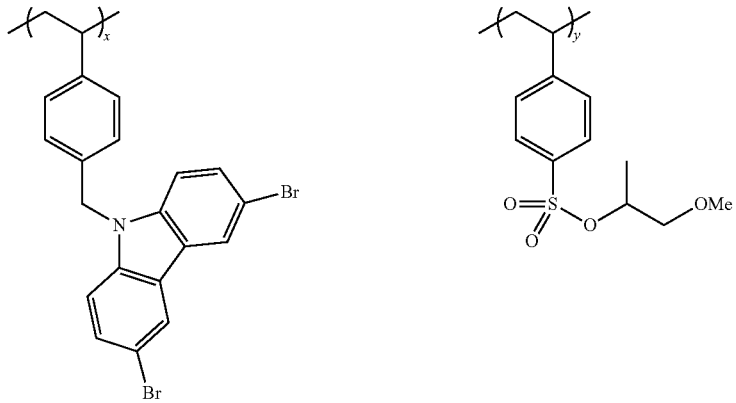
DB-15

-continued
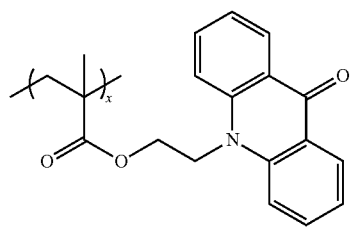 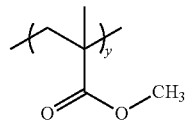
DB-16
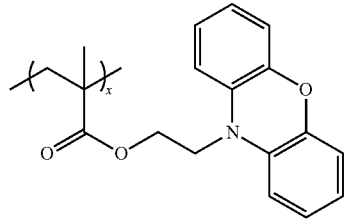 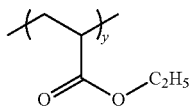
DB-17
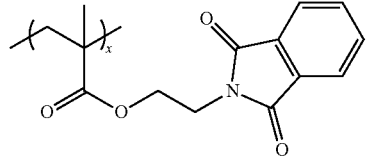 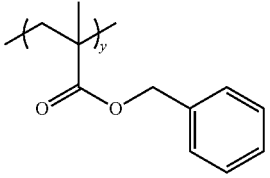
DB-18
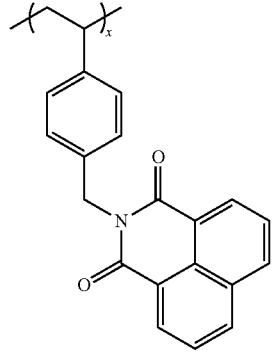 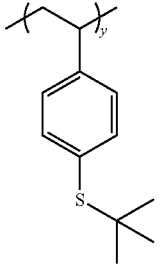
DB-19
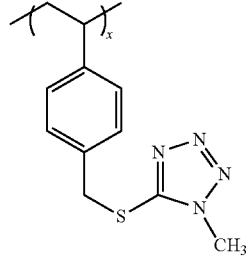 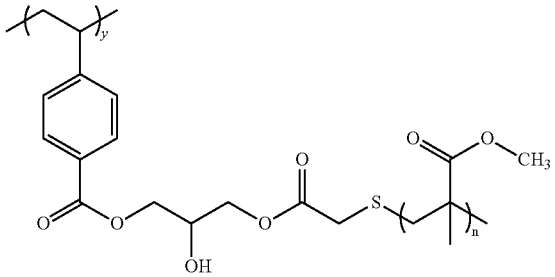
DB-20
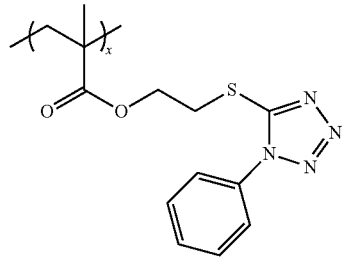 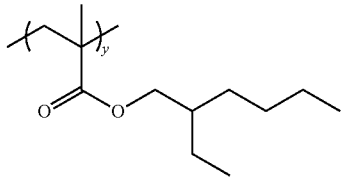
DB-21

-continued
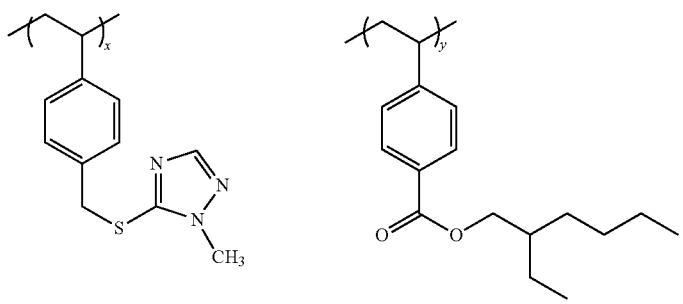
DB-22
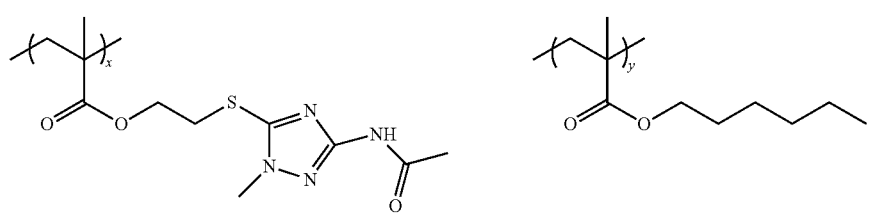
DB-22
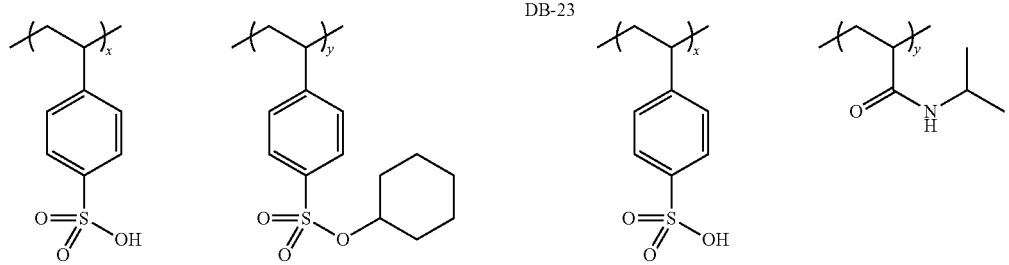
DB-23
DB-24
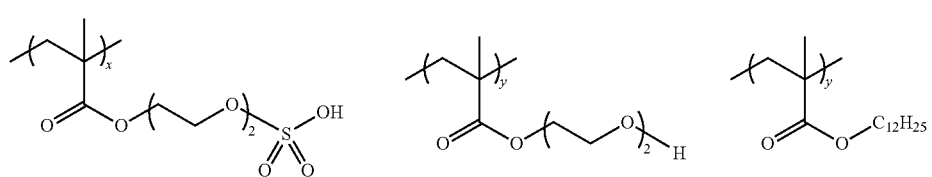
DB-25
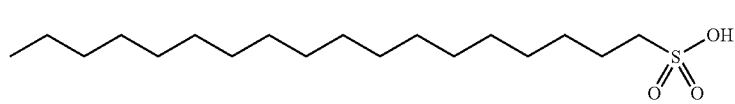
DB-26
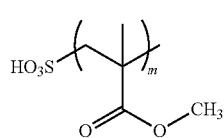
DB-27
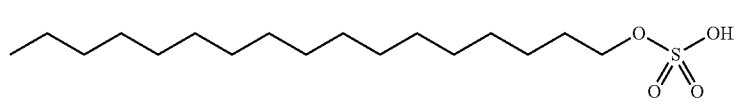
DB-28
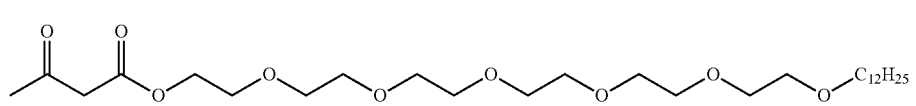
DB-29

-continued
DB-30
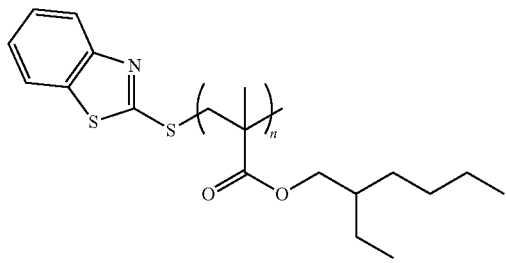
DB-31
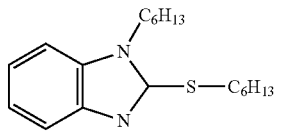
DB-32
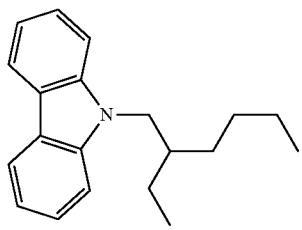
DB-33
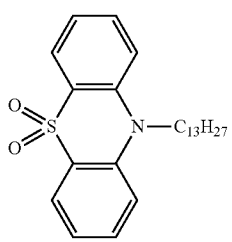
DB-34
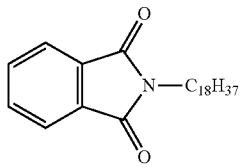
DB-35
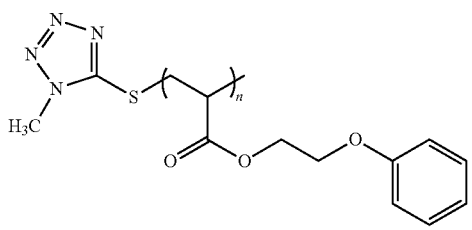
DB-36
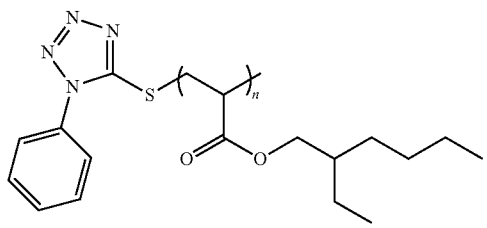
DB-37
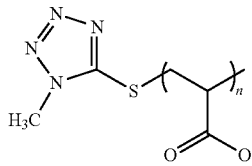
DB-38
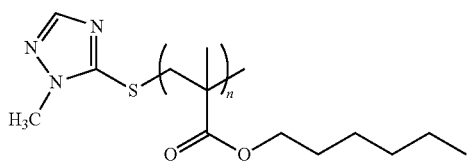
DB-39
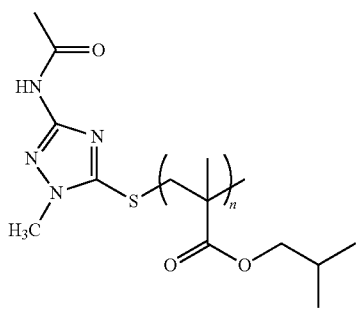

DB-40

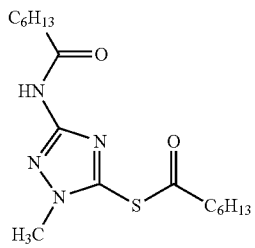

DB-41

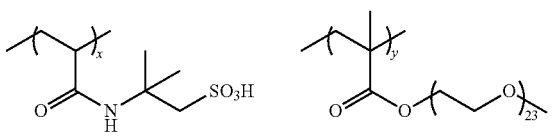

DB-42

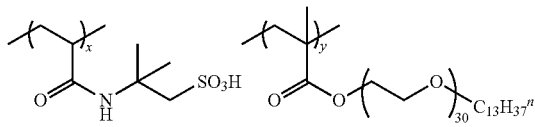

DB-43

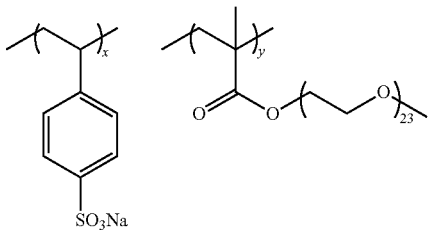

DB-44

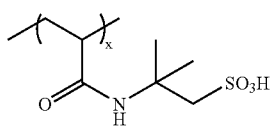

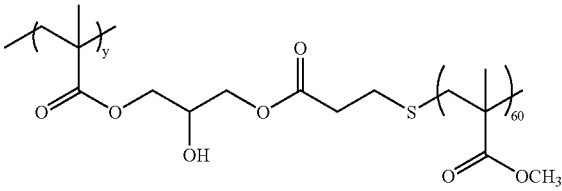

DB-45

The weight average molecular weight of the pigment dispersant for use in the invention is preferably from 1,000 to 1,000,000, more preferably from 2,000 to 500,000, and still more preferably from 5,000 to 200,000.

The amount of the pigment dispersant added is preferably from 10 to 200% by weight, and more preferably from 30 to 100% by weight, based on the weight of the pigment.

As the pigment for use in the invention (hereinafter, also referred to as pigment of the invention), conventionally known pigments including those commercially available can be preferably used. For instance, those described, for example, in *Ganryo Binran* (*Kaitei-Sinpan*) (Handbook of Pigments (Newly revised edition)) compiled by Pigment Technology Society of Japan, Seibundo Shinkosha Inc. or Colour Index. Examples of the pigment include black pigments, yellow pigments, red pigments, brown pigments, purple pigments, blue pigments, green pigments, fluorescent pigments and metal powder pigments. Specific examples of the pigment include inorganic pigments (for example, titanium dioxide, carbon black, graphite, zinc oxide, Prussian blue, cadmium sulfide, iron oxide or lead, zinc, barium or calcium salt of chromic acid) and organic pigments (for example, azo pigments, thioindigo pigments, anthraquinone pigments, anthanthrone pigments, triphendioxazine pigments, vat dye pigments, phthalocyanine pigments and derivatives thereof or quinacridone pigments). Among the pigments, a pigment which does not substantially have absorption in an absorption wavelength range of a spectral sensitizing dye corresponding to the laser for image exposure is preferably used. Specifically, a pigment having 0.05 or less of reflection absorption measured using an integrating sphere at the emission wavelength of laser is preferable.

Also, in the case of using an argon laser, SEG-YAG laser or violet laser, which now becomes the mainstream in the field of photosensitive lithographic printing plate of photopolymerization type, a violet pigment or a blue pigment is preferably employed in view of the absorption of pigment in the photosensitive wavelength range and visibility of image after development. Examples of such a dye include Cobalt Blue, Cerulean Blue, Alkali Blue Lake, Phonatone Blue 6G, Victoria Blue Lake, non-metal Phthalocyanine Blue, Phthalocyanine Blue, Fast Sky Blue, Indanthrene Blue, Indigo, Dioxane Violet, Isobioranthrone Violet, Indanthrone Blue and Indanthrone BC. Among them, Phthalocyanine Blue and Dioxane Violet are more preferable.

The pigment of the invention may be used after undergoing surface treatment or may be used without undergoing surface treatment. For the surface treatment, treatments, for example, with a resin, wax, surfactant or coupling agent as described in JP-A-3-69949 are illustrated.

An average particle size of the pigment of the invention in the photosensitive layer is preferably from 0.05 to 1.5 µm more preferably from 0.1 to 1.0 µm. In the above-described range, the improvement in printing durability of the photosensitive layer is achieved and the occurrence of background stain on the support due to the pigment is avoided. However, the average particle size of the pigment of less than 0.05 µm is not preferable, because not only the pigment does not contribute to the improvement in printing durability but also it causes clogging on the surface of support subjected to hydrophilic treatment, likely resulting in the occurrence of background stain. The average particle size of the pigment of more than 1.5 µm is also not preferable, because it may be larger than the dry thickness of the photosensitive layer in some cases so that the advantages of the invention can not be effectively achieved.

For the purpose of measuring the average particle size of the pigment of the invention, known methods, for example, a method of using measurement by a transmission electron microscope or a method of measuring a pigment dispersion having an appropriate concentration by a commercially available ultracentrifugal automatic particle size distribution measurement device or light scattering particle size distribution measurement device, can be exemplified. According to the invention, a primary average particle size of the pigment means an average particle size of the pigment measured according to the above-described method. In the measurement by a transmission electron microscope, 0.1 mg of a pigment dispersion prepared by dispersing the pigment in a single solvent is dropped on a 200 mesh with a carbon support film subjected to hydrophilization treatment, followed by coating and drying by a spin coater to prepare a sample and by the measurement using the sample the average particle size of the pigment can be definitely determined. On the other hand, the average particle size of the pigment in the layer can be obtained, for example, by coating and drying at 95° C. a photosensitive solution having a solid content of 10% so as to form a layer of 3 g/m² on a PET film to preparing a sample, coating and drying an ambient temperature curable epoxy resin on the surface of sample to cure, preparing an ultrathin section (section thickness: 150 nm) by a microtome, putting on a 200 mesh with a carbon support film subjected to hydrophilization treatment, measuring particle diameters of 100 pigment aggregates by a transmission electron microscope and calculating the average value thereof.

As for the pigment of the invention, it is preferred that a ratio of the primary average particle size of the pigment to the average particle size of the pigment in the layer is from 1:1 to 1:15. The ratio described above means that it is preferable for the average particle size of the pigment in the layer to unboundedly close to the primary average particle size of the pigment and indicates that the pigment is apt to be dispersed finely, uniformly and stably in the layer. When the ratio exceeds 1:15, the pigment becomes enlarged and is not preferable.

As a method for control the average particle size of the pigment of the invention in the photosensitive layer to the range of 0.05 to 1.5 µm, to disperse the pigment in an organic solvent which is miscible with a solution prepared by dissolving the photopolymerizable composition in a solvent is exemplified. In particular, it is preferred that the dispersion of pigment is conducted with a single solvent and the solvent is used as the main solvent for the solution prepared by dissolving the photopolymerizable composition for forming the photosensitive layer in a solvent. The solvent for use at the dispersion of the pigment is essentially an organic solvent. As for the solvent, it is preferable to use organic solvents miscible with each other and it is more preferable to use a single solvent as described above. Examples of the organic solvent preferably used include known solvents, for example, an alcohol solvent, for example, methanol, ethanol, propanol, isopropanol or 1-methoxy-2-propanol, a ketone solvent, for example, acetone, methyl ethyl ketone or cyclohexanone, an ester solvent, for example, ethyl acetate, butyl acetate or γ-butyrolactone, an ether solvent, for example, tetrahydrofuran, 1,3-dioxorane or diisopropyl ether, a hydrocarbon solvent, for example, toluene, hexane or xylene, an amide solvent, for example, dimethylformamide, dimethylacetamide or N-methylpyrrolidone, a halogenated solvent, for example, chloroform or carbon tetrachloride, dimethylsulfoxide or water. An organic ketone solvent having a solubility parameter value (SP value) of 9 to 10.5 is preferable and, for example, cyclohexanone (SP value: 9.9), methyl ethyl ketone (MEK) (SP value: 9.3), cyclopentanone (SP value: 10.4) and methylcyclohexanone (SP value: 9.3) are illustrated. Among them, methyl ethyl ketone and cyclohexanone are most preferable.

The use of the above-described organic solvent as the solvent at the dispersion of the pigment is greatly influenced dispersion stability when the pigment dispersion is added to the photopolymerizable composition. The use of the above-described organic solvent as the main solvent for the solution prepared by dissolving the photopolymerizable composition in a solvent is also greatly influenced the dispersion stability.

The pigment of the invention dispersed in the above-described organic solvent in the manner described above can be controlled the average particle size thereof to the range of 0.05 to 1.5 µm in the photosensitive layer and a dispersion of the pigment particle dispersed extremely finely, uniformly and stably can be prepared.

In the dispersion, it is ordinary to add the pigment and pigment dispersant to the above-described solvent so as to have concentration of 10 to 30% by weight and to disperse, for example, by a paint shaker. However, other known dispersing methods can be suitably employed.

The content of the pigment dispersed with the pigment dispersant in the photosensitive layer is not particularly restricted and it is preferably from 0.01 to 20% by weight, more preferably from 0.05 to 15% by weight, and still more preferably from 0.1 to 10% by weight.

Radical Polymerizable Compound

The polymerizable compound for use in the photosensitive layer according to the invention is an addition-polymerizable compound having at least one ethylenically unsaturated double bond, and it is selected from compounds having at least one, preferably two or more, terminal ethylenically unsaturated double bonds. Such compounds are widely known in the art and they can be used in the invention without any particular limitation. The compound has a chemical form, for example, a monomer, a prepolymer, specifically, a dimer, a trimer or an oligomer, or a copolymer thereof, or a mixture thereof Examples of the monomer and copolymer thereof include unsaturated carboxylic acids (for example, acrylic acid, methacrylic acid, itaconic acid, crotonic acid, isocrotonic acid or maleic acid) and esters or amides thereof. Preferably, esters of an unsaturated carboxylic acid with an aliphatic polyhydric alcohol compound and amides of an unsaturated carboxylic acid with an aliphatic polyvalent amine compound are used. An addition reaction product of an unsaturated carboxylic acid ester or amide having a nucleophilic substituent, for example, a hydroxy group, an amino group or a mercapto group, with a monofunctional or polyfunctional isocyanate or epoxy compound, or a dehydration condensation reaction product of the unsaturated carboxylic acid ester or amide with a monofunctional or polyfunctional carboxylic acid is also preferably used. Moreover, an addition reaction product of an unsaturated carboxylic acid ester or amide having an electrophilic substituent, for example, an isocyanate group or an epoxy group with a monofunctional or polyfunctional alcohol, amine or thiol, or a substitution reaction product of an unsaturated carboxylic acid ester or amide having a releasable substituent, for example, a halogen atom or a tosyloxy group with a monofunctional or polyfunctional alcohol, amine or thiol is also preferably used. In addition, compounds in which the unsaturated carboxylic acid described above is replaced by an unsaturated phosphonic acid, styrene, vinyl ether or the like can also be used.

Specific examples of the monomer, which is an ester of an aliphatic polyhydric alcohol compound with an unsaturated carboxylic acid, include acrylic acid esters, for example, ethylene glycol diacrylate, triethylene glycol diacrylate, 1,3-butanediol diacrylate, tetramethylene glycol diacrylate, propylene glycol diacrylate, neopentyl glycol diacrylate, trimethylolpropane triacrylate, trimethylolpropane tri(acryloyloxypropyl) ether, trimethylolethane triacrylate, hexanediol diacrylate, 1,4-cyclohexanediol diacrylate, tetraethylene glycol diacrylate, pentaerythritol diacrylate, pentaerythritol triacrylate, pentaerythritol tetraacrylate, dipentaerythritol diacrylate, dipentaerythritol hexaacrylate, sorbitol triacrylate, sorbitol tetraacrylate, sorbitol pentaacrylate, sorbitol hexaacrylate, tri(acryloyloxyethyl) isocyanurate, isocyanuric acid ethylene oxide (EO) modified triacrylate or polyester acrylate oligomer;

methacrylic acid esters, for example, tetramethylene glycol dimethacrylate, triethylene glycol dimethacrylate, neopentyl glycol dimethacrylate, trimethylolpropane trimethacrylate, trimethylolethane trimethacrylate, ethylene glycol dimethacrylate, 1,3-butanediol dimethacrylate, hexanediol dimethacrylate, pentaerythritol dimethacrylate, pentaerythritol trimethacrylate, pentaerythritol tetramethacrylate, dipentaerythritol dimethacrylate, dipentaerythritol hexamethacrylate, sorbitol trimethacrylate, sorbitol tetramethacrylate, bis[p-(3-methacryloxy-2-hydroxypropoxy)phenyl]dimethylmethane or bis[p-(methacryloxyethoxy)phenyl]dimethylmethane;

itaconic acid esters, for example, ethylene glycol diitaconate, propylene glycol diitaconate, 1,3-butanediol diitaconate, 1,4-butanediol diitaconate, tetramethylene glycol diitaconate, pentaerythritol diitaconate or sorbitol tetraitaconate;

crotonic acid esters, for example, ethylene glycol dicrotonate, tetramethylene glycol dicrotonate, pentaerythritol dicrotonate or sorbitol tetracrotonate;

isocrotonic acid esters, for example, ethylene glycol diisocrotonate, pentaerythritol diisocrotonate or sorbitol tetraisocrotonate;

and maleic acid esters, for example, ethylene glycol dimaleate, triethylene glycol dimaleate, pentaerythritol dimaleate and sorbitol tetramaleate.

Other examples of the ester, which can be preferably used, include aliphatic alcohol esters described in JP-B-51-47334 and JP-A-57-196231, esters having an aromatic skeleton described in JP-A-59-5240, JP-A-59-5241 and JP-A-2-226149, and esters containing an amino group described in JP-A-1-165613.

The above-described ester monomers can also be used as a mixture.

Specific examples of the monomer, which is an amide of an aliphatic polyvalent amine compound with an unsaturated carboxylic acid, include methylene bisacrylamide, methylene bismethacrylamide, 1,6-hexamethylene bisacrylamide, 1,6-hexamethylene bismethacrylamide, diethylenetriamine trisacrylamide, xylylene bisacrylamide and xylylene bismethacrylamide. Other preferred examples of the amide monomer include amides having a cyclohexylene structure described in JP-B-54-21726.

Urethane type addition-polymerizable compounds produced using an addition reaction between an isocyanate and a hydroxy group are also preferably used, and specific examples thereof include vinylurethane compounds having two or more polymerizable vinyl groups per molecule obtained by adding a vinyl monomer containing a hydroxy group represented by formula (A) shown below to a polyisocyanate compound having two or more isocyanate groups per molecule, described in JP-B-48-41708.

$$CH_2\!=\!C(R_4)COOCH_2CH(R_5)OH \qquad (A)$$

wherein $R_4$ and $R_5$ each independently represents H or $CH_3$.

Also, urethane acrylates described in JP-A-51-37193, JP-B-2-32293 and JP-B-2-16765, and urethane compounds having an ethylene oxide skeleton described in JP-B-58-49860, JP-B-56-17654, JP-B-62-39417 and JP-B-62-39418 are preferably used. Further, a photosensitive composition having remarkably excellent photo-speed can be obtained by using an addition polymerizable compound having an amino structure or a sulfide structure in its molecule, described in JP-A-63-277653, JP-A-63-260909 and JP-A-1-105238.

Other examples include polyfunctional acrylates and methacrylates, for example, polyester acrylates and epoxy acrylates obtained by reacting an epoxy resin with (meth)acrylic acid, described in JP-A-48-64183, JP-B-49-43191 and JP-B-52-30490. Specific unsaturated compounds described in JP-B-4643946, JP-B-140337 and JP-B-1-40336, and vinylphosphonic acid type compounds described in JP-A-2-25493 can also be exemplified. In some cases, structure containing a perfluoroalkyl group described in JP-A-61-22048 can be preferably used. Moreover, photocurable monomers or oligomers described in *Nippon Secchaku Kyokaishi* (*Journal of Japan Adhesion Society*), Vol. 20, No. 7, pages 300 to 308 (1984) can also be used.

Details of the method of using the polymerizable compound, for example, selection of the structure, individual or combination use or an amount added, can be appropriately determined in accordance with the characteristic design of the final lithographic printing plate precursor. For instance, the compound is selected from the following standpoints.

In view of the sensitivity, a structure having a large content of unsaturated group per molecule is preferred and in many cases, a difunctional or more functional compound is preferred. Also, in order to increase the strength of the image area, that is, hardened layer, a trifunctional or more functional compound is preferred. A combination use of compounds different in the functional number or in the kind of polymerizable group (for example, an acrylic acid ester, a methacrylic acid ester, a styrene compound or a vinyl ether compound) is an effective method for controlling both the sensitivity and the strength.

The selection and use method of the polymerizable compound are also important factors for the compatibility and dispersibility with other components (for example, a binder polymer, a polymerization initiator or a coloring agent) in the photosensitive layer. For instance, the compatibility may be improved in some cases by using the compound of low purity or using two or more kinds of the compounds in combination. A specific structure may be selected for the purpose of improving an adhesion property to a support, a protective layer or the like described hereinafter.

The polymerizable compound is used preferably in a range from 5 to 80% by weight, more preferably in a range from 25 to 75% by weight, based on the total solid content of the photosensitive layer. The polymerizable compounds may be used individually or in combination of two or more thereof In the method of using the polymerizable compound, the structure, blend and amount added can be appropriately selected by taking account of the degree of polymerization inhibition due to oxygen, resolution, fogging property, change in refractive index, surface tackiness and the like. Further, depending on the case, a layer construction, for example, an undercoat layer or an overcoat layer, and a coating method, may also be considered.

Sensitizing Dye

According to the invention, a sensitizing dye having absorption in a wavelength range of 360 to 450 nm can be used. The photosensitive layer of polymerizable negative type according to such an embodiment of the invention can be sensitive to a blue laser useful for CTP because it responds to light of 360 to 450 nm. Such a sensitizing dye having absorption in a wavelength range of 360 to 450 nm forms the electron excited state in high sensitivity upon irradiation (exposure) of the blue laser, and electron transfer, energy transfer or the like relating to the electron excited state acts on a polymerization initiator coexisting in the photosensitive layer to cause chemical change in the polymerization initiator, thereby generating a radical. Then, by the radical thus-generated, a polymerizable compound causes a polymerization reaction so that the exposed area is cured to from an image area.

The lithographic printing plate precursor according to the invention is particularly preferable for plate-making including direct drawing with a blue laser having a wavelength of 360 to 450 nm, since the photosensitive layer thereof contains the sensitizing dye absorbing light of 360 to 450 nm, and it exhibits a high image-forming property in comparison with conventional lithographic printing plate precursors.

It is preferable that the sensitizing dye for use in the invention has an absorption maximum in a wavelength range of 360 to 450 nm. Examples of the sensitizing dye include merocyanine dyes represented by formula (I) shown below, benzopyranes or coumarins represented by formula (II) shown below, aromatic ketones represented by formula (III) shown below, and anthracenes represented by formula (IV) shown below.

(I)

In formula (I), A represents a sulfur atom or $NR_6$, $R_6$ represents a monovalent non-metallic atomic group, Y represents a non-metallic atomic group necessary for forming a basic nucleus of the dye together with adjacent A and the adjacent carbon atom, and $X_1$ and $X_2$ each independently represents a monovalent non-metallic atomic group or $X_1$ and $X_2$ may be combined with each other to form an acidic nucleus of the dye.

(II)

(I')

In formula (II), =Z represents a carbonyl group, a thiocarbonyl group, an imino group or an alkylydene group represented by the partial structural formula (I') described above, $X_1$ and $X_2$ have the same meanings as defined in formula (II) respectively, and $R_7$ to $R_{12}$ each independently represents a monovalent non-metallic atomic group.

(III)

In formula (III), $Ar_3$ represents an aromatic group which may have a substituent or a heteroaromatic group which may have a substituent, and $R_{13}$ represents a monovalent non-metallic atomic group. $R_{13}$ preferably represents an aromatic group or a heteroaromatic group. $Ar_3$ and $R_{13}$ may be combined with each other to form a ring.

(IV)

In formula (IV), $X_3$, $X_4$ and $R_{14}$ to $R_{21}$ each independently represents a monovalent non-metallic atomic group. Preferably, $X_3$ and $X_4$ each independently represents an electron-donating group having a negative Hammett substituent constant.

In formulae (I) to (IV), preferable examples of the monovalent non-metallic atomic group represented by any one of $X_1$ to $X_4$ and $R_6$ to $R_{21}$ include a hydrogen atom, an alkyl group (for example, a methyl group, an ethyl group, a propyl group, a butyl group, a pentyl group, a hexyl group, a heptyl group, an octyl group, a nonyl group, a decyl group, an undecyl group, a dodecyl group, a tridecyl group, a hexadecyl group, an octadecyl group, an eucosyl group, an isopropyl group, an isobutyl group, a sec-butyl group, a tert-butyl group, an isopentyl group, a neopentyl group, a 1-methylbutyl group, an isohexyl group, a 2-ethylhexyl group, a 2-methylhexyl group, a cyclohexyl group, a cyclopentyl group, a 2-norbornyl group, a chloromethyl group, a bromomethyl group, a 2-chloroethyl group, a trifluoromethyl group, a methoxymethyl group, a methoxyethoxyethyl group, an allyloxymethyl group, a phenoxymethyl group, a methylthiomethyl group, a tolylthiomethyl group, an ethylaminoethyl group, a diethylaminopropyl group, a morpholinopropyl group, an acetyloxymethyl group, a benzoyloxymethyl group, an N-cyclohexylcarbamoyloxyethyl group, an N-phenylcarbamoyloxyethyl group, an acetylaminoethyl group, an N-methylbenzoylaminopropyl group, a 2-oxoethyl group, a 2-oxopropyl group, a carboxypropyl group, a methoxycarbonylethyl group, an allyloxycarbonylbutyl group, a chlorophenoxycarbonylmethyl group, a carbamoylmethyl group, an N-methylcarbamoylethyl group, an N,N-dipropylcarbamoylmethyl group, an N-(methoxyphenyl)carbamoylethyl group, an N-methyl-N-(sulfophenyl)carbamoylmethyl group, a sulfobutyl group, a sulfonatobutyl group, a sulfamoylbutyl group, an N-ethylsulfamoylmethyl group, an N,N-dipropyl-sulfamoylpropyl group, an N-tolylsulfamoylpropyl group, an N-methyl-N-(phosphonophenyl)sulfamoyloctyl group, a phosphonobutyl group, a phosphonatohexyl group, a diethylphosphonobutyl group, a diphenylphosphonopropyl group, a methylphosphonobutyl group, a methylphosphonatobutyl group, a tolylphosphonohexyl group, a tolylphosphonatohexyl group, a phosphonooxypropyl group, a phosphonatooxybutyl group, a benzyl group, a phenethyl group, an α-methylbenzyl group, a 1-methyl-1-phenylethyl group, a p-methylbenzyl group, a cinnamyl group, an allyl group, a 1-propenylmethyl group, a 2-butenyl group, a 2-methylallyl group, a 2-methylpropenylmethyl group, a 2-propynyl group, a 2-butynyl group or a 3-butynyl group), an aryl group (for example, a phenyl group, a biphenyl group, a naphthyl group, a tolyl group, a xylyl group, a mesityl group, a cumenyl group, a chlorophenyl group, a bromophenyl group, a chloromethylphenyl group, a hydroxyphenyl group, a methoxyphenyl group, an ethoxyphenyl group, a phenoxyphenyl group, an acetoxyphenyl group, a benzoyloxyphenyl group, a methylthiophenyl group, a phenylthiophenyl group, a methylaminophenyl group, a dimethylaminophenyl group, an acetylaminophenyl group, a carboxyphenyl group, a methoxycarbonylphenyl group, an ethoxycarbonylphenyl group, a phenoxycarbonylphenyl group, an N-phenylcarbamoylphenyl group, a nitrophenyl group, a cyanophenyl group, a sulfophenyl group, a sulfonatophenyl group, a phosphonophenyl group or a phosphonatophenyl group), a heteroaryl group (for example, a heteroaryl group derived from thiophene, thiathrene, furan, pyran, isobenzofuran, chromene, xanthene, phenoxazine, pyrrole, pyrazole, isothiazole, isoxazole, pyrazine, pyrimidine, pyridazine, indolizine, isoindolizine, indole, indazole, purine, quinolizine, isoquinoline, phthalazine, naphthylidine, quinazoline, cinnoline, pteridine, carbazole, carboline, phenanthrene, acridine, perimidine, phenanthroline, phthalazine, phenarsazine, phenoxazine, furazane or phenoxazine), an alkenyl group (for example, a vinyl group, a 1-propenyl group, a 1-butenyl group, a cinnamyl group or a 2-chloro-1-ethenyl group), an alkynyl group (for example, an ethynyl group, a 1-propynyl group, a 1-butynyl group or a trimethylsilylethynyl group), a halogen atom (for example, —F, —Br, —Cl or —I), a hydroxy group, an alkoxy group, an aryloxy group, a mercapto group, an alkylthio group, an arylthio group, an alkyldithio group, an aryldithio group, an amino group, an N-alkylamino group, an N,N-dialkylamino group, an N-arylamino group, an N,N-diarylamino group, an N-alkyl-N-arylamino group, an acyloxy group, a carbamoyloxy group, an N-alkylcarbamoyloxy group, an N-arylcarbamoyloxy group, an N,N-dialkylcarbamoyloxy group, an N,N-diarylcarbamoyloxy group, an N-alkyl-N-arylcarbamoyloxy group, an alkylsulfoxy group, an arylsulfoxy group, an acylthio group, an acylamino group, an N-alkylacylamino group, an N-arylacylamino group, a ureido group, an N'-alkylureido group, an N',N'-dialkylureido group, an N'-arylureido group, an N',N'-diarylureido group, an N'-alkyl-N'-arylureido group, an N-alkylureido group, an N-arylureido group, an N'-alkyl-N-alkylureido group, an N'-alkyl-N-arylureido group, an N',N'-dialkyl-N-alkylureido group, an N',N'-dialkyl-N-arylureido group, an N'-aryl-N-alkylureido group, an N'-aryl-N-arylureido group, an N',N'-diaryl-N-alkylureido group, an N',N'-diaryl-N-arylureido group, an N'-alkyl-N'-aryl-N-alkylureido group, an N'-alkyl-N'-aryl-N-arylureido group, an alkoxycarbonylamino group, an aryloxycarbonylamino group, an N-alkyl-N-alkoxycarbonylamino group, an N-alkyl-N-aryloxycarbonylamino group, an N-aryl-N-alkoxycarbonylamino group, an N-aryl-N-aryloxycarbonylamino group, a formyl group, an acyl group, a carboxyl group, an alkoxycarbonyl group, an aryloxycarbonyl group, a carbamoyl group, an N-alkylcarbamoyl group, an N,N-dialkylcarbamoyl group, an N-arylcarbamoyl group, an N,N-diarylcarbamoyl group, an N-alkyl-N-arylcarbamoyl group, an alkylsulfinyl group, an arylsulfinyl group, an alkylsulfonyl group, an arylsulfonyl group, a sulfo group (—SO$_3$H) and its conjugated base group (hereinafter referred to as a "sulfonato group"), an alkoxysulfonyl group, an aryloxysulfonyl group, a sulfinamoyl group, an N-alkylsulfinamoyl group, an N,N-dialkylsulfinamoyl group, an N-arylsulfinamoyl group, an N,N-diarylsulfinamoyl group, an N-alkyl-N-arylsulfinamoyl group, a sulfamoyl group, an N-alkylsulfamoyl group, an N,N-dialkylsulfamoyl group, an N-arylsulfamoyl group, an N,N-diarylsulfamoyl group, an N-alkyl-N-arylsulfamoyl group, a phosphono group (—PO$_3$H$_2$) and its conjugated base group (hereinafter referred to as a "phosphonato group"), a dialkylphosphono group (—PO$_3$(alkyl)$_2$), a diarylphosphono group (—PO$_3$(aryl)$_2$), an alkylarylphosphono group (—PO$_3$(alkyl)(aryl)), a monoalkylphosphono group (—PO$_3$H(alkyl)) and its conjugated base group (hereinafter referred to as an "alkylphosphonato group"), a monoarylphosphono group (—PO$_3$H(aryl)) and its conjugated base group (hereinafter referred to as an "arylphosphonato group"), a phosphonooxy group (—OPO$_3$H$_2$) and its conjugated base group (hereinafter referred to as a "phosphonatooxy group"), a dialkylphosphonooxy group (—OPO$_3$(alkyl)$_2$), a diarylphosphonooxy group (—OPO$_3$(aryl)$_2$), an alkylarylphosphonooxy group (—OPO$_3$(alkyl)(aryl)), a monoalkylphosphonooxy group (—OPO$_3$H(alkyl)) and its conjugated base group (hereinafter referred to as an "alkylphosphonatooxy group"), a monoarylphosphonooxy group (—OPO$_3$H(aryl)) and its conjugated base group (hereinafter referred to as an "arylphosphonatooxy group"), a cyano group and a nitro group. Among the above-described groups, a hydrogen atom, an alkyl group, an aryl group, a halogen atom, an alkoxy group and an acyl group are particularly preferred.

The basic nucleus of the dye formed by Y together with the adjacent A and the adjacent carbon atom in formula (I) includes, for example, a 5-membered, 6-membered or 7-membered, nitrogen-containing or sulfur-containing heterocyclic ring, and is preferably a 5-membered or 6-membered heterocyclic ring.

As the nitrogen-containing heterocyclic ring, those which are known to constitute basic nuclei in merocyanine dyes described in L. G. Brooker et al, *J. Am. Chem. Soc.*, Vol. 73, pp. 5326 to 5358 (1951) and references cited therein can be preferably used. Specific examples thereof include thiazoles (for example, thiazole, 4-methylthiazole, 4-phenylthiazole, 5-methylthiazole, 5-phenylthiazole, 4,5-dimethylthiazole, 4,5-diphenylthiazole, 4,5-di(p-methoxyphenyl)thiazole or 4-(2-thienyl)thiazole); benzothiazoles (for example, benzothiazole, 4-chlorobenzothiazole, 5-chlorobenzothiazole, 6-chlorobenzothiazole, 7-chlorobenzothiazole, 4-methylbenzothiazole, 5-methylbenzothiazole, 6-methylbenzothiazole, 5-bromobenzothiazole, 4-phenylbenzothiazole, 5-phenylbenzothiazole, 4-methoxybenzothiazole, 5-methoxybenzothiazole, 6-methoxybenzothiazole, 5-iodobenzothiazole, 6-iodobenzothiazole, 4-ethoxybenzothiazole, 5-ethoxybenzothiazole, tetrahydrobenzothiazole, 5,6-dimethoxybenzothiazole, 5,6-dioxymethylenebenzothiazole, 5-hydroxybenzothiazole, 6-hydroxybenzothiazole, 6-dimethylaminobenzothiazole or 5-ethoxycarbonylbenzothiazole); naphthothiazoles (for example, naphtho[1,2]thiazole, naphtho[2,1]thiazole, 5-methoxynaphtho[2,1]thiazole, 5-ethoxynaphtho[2,1]thiazole, 8-methoxynaphtho[1,2]thiazole or 7-methoxynaphtho[1,2]thiazole); thianaphtheno-7',6',4,5-thiazoles (for example, 4'-methoxythianaphtheno-7',6',4,5-thiazole); oxazoles (for example, 4-methyloxazole, 5-methyloxazole, 4-phenyloxazole, 4,5-diphenyloxazole, 4-ethyloxazole, 4,5-dimethyloxazole or 5-phenyloxazole); benzoxazoles (for example, benzoxazole, 5-chlorobenzoxazole, 5-methylbenzoxazole, 5-phenylbenzoxazole, 6-methylbenzoxazole, 5,6-dimethylbenzoxazole, 4,6-dimethylbenzoxazole, 6-methoxybenzoxazole, 5-methoxybenzoxazole, 4-ethoxybenzoxazole, 5-chlorobenzoxazole, 6-methoxybenzoxazole, 5-hydroxybenzoxazole or 6-hydroxybenzoxazole); naphthoxazoles (for example, naphth[1,2]oxazole or naphth[2,1]oxazole); selenazoles (for example, 4-methylselenazole or 4-phenylselenazole); benzoselenazoles (for example, benzoselenazole, 5-chlorobenzoselenazole, 5-methoxybenzoselenazole, 5-hydroxybenzoselenazole or tetrahydrobenzoselenazole); naphthoselenazoles (for example, naphtho[1,2]selenazole or naphtho[2,1]selenazole); thiazolines (for example, thiazoline or 4-methylthiazoline); 2-quinolines (for example, quinoline, 3-methylquinoline, 5-methylquinoline, 7-methylquinoline, 8-methylquinoline, 6-chloroquinoline, 8-chloroquinoline, 6-methoxyquinoline, 6-ethoxyquinoline, 6-hydroxyquinoline or 8-hydroxyquinoline); 4-quinolines (for example, quinoline, 6-methoxyquinoline, 7-methylquinoline or 8-methylquinoline); 1-isoquinolines (for example, isoquinoline or 3,4-dihydroisoquinoline); 3-isoquinolines (for example, isoquinoline); benzimidazoles (for example, 1,3-diethylbenzimidazole or 1-ethyl-3-phenylbenzimidazole); 3,3-dialkylindolenines (for example, 3,3-dimethylindolenine, 3,3,5-trimethylindolenine or 3,3,7-trimethylindolenine); and 2-pyridines (for example, pyridine or 5-methylpyridine); and 4-pyridines (for example, pyridine).

Examples of the sulfur-containing heterocyclic ring include dithiol partial structures in dyes described in JP-A-3-296759.

Specific examples thereof include benzodithiols (for example, benzodithiol, 5-tert-butylbenzodithiol or 5-methylbenzodithiol); naphthodithiols (for example, naphtho[1,2]dithiol or naphtho[2,1]dithiol); and dithiols (for example, 4,5-dimethyldithiol, 4-phenyldithiol, 4-methoxycarbonyldithiol, 4,5-dimethoxycarbonyldithiol, 4,5-ditrifluoromethyldithiol, 4,5-dicyanodithiol, 4-methoxycarbonylmethyldithiol or 4-carboxymethyldithiol).

In the description with respect to the heterocyclic ring above, for convenience and by convention, the names of heterocyclic mother skeletons are used. In the case of constituting the basic nucleus partial structure in the sensitizing dye, the heterocyclic ring is introduced in the form of a substituent of alkylydene type where a degree of unsaturation is decreased one step. For example, a benzothiazole skeleton is introduced as a 3-substituted-2(3H)-benzothiazolilydene group.

Of the compounds having an absorption maximum in a wavelength range of 360 to 450 nm as the sensitizing dyes, dyes represented by formula (V) shown below are more preferable in view of high sensitivity.

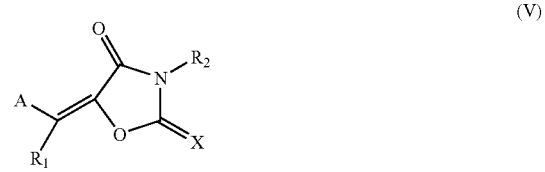

(V)

In formula (V), A represents an aromatic cyclic group which may have a substituent or a heterocyclic group which may have a substituent, X represents an oxygen atom, a sulfur atom or $=N(R_3)$, and $R_1$, $R_2$ and $R_3$ each independently represents a hydrogen atom or a monovalent non-metallic atomic group, or A and $R_1$ or $R_2$ and $R_3$ may be combined with each other to form an aliphatic or aromatic ring.

The formula (V) will be described in more detail below. $R_1$, $R_2$ and $R_3$ each independently represents a hydrogen atom or a monovalent non-metallic atomic group, preferably a substituted or unsubstituted alkyl group, a substituted or unsubstituted alkenyl group, a substituted or unsubstituted aryl group, a substituted or unsubstituted heteroaryl group, a substituted or unsubstituted alkoxy group, a substituted or unsubstituted alkylthio group, a hydroxy group or a halogen atom.

Preferable examples of $R_1$, $R_2$ and $R_3$ will be specifically described below. Preferable examples of the alkyl group include a straight chain, branched or cyclic alkyl group having from 1 to 20 carbon atoms. Specific examples thereof include a methyl group, an ethyl group, a propyl group, a butyl group, a pentyl group, a hexyl group, a heptyl group, an octyl group, a nonyl group, a decyl group, an undecyl group, a dodecyl group, a tridecyl group, a hexadecyl group, an octadecyl group, an eucosyl group, an isopropyl group, an isobutyl group, a sec-butyl group, a tert-butyl group, an isopentyl group, a neopentyl group, a 1-methylbutyl group, an isohexyl group, a 2-ethylhexyl group, a 2-methylhexyl group, a cyclohexyl group, a cyclopentyl group and a 2-norbomyl group. Among them, a straight chain alkyl group having from 1 to 12 carbon atoms, a branched alkyl group having from 3 to 12 carbon atoms and a cyclic alkyl group having from 5 to 10 carbon atoms are more preferable.

As the substituent for the substituted alkyl group, a monovalent non-metallic atomic group exclusive of a hydrogen atom is used. Preferable examples thereof include a halogen atom (for example, —F, —Br, —Cl or —I), a hydroxy group, an alkoxy group, an aryloxy group, a mercapto group, an alkylthio group, an arylthio group, an alkyldithio group, an aryldithio group, an amino group, an N-alkylamino group, an N,N-dialkylamino group, an N-arylamino group, an N,N-diarylamino group, an N-alkyl-N-arylamino group, an acyloxy group, a carbamoyloxy group, an N-alkylcarbamoyloxy group, an N-arylcarbamoyloxy group, an N,N-dialkylcarbamoyloxy group, an N,N-diarylcarbamoyloxy group, an N-alkyl-N-arylcarbamoyloxy group, an alkylsulfoxy group, an arylsulfoxy group, an acylthio group, an acylamino group, an N-alkylacylamino group, an N-arylacylamino group, a ureido group, an N'-alkylureido group, an N',N'-dialkylureido group, an N'-arylureido group, an N',N'-diarylureido group, an N'-alkyl-N'-arylureido group, an N-alkylureido group, an N-arylureido group, an N'-alkyl-N-alkylureido group, an N'-alkyl-N-arylureido group, an N',N'-dialkyl-N-alkylureido group, an N',N'-dialkyl-N-arylureido group, an N'-aryl-N- alkylureido group, an N'-aryl-N-arylureido group, an N',N'-diaryl-N-alkylureido group, an N',N'-diaryl-N-arylureido group, an N'-alkyl-N'-aryl-N-alkylureido group, an N'-alkyl-N'-aryl-N-arylureido group, an alkoxycarbonylamino group, an aryloxycarbonylamino group, an N-alkyl-N-alkoxycarbonylamino group, an N-alkyl-N-aryloxycarbonylamino group, an N-aryl-N-alkoxycarbonylamino group, an N-aryl-N-aryloxycarbonylamino group, a formyl group, an acyl group, a carboxyl group, an alkoxycarbonyl group, an aryloxycarbonyl group, a carbamoyl group, an N-alkylcarbamoyl group, an N,N-dialkylcarbamoyl group, an N-arylcarbamoyl group, an N,N-diarylcarbamoyl group, an N-alkyl-N-arylcarbamoyl group, an alkylsulfinyl group, an arylsulfinyl group, an alkylsulfonyl group, an arylsulfonyl group, a sulfo group (—SO$_3$H) and its conjugated base group (hereinafter referred to as a "sulfonato group"), an alkoxysulfonyl group, an aryloxysulfonyl group, a sulfinamoyl group, an N-alkylsulfinamoyl group, an N,N-dialkylsulfinamoyl group, an N-arylsulfinamoyl group, an N,N-diarylsulfinamoyl group, an N-alkyl-N-arylsulfinamoyl group, a sulfamoyl group, an N-alkylsulfamoyl group, an N,N-dialkylsulfamoyl group, an N-arylsulfamoyl group, an N,N-diarylsulfamoyl group, an N-alkyl-N-arylsulfamoyl group, a phosphono group (—PO$_3$H$_2$) and its conjugated base group (hereinafter referred to as a "phosphonato group"), a dialkylphosphono group (—PO$_3$(alkyl)$_2$), a diarylphosphono group (—PO$_3$(aryl)$_2$), an alkylarylphosphono group (—PO$_3$(alkyl)(aryl)), a monoalkylphosphono group (—PO$_3$H(alkyl)) and its conjugated base group (hereinafter referred to as an "alkylphosphonato group"), a monoarylphosphono group (—PO$_3$H(aryl)) and its conjugated base group (hereinafter referred to as an "arylphosphonato group"), a phosphonooxy group (—OPO$_3$H$_2$) and its conjugated base group (hereinafter referred to as a "phosphonatooxy group"), a dialkylphosphonooxy group (—OPO$_3$(alkyl)$_2$), a diarylphosphonooxy group (—OPO$_3$(aryl)$_2$), an alkylarylphosphonooxy group (—OPO$_3$(alkyl)(aryl)), a monoalkylphosphonooxy group (—OPO$_3$H(alkyl)) and its conjugated base group (hereinafter referred to as an "alkylphosphonatooxy group"), a monoarylphosphonooxy group (—OPO$_3$H(aryl)) and its conjugated base group (hereinafter referred to as an "arylphosphonatooxy group"), a cyano group, a nitro group, an aryl group, a heteroaryl group, an alkenyl group and an alkynyl group.

In the substituents, specific examples of the alkyl group include those described for the alkyl group above. Specific examples of the aryl group include a phenyl group, a biphenyl group, a naphthyl group, a tolyl group, a xylyl group, a mesityl group, a cumenyl group, a chlorophenyl group, a bromophenyl group, a chloromethylphenyl group, a hydroxyphenyl group, a methoxyphenyl group, an ethoxyphenyl group, a phenoxyphenyl group, an acetoxyphenyl group, a benzoyloxyphenyl group, a methylthiophenyl group, a phenylthiophenyl group, a methylaminophenyl group, a dimethylaminophenyl group, an acetylaminophenyl group, a carboxyphenyl group, a methoxycarbonylphenyl group, an ethoxycarbonylphenyl group, a phenoxycarbonylphenyl group, an N-phenylcarbamoylphenyl group, a nitrophenyl group, a cyanophenyl group, a sulfophenyl group, a sulfonatophenyl group, a phosphonophenyl group and a phosphonatophenyl group.

Examples of the heteroaryl group represented by any one of R$_1$, R$_2$ and R$_3$ preferably include a monocyclic or polycyclic aromatic cyclic group containing at least one of a nitrogen atom, an oxygen atom and a sulfur atom. Examples of especially preferable heteroaryl group include a heteroaryl group derived from thiophene, thiathrene, furan, pyran, isobenzofuran, chromene, xanthene, phenoxazine, pyrrole, pyrazole, isothiazole, isoxazole, pyrazine, pyrimidine, pyridazine, indolizine, isoindolizine, indole, indazole, purine, quinolizine, isoquinoline, phthalazine, naphthylidine, quinazoline, cinnoline, pteridine, carbazole, carboline, phenanthrene, acridine, perimidine, phenanthroline, phthalazine, phenarsazine, phenoxazine, furazane or phenoxazine. These groups may be benzo-fused or may have a substituent.

Also, examples of the alkenyl group represented by any one of R$_1$, R$_2$ and R$_3$ preferably include a vinyl group, a 1-propenyl group, a 1-butenyl group, a cinnamyl group and a 2-chloro-1-ethenyl group. Examples of the alkynyl group include an ethynyl group, a 1-propynyl group, a 1-butynyl group and a trimethylsilylethynyl group. Examples of G$_1$ in the acyl group (G$_1$CO—) include a hydrogen atom and the above-described alkyl group and aryl group. Of the substituents, a halogen atom (for example, —F, —Br, —Cl or —I), an alkoxy group, an aryloxy group, an alkylthio group, an arylthio group, an N-alkylamino group, an N,N-dialkylamino group, an acyloxy group, an N-alkylcarbamoyloxy group, an N-arylcarbamoyloxy group, an acylamino group, a formyl group, an acyl group, a carboxyl group, an alkoxycarbonyl group, an aryloxycarbonyl group, a carbamoyl group, an N-alkylcarbamoyl group, an N,N-dialkylcarbamoyl group, an N-arylcarbamoyl group, an N-alkyl-N-arylcarbamoyl group, a sulfo group, a sulfonato group, a sulfamoyl group, an N-alkylsulfamoyl group, an N,N-dialkylsulfamoyl group, an N-arylsulfamoyl group, an N-alkyl-N-arylsulfamoyl group, a phosphono group, a phosphonato group, a dialkylphosphono group, a diarylphosphono group, a monoalkylphosphono group, an alkylphosphonato group, a monoarylphosphono group, an arylphosphonato group, a phosphonooxy group, a phosphonatooxy group, an aryl group and an alkenyl group are more preferable.

On the other hand, as an alkylene group in the substituted alkyl group, a divalent organic residue resulting from elimination of any one of hydrogen atoms on the above-described alkyl group having from 1 to 20 carbon atoms can be enumerated. Examples of preferable alkylene group include a straight chain alkylene group having from 1 to 12 carbon atoms, a branched alkylene group having from 3 to 12 carbon atoms and a cyclic alkylene group having from 5 to 10 carbon atoms.

Specific examples of the preferable substituted alkyl group represented by any one of R$_1$, R$_2$ and R$_3$, which is obtained by combining the above-described substituent with the alkylene group, include a chloromethyl group, a bromomethyl group, a 2-chloroethyl group, a trifluoromethyl group, a methoxymethyl group, a methoxyethoxyethyl group, an allyloxymethyl group, a phenoxymethyl group, a methylthiomethyl group, a tolylthiomethyl group, an ethylaminoethyl group, a diethylaminopropyl group, a morpholinopropyl group, an acetyloxymethyl group, a benzoyloxymethyl group, an N-cyclohexylcarbamoyloxyethyl group, an N-phenylcarbamoyloxyethyl group, an acetylaminoethyl group, an N-methylbenzoylaminopropyl group, a 2-oxoethyl group, a 2-oxopropyl group, a carboxypropyl group, a methoxycarbonylethyl group, an allyloxycarbonylbutyl group, a chlorophenoxycarbonylmethyl group, a carbamoylmethyl group, an N-methylcarbamoylethyl group, an N,N-dipropylcarbamoylmethyl group, an N-(methoxyphenyl)carbamoylethyl group, an N-methyl-N-(sulfophenyl)carbamoylmethyl group, a sulfobutyl group, a sulfonatobutyl group, a sulfamoylbutyl group, an N-ethylsulfamoylmethyl group, an N,N-dipropyl-sulfamoylpropyl group, an N-tolylsulfamoylpropyl group, an N-methyl-N-(phosphonophenyl)sulfamoyloctyl group, a phosphonobutyl group, a phosphonatohexyl group, a diethylphosphonobutyl group, a diphenylphosphonopropyl group, a methylphosphonobutyl group, a methylphosphonatobutyl group, a tolylphosphonohexyl group, a tolylphosphonatohexyl group, a phosphonooxypropyl group, a phosphonatooxybutyl group, a benzyl group, a phenethyl group, an α-methylbenzyl group, a 1-methyl-1-phenylethyl group, a p-methylbenzyl group, a cinnamyl group, an allyl group, a 1-propenylmethyl group, a 2-butenyl group, a 2-methylallyl group, a 2-methylpropenylmethyl group, a 2-propynyl group, a 2-butynyl group and a 3-butynyl group.

Preferable examples of the aryl group represented by any one of $R_1$, $R_2$ and $R_3$ include a fused ring formed from one to three benzene rings and a fused ring formed from a benzene ring and a 5-membered unsaturated ring. Specific examples thereof include a phenyl group, a naphthyl group, an anthryl group, a phenanthryl group, an indenyl group, an acenaphthenyl group and a fluorenyl group. Among them, a phenyl group and a naphthyl group are more preferable.

Specific examples of the preferable substituted aryl group represented by any one of $R_1$, $R_2$ and $R_3$ include aryl groups having a monovalent non-metallic atomic group exclusive of a hydrogen atom as a substituent on the ring-forming carbon atom of the above-described aryl group. Preferable examples of the substituent include the above-described alkyl groups and substituted alkyl groups, and the substituents described for the above-described substituted alkyl group. Specific examples of the preferable substituted aryl group include a biphenyl group, a tolyl group, a xylyl group, a mesityl group, a cumenyl group, a chlorophenyl group, a bromophenyl group, a fluorophenyl group, a chloromethylphenyl group, a trifluoromethylphenyl group, a hydroxyphenyl group, a methoxyphenyl group, a methoxyethoxyphenyl group, an allyloxyphenyl group, a phenoxyphenyl group, a methylthiophenyl group, a tolylthiophenyl group, an ethylaminophenyl group, a diethylaminophenyl group, a morpholinophenyl group, an acetyloxyphenyl group, a benzoyloxyphenyl group, an N-cyclohexylcarbamoyloxyphenyl group, an N-phenylcarbamo-yloxyphenyl group, an acetylaminophenyl group, an N-methylbenzoylaminophenyl group, a carboxyphenyl group, a methoxycarbonylphenyl group, an allyloxycarbonylphenyl group, a chlorophenoxycarbonylphenyl group, a carbamoylphenyl group, an N-methylcarbamoylphenyl group, an N,N-dipropylcarbamoylphenyl group, an N-(methoxyphenyl)carbamoylphenyl group, an N-methyl-N-(sulfophenyl)carbamoylphenyl group, a sulfophenyl group, a sulfonatophenyl group, a sulfamoylphenyl group, an N-ethylsulfamoylphenyl group, an N,N-dipropylsulfamoylphenyl group, an N-tolylsulfamoylphenyl group, an N-methyl-N-(phosphonophenyl)sulfamoylphenyl group, a phosphonophenyl group, a phosphonatophenyl group, a diethylphosphonophenyl group, a diphenylphosphonophenyl group, a methylphosphonophenyl group, a methylphosphonatophenyl group, a tolylphosphonophenyl group, a tolylphosphonatophenyl group, an allylphenyl group, a 1-propenylmethylphenyl group, a 2-butenylphenyl group, a 2-methylallylphenyl group, a 2-methylpropenylphenyl group, a 2-propynylphenyl group, a 2-butynylphenyl group and a 3-butynylphenyl group.

Preferable examples of the substituted or unsubstituted alkenyl group and the substituted or unsubstituted heteroaryl group represented by any one of $R_1$, $R_2$ and $R_3$ include those described with respect to the alkenyl group and heteroaryl group above.

Next, A in formula (V) will be described below. A represents an aromatic cyclic group which may have a substituent or heterocyclic group which may have a substituent. Specific examples of the aromatic cyclic group which may have a substituent or heterocyclic group which may have a substituent include those described for any one of $R_1$, $R_2$ and $R_3$ in formula (V).

The sensitizing dye represented by formula (V) is obtained by a condensation reaction of the above-described acidic nucleus or an active methyl group-containing acidic nucleus with a substituted or unsubstituted, aromatic ring or hetero ring and can be synthesized with reference to JP-B-59-28329.

Preferable specific examples (D1) to (D41) of the compound represented by formula (V) are set forth below. Further, when isomers with respect to a double bond connecting an acidic nucleus and a basic nucleus are present in each of the compounds, the invention should not be construed as being limited to any one of the isomers.

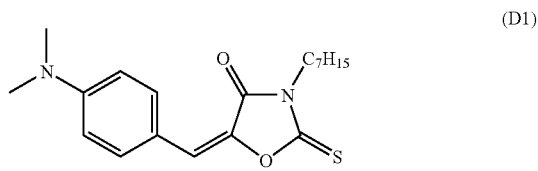

(D1)

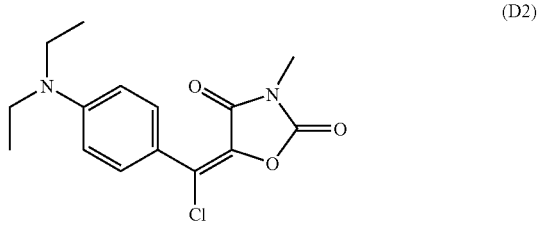

(D2)

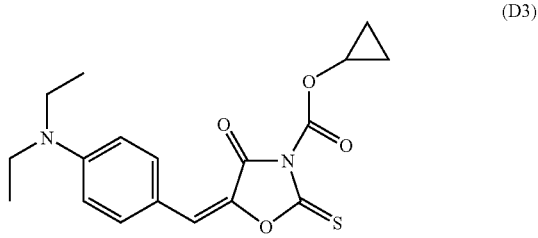

(D3)

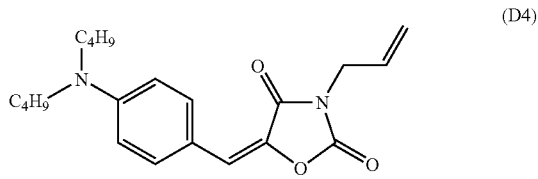

(D4)

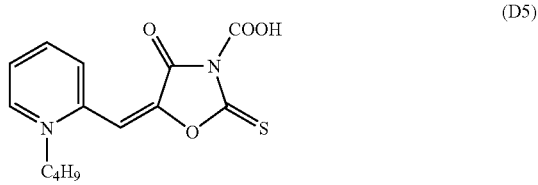

(D5)

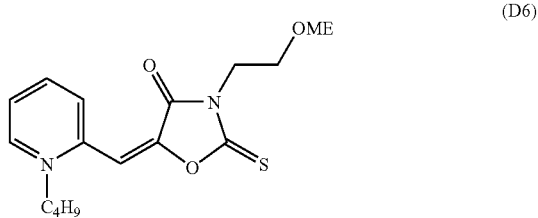

(D6)

-continued
(D7)
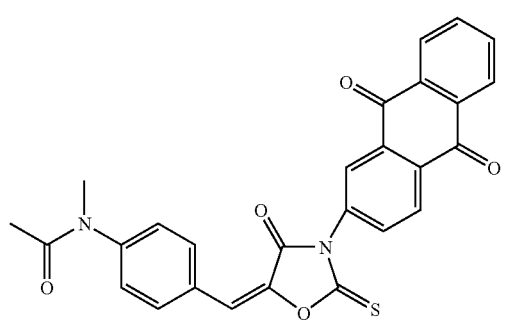
(D8)
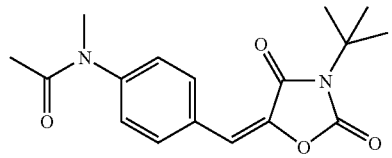
(D9)
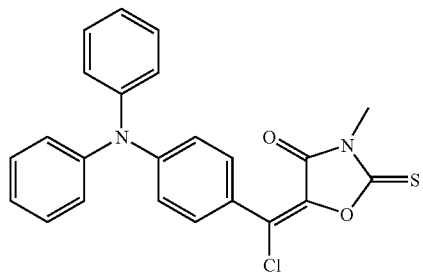
(D10)
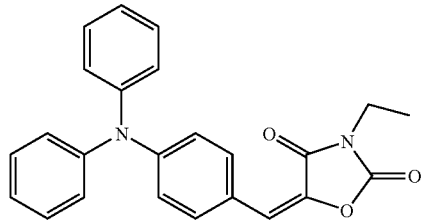
(D11)
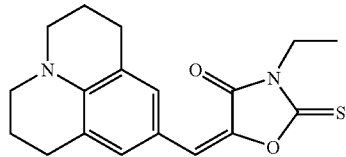
(D12)
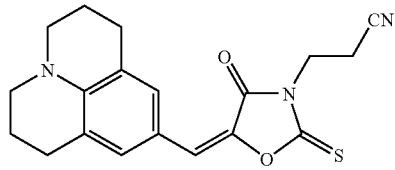
(D13)
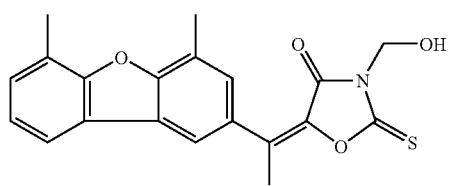
-continued
(D14)
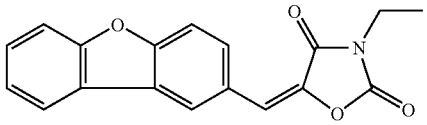
(D15)
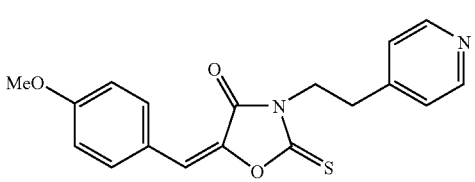
(D16)
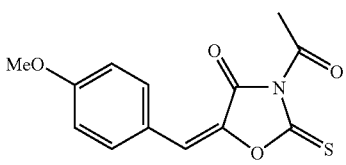
(D17)
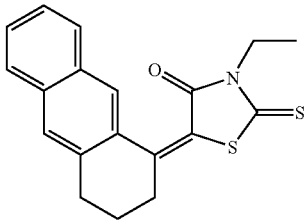
(D18)
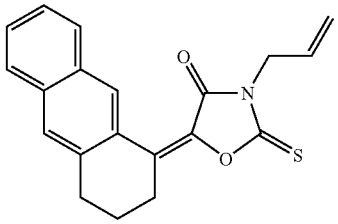
(D19)
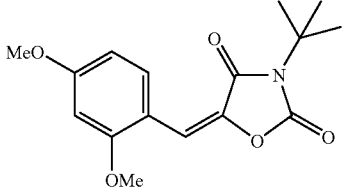
(D20)
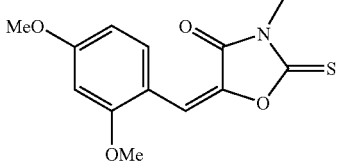
(D21)
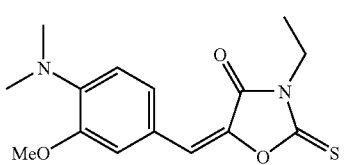

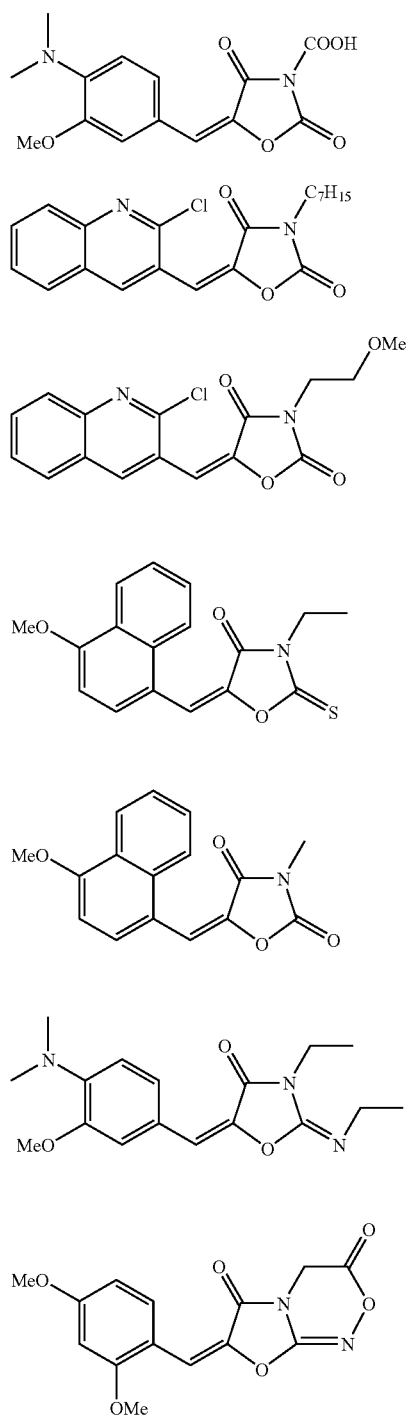
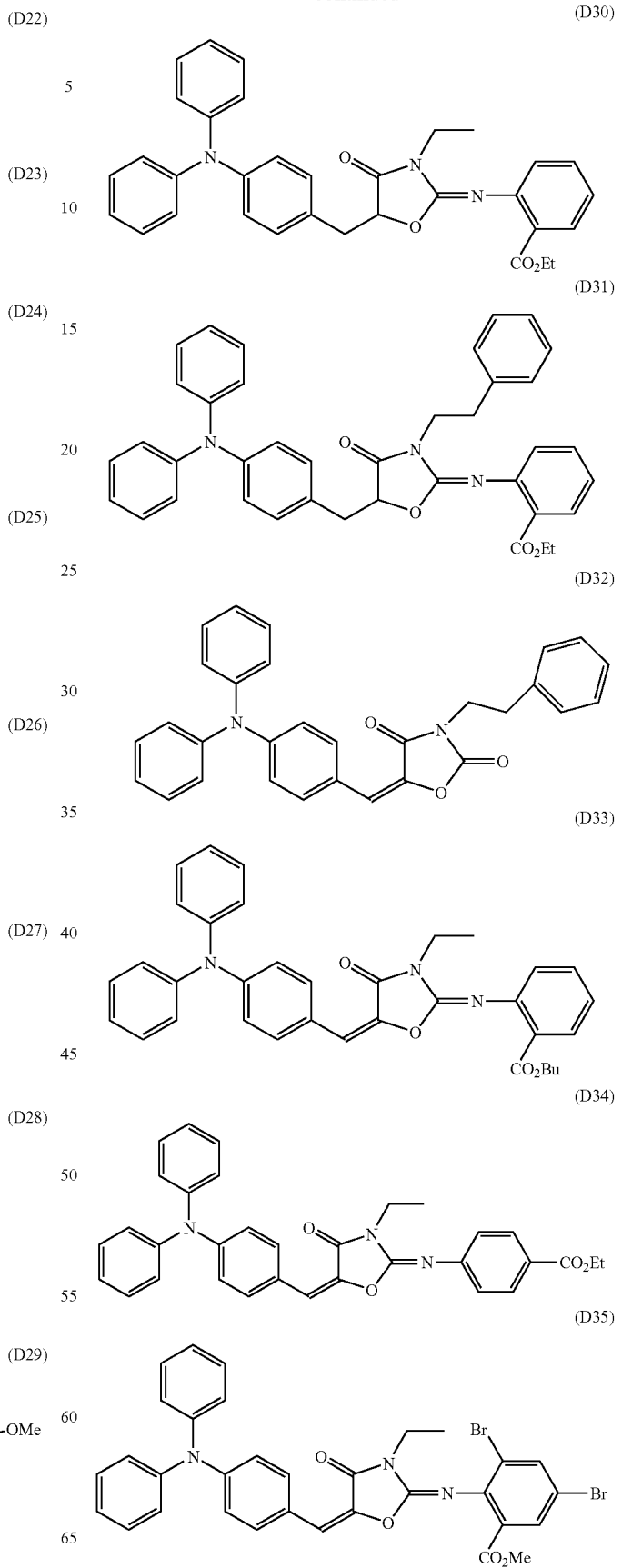

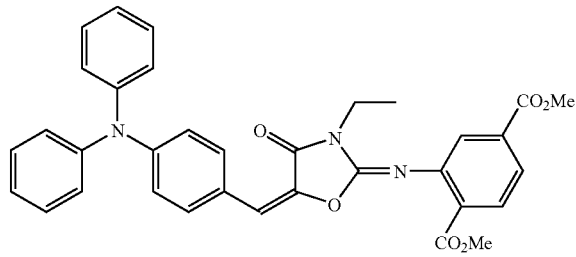
(D36)

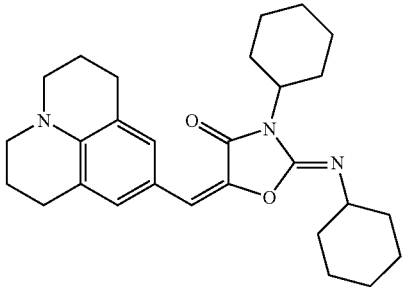
(D41)

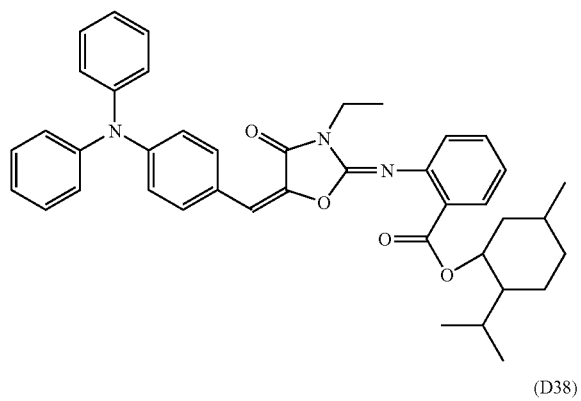
(D37)

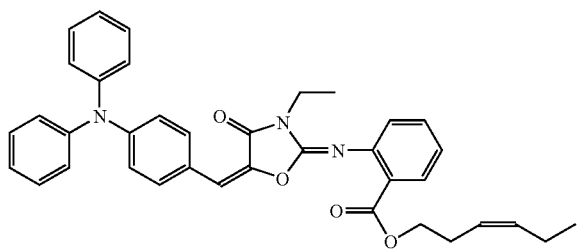
(D38)

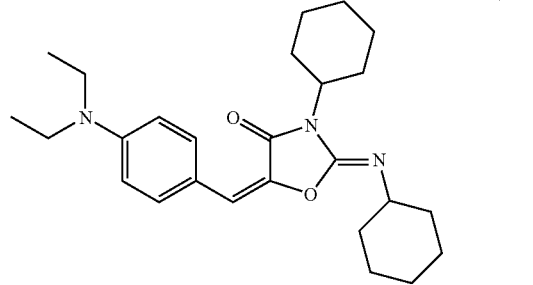
(D39)

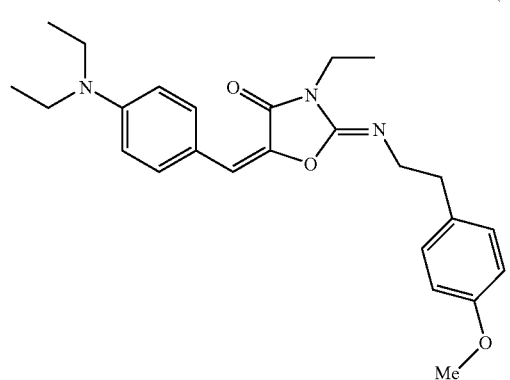
(D40)

The sensitizing dye having absorption in a wavelength range of 360 to 450 nm is preferably used in a range from 1.0 to 10.0% by weight, more preferably from 1.5 to 5.0% by weight, based on the total components of the photosensitive layer.

Polymerization Initiator

The polymerization initiator for use in the invention is a compound which generates a radical with light energy or heat energy to initiate or accelerate polymerization of a compound having a polymerizable unsaturated group. The polymerization initiator according to the invention is appropriately selected to use, for example, from known polymerization initiators and compounds containing a bond having small bond dissociation energy.

The polymerization initiators include, for example, organic halogen compounds, carbonyl compounds, organic peroxides, azo compounds, azido compounds, metallocene compounds, hexaarylbiimidazole compounds, organic boron compounds, disulfone compounds, oxime ester compounds and onium salt compounds.

The organic halogen compounds described above specifically include, for example, compounds described in Wakabayashi et al., *Bull. Chem. Soc. Japan*, 42, 2924 (1969), U.S. Pat. No. 3,905,815, JP-B-46-4605, JP-A-48-36281, JP-A-53-133428, JP-A-55-32070, JP-A-60-239736, JP-A-61-169835, JP-A-61-169837, JP-A-62-58241, JP-A-62-212401, JP-A-63-70243, JP-A-63-298339 and M. P. Hutt, *Journal of Heterocyclic Chemistry*, 1, No. 3 (1970). Among them, oxazole compounds and s-triazine compounds each substituted with a trihalomethyl group are preferable.

More preferably, s-triazine derivatives in which at least one of mono-, di- or tri-halogen substituted methyl group is connected to the s-triazine ring and oxazole derivatives in which at least one of mono-, di- or tri-halogen substituted methyl group is connected to the oxazole ring are exemplified. Specific examples thereof include 2,4,6-tris(monochloromethyl)-s-triazine, 2,4,6-tris(dichloromethyl)-s-triazine, 2,4,6-tris(trichloromethyl)-s-triazine, 2-methyl-4,6-bis(trichloromethyl)-s-triazine, 2-n-propyl-4,6-bis(trichloromethyl)-s-triazine, 2-($\alpha,\alpha,\beta$-trichloroethyl)-4,6-bis(trichloromethyl)-s-triazine, 2-(3,4-epoxyphenyl)-4,6-bis(trichloromethyl)-s-triazine, 2-[1-(p-methoxyphenyl)-2,4-butadienyl]-4,6-bis(trichloromethyl)-s-triazine, 2-styryl-4,6-bis(trichloromethyl)-s-triazine, 2-(p-methoxystyryl)-4,6-bis(trichloromethyl)-s-triazine, 2-(p-isopropyloxystyryl)-4,6-bis(trichloromethyl)-s-triazine, 2-(p-tolyl)-4,6-bis(trichloromethyl)-s-triazine, 2-(4-methoxynaphthyl)-4,6-bis(trichloromethyl)-s-triazine, 2-phenylthio-4,6-bis(trichloromethyl)-s-triazine, 2-benzylthio-4,6-bis(trichloromethyl)-s-triazine, 2,4,6-tris(dibromomethyl)-s-triazine, 2,4,6-tris(tribromomethyl)-s-triazine, 2-methyl-4,6- bis(tribromomethyl)-s-triazine, 2-methoxy-4,6-bis(tribromomethyl)-s-triazine and compounds shown below.
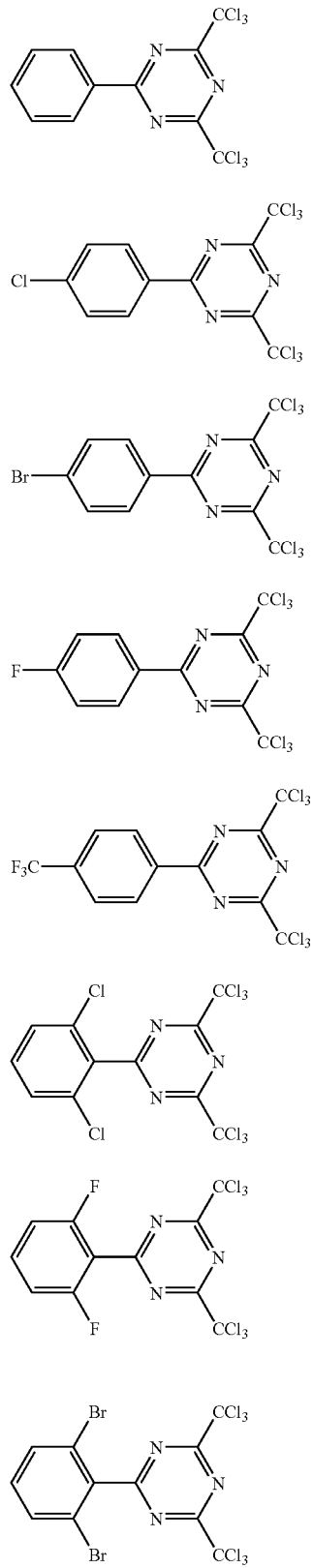
-continued
(I)-9
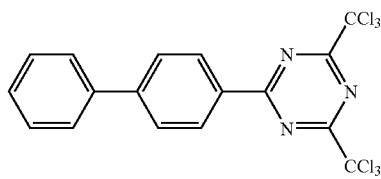
(I)-10
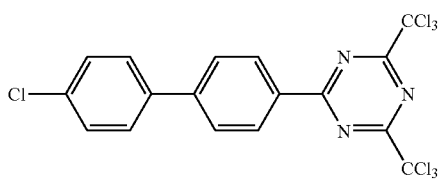
(I)-11
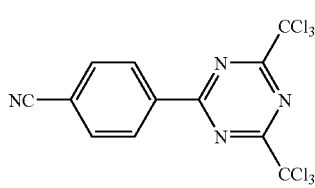
(I)-12
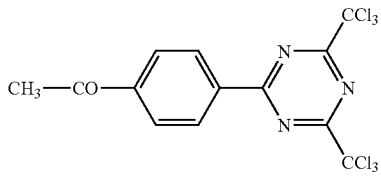
(I)-13
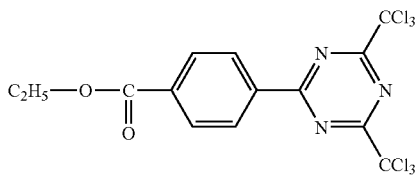
(I)-14
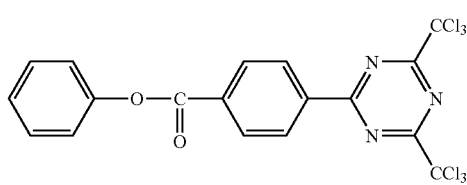
(I)-15
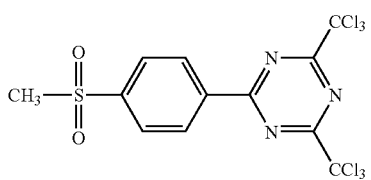
(I)-16
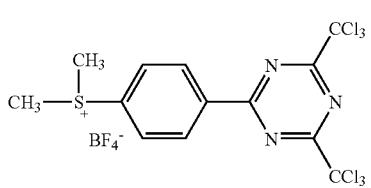

-continued (I)-17 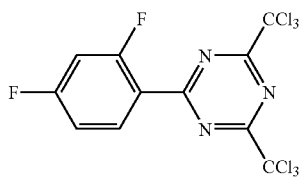

(I)-18 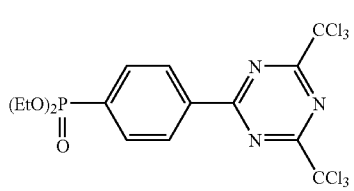

(I)-19 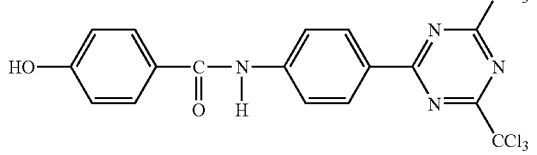

(I)-20 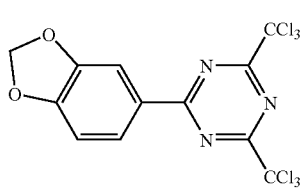

(I)-21 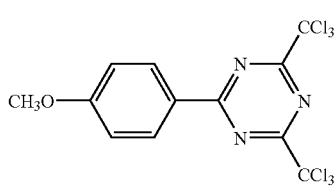

(I)-22 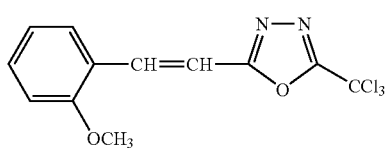

(I)-23 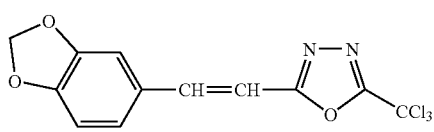

(I)-24 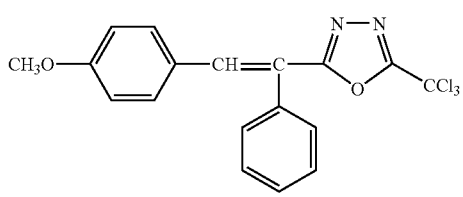

(I)-25 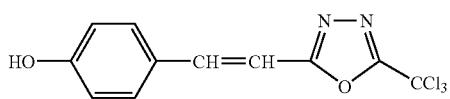

-continued (I)-26 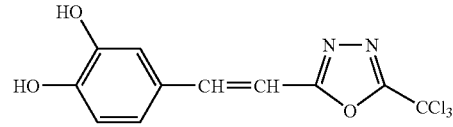

(I)-27 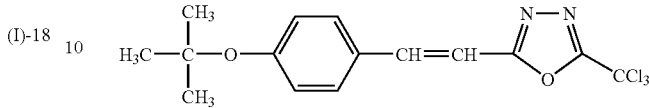

The carbonyl compounds described above include, for example, benzophenone derivatives, e.g., benzophenone, Michler's ketone, 2-methylbenzophenone, 3-methylbenzophenone, 4-methylbenzophenone, 2-chlorobenzophenone, 4-bromobenzophenone or 2-carboxybenzophenone, acetophenone derivatives, e.g., 2,2-dimethoxy-2-phenylacetophenone, 2,2-diethoxyacetophenone, 1-hydroxycyclohexylphenylketone, α-hydroxy-2-methylphenylpropane, 1-hydroxy-1-methylethyl-(p-isopropylphenyl)ketone, 1-hydroxy-1-(p-dodecylphenyl)ketone, 2-methyl-(4'-(methylthio)phenyl)-2-morpholino-1-propane or 1,1,1,-trichloromethyl-(p-butylphenyl)ketone, thioxantone derivatives, e.g., thioxantone, 2-ethylthioxantone, 2-isopropylthioxantone, 2-chlorothioxantone, 2,4-dimetylthioxantone, 2,4-dietylthioxantone or 2,4-diisopropylthioxantone, and benzoic acid ester derivatives, e.g., ethyl p-dimethylaminobenzoate or ethyl p-diethylaminobenzoate.

The azo compounds described above include, for example, azo compounds described in JP-A-8-108621.

The organic peroxides described above include, for example, trimethylcyclohexanone peroxide, acetylacetone peroxide, 1,1-bis(tert-butylperoxy)-3,3,5-trimethylcyclohexane, 1,1-bis(tert-butylperoxy)cyclohexane, 2,2-bis(tert-butylperoxy)butane, tert-butylhydroperoxide, cumene hydroperoxide, diisopropylbenzene hydroperoxide, 2,5-dimethylhexane-2,5-dihydroperoxide, 1,1,3,3-tetramethylbutyl hydroperoxide, tert-butylcumyl peroxide, dicumyl peroxide, 2,5-dimethyl-2,5-di(tert-butylperoxy)hexane, 2,5-oxanoyl peroxide, peroxy succinic acid, benzoyl peroxide, 2,4-dichlorobenzoyl peroxide, diisopropylperoxy dicarbonate, di-2-ethylhexylperoxy dicarbonate, di-2-ethoxyethylperoxy dicarbonate, dimethoxyisopropylperoxy dicarbonate, di(3-methyl-3-methoxybutyl)peroxy dicarbonate, tert-butylperoxy acetate, tert-butylperoxy pivalate, tert-butylperoxy neodecanoate, tert-butylperoxy octanoate, tert-butylperoxy laurate, tersyl carbonate, 3,3',4,4'-tetra(tert-butylperoxycarbonyl)benzophenone, 3,3',4,4'-tetra(tert-hexylperoxycarbonyl)benzophenone, 3,3',4,4'-tetra(p-isopropylcumylperoxycarbonyl)benzophenone, carbonyl di(tert-butylperoxydihydrogen diphthalate) and carbonyl di(tert-hexylperoxydihydrogen diphthalate).

The metallocene compounds described above include, for example, various titanocene compounds described in JP-A-59-152396, JP-A-61-151197, JP-A-63-41484, JP-A-2-249, JP-A-2-4705 and JP-A-5-83588, for example, dicyclopentadienyl-Ti-bisphenyl, dicyclopentadienyl-Ti-bis-2,6-difluorophen-1-yl, dicyclopentadienyl-Ti-bis-2,4-difluorophen-1-yl, dicyclopentadienyl-Ti-bis-2,4,6-trifluorophen-1-yl, dicyclopentadienyl-Ti-bis-2,3,5,6-tetrafluorophen-1-yl, dicyclopentadienyl-Ti-bis-2,3,4,5,6-pentafluorophen-1-yl, dimethylcyclopentadienyl-Ti-bis-2,6-difluorophen-1-yl, dimethylcyclopentadienyl-Ti-bis-2,4,6-trifluorophen-1-yl, dimethylcyclopentadienyl-Ti-bis-2,3,5,6-tetrafluorophen-1- yl, dimethylcyclopentadienyl-Ti-bis-2,3,4,5,6-pentafluorophen-1-yl, or bis(cyclopentadienyl)-bis(2,6-difluoro-3-(pyr-1-yl)phenyl)titanium and iron-arene complexes described in JP-A-1-304453 and JP-A-1-152109.

The hexaarylbiimidazole compounds described above include, for example, various compounds described in JP-B-6-29285 and U.S. Pat. Nos. 3,479,185, 4,311,783 and 4,622,286, specifically, for example, 2,2'-bis(o-chlorophenyl)-4,4',5,5'-tetraphenylbiimidazole, 2,2'-bis(o-bromophenyl)-4,4',5,5'-tetraphenylbiimidazole, 2,2'-bis(o,p-dichlorophenyl)-4,4',5,5'-tetraphenylbiimidazole, 2,2'-bis(o-chlorophenyl)-4,4',5,5'-tetra(m-methoxyphenyl)biimidazole, 2,2'-bis(o,o'-dichlorophenyl)-4,4',5,5'-tetraphenylbiimidazole, 2,2'-bis(o-nitrophenyl)-4,4',5,5'-tetraphenylbiimidazole, 2,2'-bis(o-methylphenyl)-4,4',5,5'-tetraphenylbiimidazole and 2,2'-bis(o-trifluoromethylphenyl)-4,4',5,5'-tetraphenylbiimidazole.

The organic boron compounds described above include, for example, organic boric acid salts described in JP-A-62-143044, JP-A-62-150242, JP-A-9-188685, JP-A-9-188686, JP-A-9-188710, JP-A-2000-131837, JP-A-2002-107916, Japanese Patent 2764769, JP-A-2002-116539 and Martin Kunz, *Rad Tech '98 Proceeding*, Apr. 19-22 (1998), Chicago, organic boron sulfonium complexes or organic boron oxosulfonium complexes described in JP-A-6-157623, JP-A-6-175564 and JP-A-6-175561, organic boron iodonium complexes described in JP-A-6-175554 and JP-A-6-175553, organic boron phosphonium complexes described in JP-A-9-188710, and organic boron transition metal coordination complexes described in JP-A-6-348011, JP-A-7-128785, JP-A-7-140589, JP-A-7-306527 and JP-A-7-292014.

The disulfone compounds described above include, for example, compounds described in JP-A-61-166544 and JP-A-2002-328465.

The oxime ester compounds described above include, for example, compounds described in *J. C. S. Perkin II*, 1653-1660 (1979), *J. C. S. Perkin II*, 156-162 (1979), *Journal of Photopolymer Science and Technology*, 202-232 (1995) and JP-A-2000-66385, and compounds described in JP-A-2000-80068. Specific examples thereof include compounds represented by the following structural formulae:

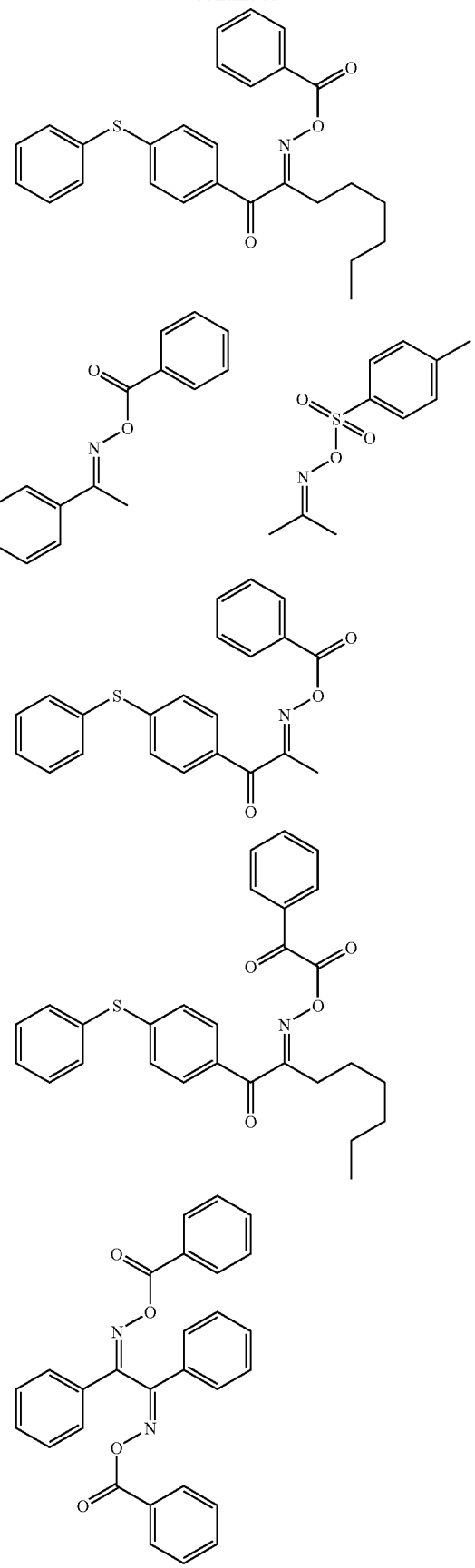
-continued

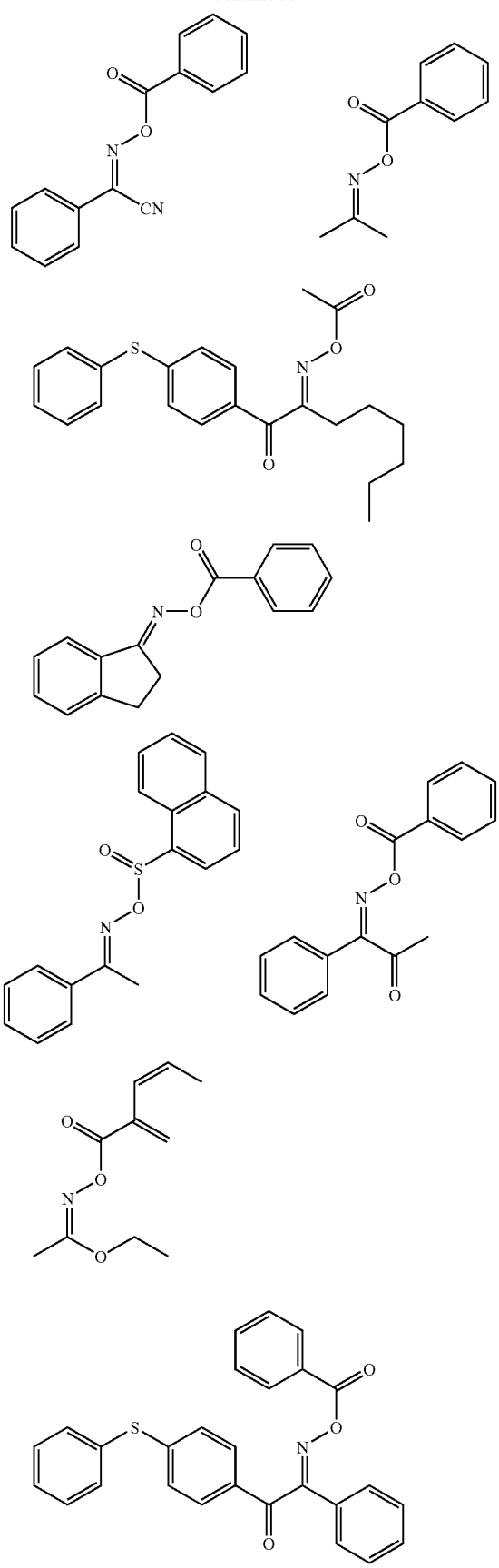
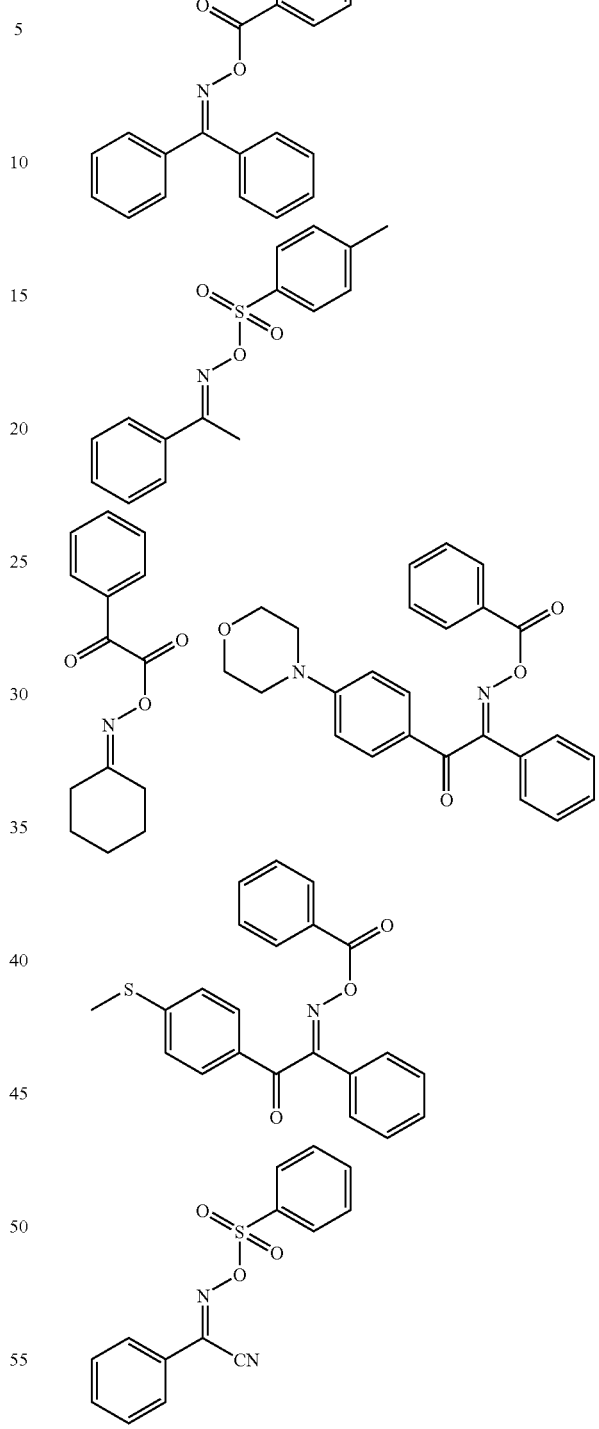
The onium salt compounds described above include onium salts, for example, diazonium salts described in S. I. Schlesinger, *Photogr. Sci. Eng.,* 18, 387 (1974) and T. S. Bal et al., *Polymer,* 21, 423 (1980), ammonium salts described in U.S. Pat. No. 4,069,055 and JP-A-4-365049, phosphonium salts described in U.S. Pat. Nos. 4,069,055 and 4,069,056, iodonium salts described in European Patent 104,143, U.S. Pat. Nos. 339,049 and 410,201, JP-A-2-150848 and JP-A-2-

296514, sulfonium salts described in European Patents 370, 693, 390,214, 233,567, 297,443 and 297,442, U.S. Pat. Nos. 4,933,377, 161,811, 410,201, 339,049, 4,760,013, 4,734,444 and 2,833,827 and German Patents 2,904,626, 3,604,580 and 3,604,581, selenonium salts described in J. V. Crivello et al., *Macromolecules*, 10 (6), 1307 (1977) and J. V. Crivello et al., *J. Polymer Sci., Polymer Chem. Ed.*, 17, 1047 (1979), and arsonium salts described in C. S. Wen et al., *Teh, Proc. Conf. Rad. Curing ASIA*, p. 478, Tokyo, October (1988).

In the invention, the onium salt functions not as an acid generator, but as an ionic radical polymerization initiator.

The onium salts preferably used in the invention include onium salts represented by the following formulae (RI-I) to (RI-III):

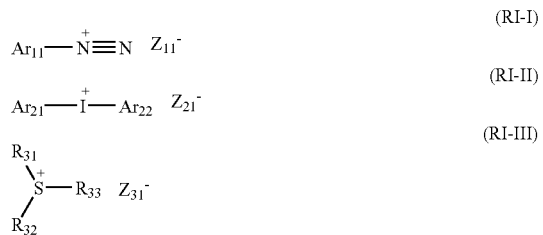

In formula (RI-I), $Ar_{11}$ represents an aryl group having 20 or less carbon atoms, which may have 1 to 6 substituents. Preferable examples of the substituent include an alkyl group having from 1 to 12 carbon atoms, an alkenyl group having from 1 to 12 carbon atoms, an alkynyl group having from 1 to 12 carbon atoms, an aryl group having from 1 to 12 carbon atoms, an alkoxy group having from 1 to 12 carbon atoms, an aryloxy group having from 1 to 12 carbon atoms, a halogen atom, an alkylamino group having from 1 to 12 carbon atoms, a dialkylimino group having from 1 to 12 carbon atoms, an alkylamido group or arylamido having from 1 to 12 carbon atoms, a carbonyl group, a carboxyl group, a cyano group, a sulfonyl group, an thioalkyl group having from 1 to 12 carbon atoms and an thioaryl group having from 1 to 12 carbon atoms. $Z_{11}^-$ represents a monovalent anion. Specific examples of the monovalent anion include a halogen ion, a perchlorate ion, a hexafluorophosphate ion, a tetrafluoroborate ion, a sulfonate ion, a sulfinate ion, a thosulfonate ion and a sulfate ion. Among them, a perchlorate ion, a hexafluorophosphate ion, a tetrafluoroborate ion, a sulfonate ion and a sulfinate ion are preferred in view of stability.

In the formula (RI-II), $Ar_{21}$ and $Ar_{22}$ each independently represents an aryl group having 20 or less carbon atoms, which may have 1 to 6 substituents. Preferable examples of the substituent include an alkyl group having from 1 to 12 carbon atoms, an alkenyl group having from 1 to 12 carbon atoms, an alkynyl group having from 1 to 12 carbon atoms, an aryl group having from 1 to 12 carbon atoms, an alkoxy group having from 1 to 12 carbon atoms, an aryloxy group having from 1 to 12 carbon atoms, a halogen atom, an alkylamino group having from 1 to 12 carbon atoms, a dialkylimino group having from 1 to 12 carbon atoms, an alkylamido group or arylamido group having from 1 to 12 carbon atoms, a carbonyl group, a carboxyl group, a cyano group, a sulfonyl group, an thioalkyl group having from 1 to 12 carbon atoms and an thioaryl group having from 1 to 12 carbon atoms. $Z_{21}^-$ represents a monovalent anion. Specific examples of the monovalent anion include a halogen ion, a perchlorate ion, a hexafluorophosphate ion, a tetrafluoroborate ion, a sulfonate ion, a sulfinate ion, a thosulfonate ion, a sulfate ion and a carboxylate ion. Among them, a perchlorate ion, a hexafluorophosphate ion, a tetrafluoroborate ion, a sulfonate ion, a sulfinate ion and a carboxylate ion are preferred in view of stability and reactivity.

In the formula (RI-III), $R_{31}$, $R_{32}$ and $R_{33}$ each independently represents an aryl group having 20 or less carbon atoms, which may have 1 to 6 substituents, an alkyl group, an alkenyl group or an alkynyl group. Among them, the aryl group is preferred in view of reactivity and stability. Preferable examples of the substituent include an alkyl group having from 1 to 12 carbon atoms, an alkenyl group having from 1 to 12 carbon atoms, an alkynyl group having from 1 to 12 carbon atoms, an aryl group having from 1 to 12 carbon atoms, an alkoxy group having from 1 to 12 carbon atoms, an aryloxy group having from 1 to 12 carbon atoms, a halogen atom, an alkylamino group having from 1 to 12 carbon atoms, a dialkylimino group having from 1 to 12 carbon atoms, an alkylamido group or arylamido group having from 1 to 12 carbon atoms, a carbonyl group, a carboxyl group, a cyano group, a sulfonyl group, an thioalkyl group having from 1 to 12 carbon atoms and an thioaryl group having from 1 to 12 carbon atoms. $Z_{31}^-$ represents a monovalent anion. Specific examples of the monovalent anion include a halogen ion, a perchlorate ion, a hexafluorophosphate ion, a tetrafluoroborate ion, a sulfonate ion, a sulfinate ion, a thosulfonate ion, a sulfate ion and a carboxylate ion. Among them, a perchlorate ion, a hexafluorophosphate ion, a tetrafluoroborate ion, a sulfonate ion, a sulfinate ion and a carboxylate ion are preferred in view of stability and reactivity. Carboxylate ions described in JP-A-2001-343742 are more preferable, and carboxylate ions described in JP-A-2002-148790 are particularly preferable.

Specific examples of the onium salt are set forth below, but the invention should not be construed as being limited thereto.

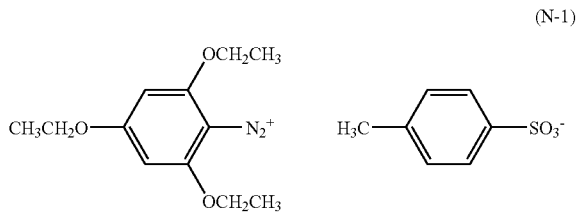

(N-1)

(N-2)

(N-3)

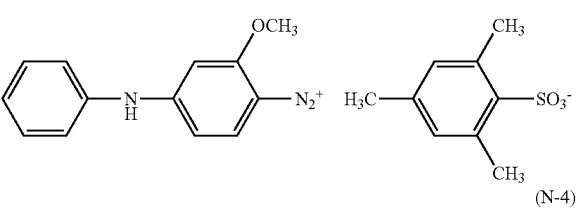

(N-4)

(N-5)

(N-6)

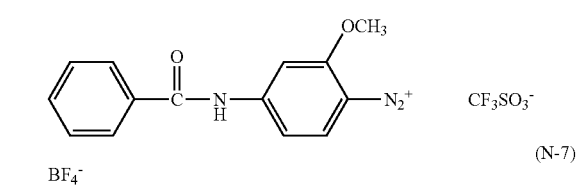

(N-7)

-continued
(N-8)
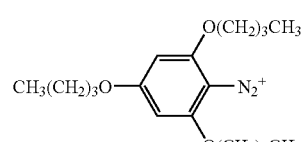
ClO4-
(N-9)
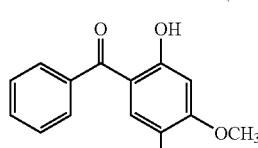
(N-10)
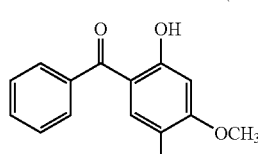
(N-11)
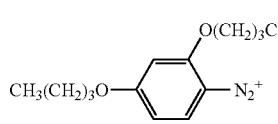
PF8-
(N-12)
(N-13)
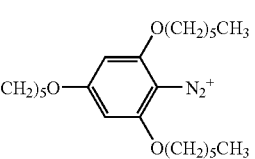
ClO4-
(N-14)
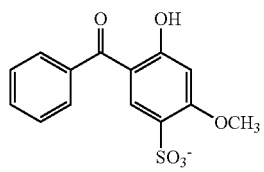
(N-15)
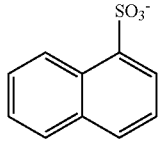
PF6-
(N-16)
(N-17)
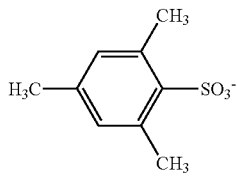
(I-1)
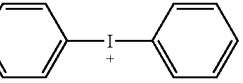
PF6-
(I-2)
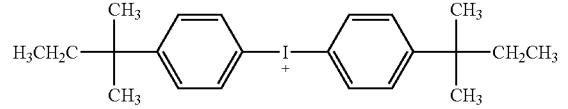
PF6-
(I-3)
-continued
(I-4)
ClO4-
(I-5)
(I-6)
(I-7)
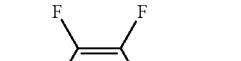
(I-8)
CF3SO3-
(I-9)
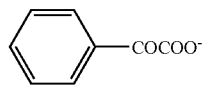
(I-10)
(I-11)
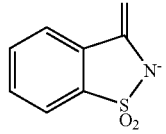
(I-12)
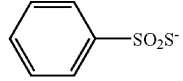
(I-13)
ClO4-
(I-14)
PF6-
(I-15)
(I-16)
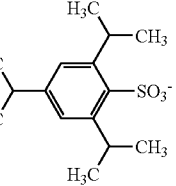

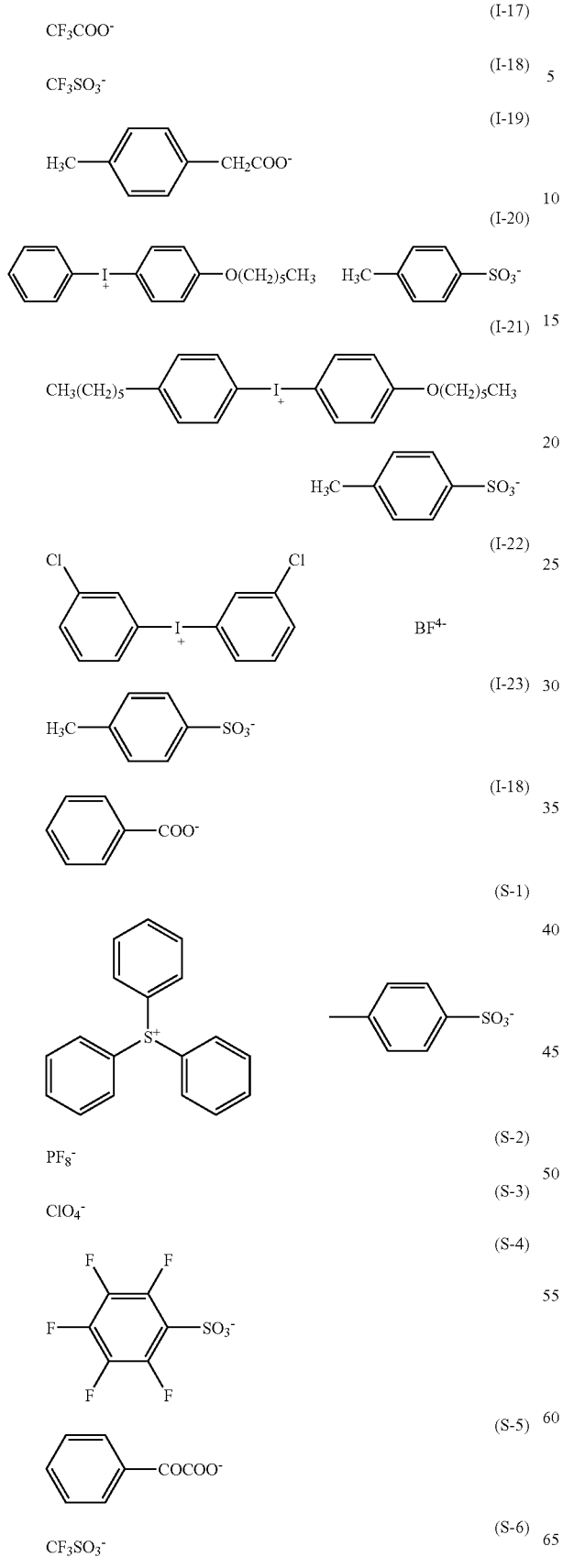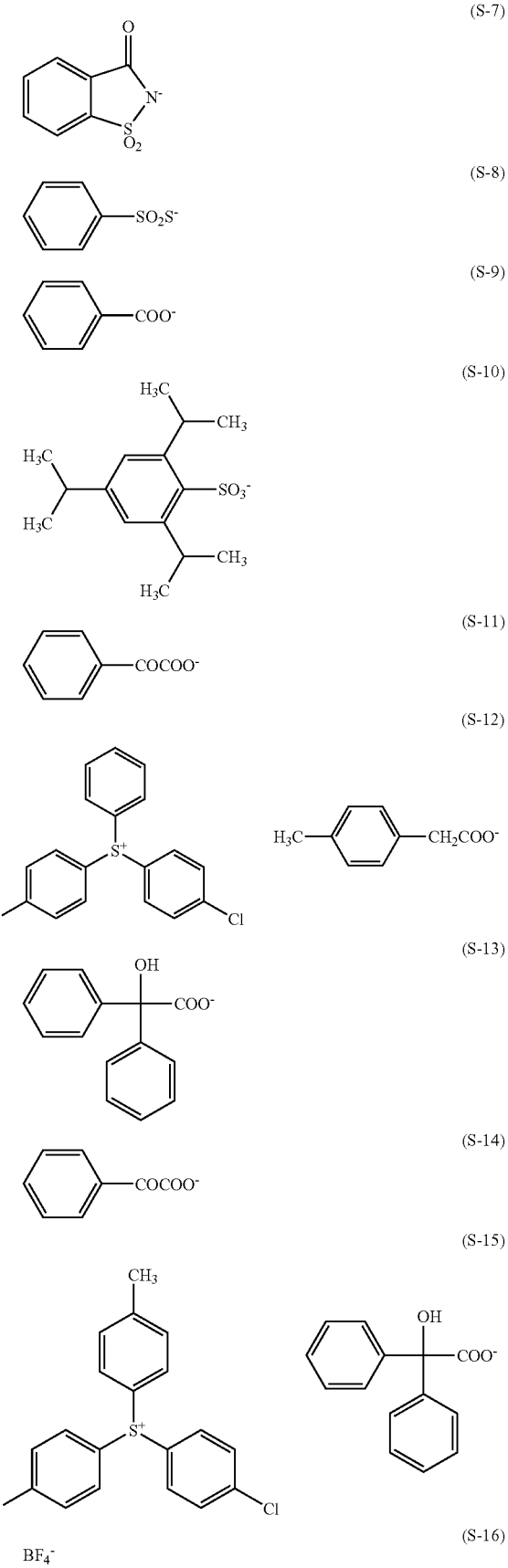

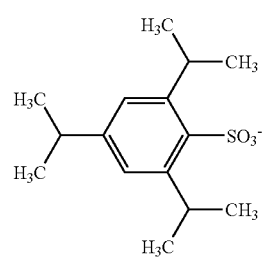

(S-17)

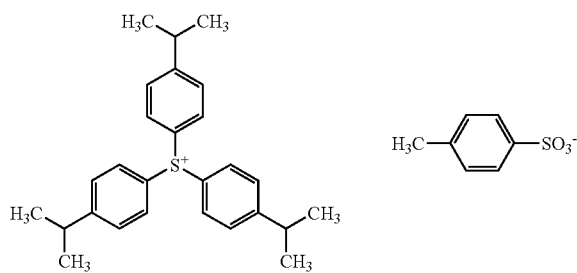

(S-18)

The polymerization initiator is not limited to those described above. In particular, the triazine type initiators, organic halogen compounds, oxime ester compounds, diazonium salts, iodonium salts and sulfonium salts are more preferable from the standpoint of reactivity and stability The polymerization initiators may be used individually or in combination of two or more thereof. Further, the polymerization initiator may be added together with other components to one layer or may be added to a different layer separately provided. The polymerization initiator can be added preferably in an amount from 0.1 to 50% by weight, more preferably from 0.5 to 30% by weight, particularly preferably from 0.8 to 20% by weight, based on the total solid content of the photosensitive layer.

Co-sensitizer

The sensitivity of the photosensitive layer can be further increased by using a certain additive. Such a compound is referred to as a co-sensitizer in the invention. The operation mechanism of the co-sensitizer is not quite clear but may be considered to be mostly based on the following chemical process. Specifically, the co-sensitizer reacts with various intermediate active species (for example, a radical, a peroxide, an oxidizing agent or a reducing agent) generated during the process of photo-reaction initiated by light absorption of the photopolymerization initiation system and subsequent addition-polymerization reaction to produce new active radicals. The co-sensitizers are roughly classified into (a) a compound which is reduced to produce an active radical, (b) a compound which is oxidized to produce an active radical and (c) a compound which reacts with a radical having low activity to convert it into a more highly active radical or acts as a chain transfer agent. However, in many cases, a common view about that an individual compound belongs to which type is not present.

(a) Compound Which is Reduced to Produce an Active Radical Compound Having Carbon-halogen Bond An active radical is considered to be generated by the reductive cleavage of the carbon-halogen bond. Specific examples of the compound preferably used include a trihalomethyl-s-triazine and a trihalomethyloxadiazole.

Compound Having Nitrogen-nitrogen Bond

An active radical is considered to be generated by the reductive cleavage of the nitrogen-nitrogen bond. Specific examples of the compound preferably used include a hexaarylbiimidazole.

Compound Having Oxygen-oxygen Bond

An active radical is considered to be generated by the reductive cleavage of the oxygen-oxygen bond. Specific examples of the compound preferably used include an organic peroxide.

Onium Compound

An active radical is considered to be generated by the reductive cleavage of a carbon-hetero bond or oxygen-nitrogen bond. Specific examples of the compound preferably used include a diaryliodonium salt, a triarylsulfonium salt and an N-alkoxypyridinium (azinium) salt.

Ferrocene and Iron Allene Complexe

An active radical can be reductively generated.

(b) Compound Which is Oxidized to Produce an Active Radical Alkylate Complex

An active radical is considered to be generated by the oxidative cleavage of a carbon-hetero bond. Specific examples of the compound preferably used include a triaryl alkyl borate.

Alkylamine Compound

An active radical is considered to be generated by the oxidative cleavage of a C—X bond on the carbon adjacent to nitrogen, wherein X is preferably a hydrogen atom, a carboxy group, a trimethylsilyl group or a benzyl group. Specific examples of the compound include an ethanolamine, an N-phenylglycine and an N-trimethylsilylmethylaniline.

Sulfur-containing or Tin-containing Compound

A compound in which the nitrogen atom of the above-described amine is replaced by a sulfur atom or a tin atom is considered to generate an active radical in the same manner. Also, a compound having an S—S bond is known to effect sensitization by the cleavage of the S—S bond.

α-Substituted Methylcarbonyl Compound

An active radical can be generated by the oxidative cleavage of carbonyl-α-carbon bond. The compound in which the carbonyl is converted into an oxime ether also shows the similar function. Specific examples of the compound include an 2-alkyl-1-[4-(alkylthio)phenyl]-2-morpholinopronone-1 and an oxime ether obtained by a reaction of the 2-alkyl-1-[4-(alkylthio)phenyl]-2-morpholinopronone-1 with a hydroxyamine and subsequent etherification of the N—OH.

Sulfinic Acid Salt

An active radical can be reductively generated. Specific examples of the compound include sodium arylsulfinate.

(c) Compound Which Reacts With a Radical to Convert it Into a More Highly Active Radical or Acts as a Chain Transfer Agent For example, a compound having SH, PH, SiH or GeH in its molecule is used as the compound which reacts with a radical to convert it into a more highly active radical or acts as a chain transfer agent. The compound donates hydrogen to a low active radical species to generate a radical or is oxidized and deprotonized to generate a radical. Specific examples of the compound include a 2-mercaptobenzimidazole.

A large number of examples of the co-sensitizer are more specifically described, for example, in JP-A-9-236913 as additives for the purpose of increasing sensitivity. Some of them are set forth below, but the invention should not be construed as being limited thereto.

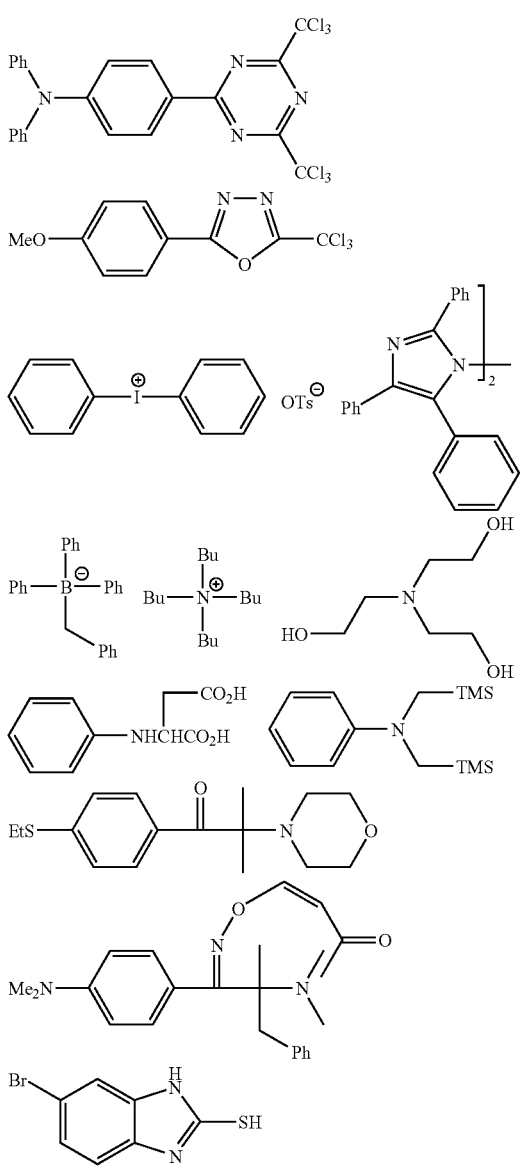

Similarly to the above-described sensitizing dye, the co-sensitizer can be subjected to various chemical modifications so as to improve the characteristics of the photosensitive layer of the lithographic printing plate precursor. For instance, methods, for example, binding to the sensitizing dye, polymerization initiator, addition-polymerizable unsaturated compound or other radical-generating part, introduction of a hydrophilic site, introduction of a substituent for improving compatibility or inhibiting deposition of crystal, introduction of a substituent for improving adhesion, and formation of a polymer, may be used. The co-sensitizers may be used individually or in combination of two or more thereof The amount of the co-sensitizer used is ordinarily from 0.05 to 100 parts by weight, preferably from 1 to 80 parts by weight, more preferably from 3 to 50 parts by weight, per 100 parts by weight of the polymerizable compound having an ethylenically unsaturated double bond.

Microcapsule

In the invention, in order to incorporate the above-described constituting components of the photosensitive layer and other constituting components described hereinafter into the photosensitive layer, a part of the constituting components is encapsulated into microcapsules and added to the photosensitive layer as described, for example, in JP-A-2001-277740 and JP-A-2001-277742. In such a case, each constituting component may be present inside or outside the microcapsule in an appropriate ratio.

As a method of microencapsulating the constituting components of the photosensitive layer, known methods can be used. Methods for the production of microcapsules include, for example, a method of utilizing coacervation described in U.S. Pat. Nos. 2,800,457 and 2,800,458, a method of using interfacial polymerization described in U.S. Pat. No. 3,287, 154, JP-B-38-19574 and JP-B-42-446, a method of using deposition of polymer described in U.S. Pat. Nos. 3,418,250 and 3,660,304, a method of using an isocyanate polyol wall material described in U.S. Pat. No. 3,796,669, a method of using an isocyanate wall material described in U.S. Pat. No. 3,914,511, a method of using a urea-fonnaldehyde-type or urea-fonnaldehyde-resorcinol-type wall-forming material described in U.S. Pat. Nos. 4,001,140, 4,087,376 and 4,089, 802, a method of using a wall material, for example, a melamine-fonnaldehyde resin or hydroxycellulose described in U.S. Pat. No. 4,025,445, an in-situ method by polymerization of monomer described in JP-B-36-9163 and JP-B-51-9079, a spray drying method described in British Patent 930, 422 and U.S. Pat. No. 3,111,407, and an electrolytic dispersion cooling method described in British Patents 952, 807 and 967,074, but the invention should not be construed as being limited thereto.

A preferable microcapsule wall used in the invention has three-dimensional crosslinking and has a solvent-swellable property. From this point of view, a preferable wall material of the microcapsule includes polyurea, polyurethane, polyester, polycarbonate, polyamide and a mixture thereof, and particularly polyurea and polyurethane are preferred. Further, a compound having a crosslinkable functional group, for example, an ethylenically unsaturated bond, capable of being introduced into the hydrophobic binder polymer described above may be introduced into the micro capsule wall.

An average particle size of the microcapsule is preferably from 0.01 to 3.0 μm, more preferably from 0.05 to 2.0 μm, and particularly preferably from 0.10 to 1.0 μm. In the above-described range, preferable resolution and good preservation stability can be achieved.

Other Constituting Components of Photosensitive Layer

Into the photosensitive layer according to the invention, various additives can further be incorporated, if desired. Such additives are described in detail below.

Surfactant

In the invention, it is preferred to use a surfactant in the photosensitive layer in order to progress the developing property and to improve the state of surface coated. The surfactant includes, for example, a nonionic surfactant, an anionic surfactant, a cationic surfactant, an amphoteric surfactant and a fluorine-based surfactant. The surfactants may be used individually or in combination of two or more thereof The nonionic surfactant used in the invention is not particular restricted, and nonionic surfactants hitherto known can be used. Examples of the nonionic surfactant include polyoxyethylene alkyl ethers, polyoxyethylene alkyl phenyl ethers, polyoxyethylene polystyryl phenyl ethers, polyoxyethylene polyoxypropylene alkyl ethers, glycerin fatty acid partial esters, sorbitan fatty acid partial esters, pentaerythritol fatty acid partial esters, propylene glycol monofatty acid esters, sucrose fatty acid partial esters, polyoxyethylene sorbitan fatty acid partial esters, polyoxyethylene sorbitol fatty acid partial esters, polyethylene glycol fatty acid esters, polyglycerol fatty acid partial esters, polyoxyethylenated castor oils, polyoxyethylene glycerol fatty acid partial esters, fatty acid diethanolamides, N,N-bis-2-hydroxyalkylamines, polyoxyethylene alkylamines, triethanolamine fatty acid esters, trialylamine oxides, polyethylene glycols, and copolymers of polyethylene glycol and polypropylene glycol.

The anionic surfactant used in the invention is not particularly restricted and anionic surfactants hitherto known can be used. Examples of the anionic surfactant include fatty acid salts, abietic acid salts, hydroxyalkanesulfonic acid salts, alkanesulfonic acid salts, dialkylsulfosuccinic ester salts, straight-chain alkylbenzenesulfonic acid salts, branched alkylbenzenesulfonic acid salts, alkylnaphthalenesulfonic acid salts, alkylphenoxypolyoxy ethylene propylsulfonic acid salts, polyoxyethylene alkylsulfophenyl ether salts, N-methyl-N-oleyltaurine sodium salt, N-alkylsulfosuccinic monoamide disodium salts, petroleum sulfonic acid salts, sulfated beef tallow oil, sulfate ester slats of fatty acid alkyl ester, alkyl sulfate ester salts, polyoxyethylene alkyl ether sulfate ester salts, fatty acid monoglyceride sulfate ester salts, polyoxyethylene alkyl phenyl ether sulfate ester salts, polyoxyethylene styrylphenyl ether sulfate ester salts, alkyl phosphate ester salts, polyoxyethylene alkyl ether phosphate ester salts, polyoxyethylene alkyl phenyl ether phosphate ester salts, partial saponification products of styrene/maleic anhydride copolymer, partial saponification products of olefin/maleic anhydride copolymer and naphthalene sulfonate formalin condensates.

The cationic surfactant used in the invention is not particularly restricted and cationic surfactants hitherto known can be used. Examples of the cationic surfactant include alkylamine salts, quaternary ammonium salts, polyoxyethylene alkyl amine salts and polyethylene polyamine derivatives.

The amphoteric surfactant used in the invention is not particularly restricted and amphoteric surfactants hitherto known can be used. Examples of the amphoteric surfactant include carboxybetaines, aminocarboxylic acids, sulfobetaines, aminosulfuric esters and imidazolines.

In the surfactants described above, the term "polyoxyethylene" can be replaced with "polyoxyalkylene", for example, polyoxymethylene, polyoxypropylene or polyoxybutylene, and such surfactants can also be used in the invention.

Further, a preferred surfactant includes a fluorine-based surfactant containing a perfluoroalkyl group in its molecule. Examples of the fluorine-based surfactant include an anionic type, for example, perfluoroalkyl carboxylates, perfluoroalkyl sulfonates or perfluoroalkylphosphates; an amphoteric type, for example, perfluoroalkyl betaines; a cationic type, for example, perfluoroalkyl trimethyl ammonium salts; and a nonionic type, for example, perfluoroalkyl amine oxides, perfluoroalkyl ethylene oxide adducts, oligomers having a perfluoroalkyl group and a hydrophilic group, oligomers having a perfluoroalkyl group and an oleophilic group, oligomers having a perfluoroalkyl group, a hydrophilic group and an oleophilic group or urethanes having a perfluoroalkyl group and an oleophilic group. Further, fluorine-based surfactants described in JP-A-62-170950, JP-A-62-226143 and JP-A-60-168144 are also preferably exemplified.

The surfactants may be used individually or in combination of two or more thereof A content of the surfactant is preferably from 0.001 to 10% by weight, more preferably from 0.01 to 7% by weight, based on the total solid content of the photosensitive layer.
Hydrophilic Polymer In the invention, a hydrophilic polymer may be incorporated into the photosensitive layer in order to improve the developing property and dispersion stability of microcapsule.

Preferable examples of the hydrophilic polymer include those having a hydrophilic group, for example, a hydroxy group, a carboxyl group, a carboxylate group, a hydroxyethyl group, a polyoxyethyl group, a hydroxypropyl group, a polyoxypropyl group, an amino group, an aminoethyl group, an aminopropyl group, an ammonium group, an amido group, a carboxymethyl group, a sulfonic acid group and a phosphoric acid group.

Specific examples of the hydrophilic polymer include gum arabic, casein, gelatin, a starch derivative, carboxymethyl cellulose or a sodium salt thereof, cellulose acetate, sodium alginate, a vinyl acetate-maleic acid copolymer, a styrene-maleic acid copolymer, polyacrylic acid or a salt thereof, polymethacrylic acid or a salt thereof, a homopolymer or copolymer of hydroxyethyl methacrylate, a homopolymer or copolymer of hydroxyethyl acrylate, a homopolymer or copolymer of hydroxypropyl methacrylate, a homopolymer or copolymer of hydroxypropyl acrylate, a homopolymer or copolymer of hydroxybutyl methacrylate, a homopolymer or copolymer of hydroxybutyl acrylate, polyethylene glycol, a hydroxypropylene polymer, polyvinyl alcohol, a hydrolyzed polyvinyl acetate having a hydrolysis degree of 60% by mole or more, preferably 80% by mole or more, polyvinyl formal, polyvinyl butyral, polyvinylpyrrolidone, a homopolymer or copolymer of acrylamide, a homopolymer or copolymer of methacrylamide, a homopolymer or copolymer of N-methylolacrylamide, polyvinylpyrrolidone, an alcohol-soluble nylon, and a polyether of 2,2-bis (4-hydroxyphenyl)propane with epichlorohydrin.

The hydrophilic polymer preferably has a weight average molecular weight of 5,000 or more, more preferably from 10,000 to 300,000. The hydrophilic polymer may be any of a random polymer, a block polymer, a graft polymer or the like.

The content of the hydrophilic polymer in the photosensitive layer is preferably 20% by weight or less, more preferably 10% by weight or less, based on the total solid content of the photosensitive layer.
Coloring Agent In the invention, a dye having large absorption in the visible light region can be used as a coloring agent for the image. Specific examples thereof include Oil Yellow #101, Oil Yellow #103, Oil Pink #312, Oil Green BG, Oil Blue BOS, Oil Blue #603, Oil Black BY, Oil Black BS, Oil Black T-505 (all produced by Orient Chemical Industry Co., Ltd.), Victoria Pure Blue, Crystal Violet (CI42555), Methyl Violet (CI42535), Ethyl Violet, Rhodamine B (CI45170B), Malachite Green (CI42000), Methylene Blue (CI52015), and dyes described in JP-A-62-293247.

It is preferable to add the coloring agent, because the image area and the non-image area after the image formation can be easily distinguished. The amount of the coloring agent added is preferably from 0.01 to 10% by weight based on the total solid content of the photosensitive layer.
Print-out Agent In the photosensitive layer according to the invention, a compound capable of undergoing discoloration by the effect of an acid or a radical can be added in order to form a print-out image. As such a compound, for example, various dyes, e.g., diphenylmethane-based, triphenylmethane-based, thiazine-based, oxazine-based, xanthene-based, anthraquinone-based, iminoquinone-based, azo-based and azomethine-based dyes are effectively used.

Specific examples thereof include dyes, for example, Brilliant Green, Ethyl Violet, Methyl Green, Crystal Violet, Basic Fuchsine, Methyl Violet 2B, Quinaldine Red, Rose Bengale, Metanil Yellow, Thymolsulfophthalein, Xylenol Blue, Methyl Orange, Paramethyl Red, Congo Red, Benzopurpurine 4B, α-Naphthyl Red, Nile Blue 2B, Nile Blue A, Methyl Violet, Malachite Green, Parafuchsine, Victoria Pure Blue BOH (produced by Hodogaya Chemical Co., Ltd.), Oil Blue #603 (produced by Orient Chemical Industry Co., Ltd.), Oil Pink #312 (produced by Orient Chemical Industry Co., Ltd.), Oil Red 5B (produced by Orient Chemical Industry Co., Ltd.), Oil Scarlet #308 (produced by Orient Chemical Industry Co., Ltd.), Oil Red OG (produced by Orient Chemical Industry Co., Ltd.), Oil Red RR (produced by Orient Chemical Industry Co., Ltd.), Oil Green #502 (produced by Orient Chemical Industry Co., Ltd.), Spiron Red BEH Special (produced by Hodogaya Chemical Co., Ltd.), m-Cresol Purple, Cresol Red, Rhodamine B, Rhodamine 6G, Sulforhodamine B, Auramine, 4-p-diethylaminophenyliminonaphthoquinone, 2-carboxyanilino-4-p-diethylaminophenyliminonaphthoquinone, 2-carboxystearyl-amino-4-p-N,N-bis(hydroxyethyl)aminophenyliminonaphthoquinone, 1-phenyl-3-methyl-4-p-diethylaminophenylimino-5-pyrazolone and 1-β-naphthyl-4-p-diethylaminophenylimino-5-pyrazolone, and leuco dyes, for example, p,p',p"-hexamethyltriaminotriphenyl methane (leuco Crystal Violet) and Pergascript Blue SRB (produced by Ciba Geigy).

Other preferable examples include leuco dyes known as a material for heat-sensitive paper or pressure-sensitive paper. Specific examples thereof include Crystal Violet Lactone, Malachite Green Lactone, Benzoyl Leuco Methylene Blue, 2-(N-phenyl-N-methylamino)-6-(N-p-tolyl-N-ethyl)aminofluorane, 2-anilino-3-methyl-6-(N-ethyl-p-toluidino)fluorane, 3,6-dimethoxyfluorane, 3-(N,N-diethylamino)-5-methyl-7-(N,N-dibenzylamino)fluorane, 3-(N-cyclohexyl-N-methylamino)-6-methyl-7-anilinofluorane, 3-(N,N-diethylamino)-6-methyl-7-anilinofluorane, 3-(N,N-diethylamino)-6-methyl-7-xylidinofluorane, 3-(N,N-diethylamino)-6-methyl-7-chlorofluorane, 3-(N,N-diethylamino)-6-methoxy-7-aminofluorane, 3-(N,N-diethylamino)-7-(4-chloroanilino)fluorane, 3-(N,N-diethylamino)-7-chlorofluorane, 3-(N,N-diethylamino)-7-benzylaminofluorane, 3-(N,N-diethylamino)-7,8-benzofluorane, 3-(N,N-dibutylamino)-6-methyl-7-anilinofluorane, 3-(N,N-dibutylamino)-6-methyl-7-xylidinofluorane, 3-piperidino-6-methyl-7-anilinofluorane, 3-pyrrolidino-6-methyl-7-anilinofluorane, 3,3-bis(1-ethyl-2-methylindol-3-yl)phthalide, 3,3-bis(1-n-butyl-2-methylindol-3-yl)phthalide, 3,3-bis(p-dimethylaminophenyl)-6-dimethylaminophthalide, 3-(4-diethylamino-2-ethoxyphenyl)-3-(1-ethyl-2-methylindol-3-yl)-4-phthalide and 3-(4-diethylaminophenyl)-3-(1-ethyl-2-methylindol-3-yl) phthalide.

The dye capable of undergoing discoloration by the effect of an acid or a radical is preferably added in an amount of 0.01 to 15% by weight based on the total solid content of the photosensitive layer.

Polymerization Inhibitor

In the photosensitive layer according to the invention, a small amount of a thermal polymerization inhibitor is preferably added in order to prevent the radical polymerizable compound from undergoing undesirable thermal polymerization during the preparation or preservation of the photosensitive layer.

Preferable examples of the thermal polymerization inhibitor include hydroquinone, p-methoxyphenol, di-tert-butyl-p-cresol, pyrogallol, tert-butyl catechol, benzoquinone, 4,4'-thiobis(3-methyl-6-tert-butylphenol), 2,2'-methylenebis(4-methyl-6-tert-butylphenol) and N-nitroso-N-phenylhydroxylamine aluminum salt.

The amount of the thermal polymerization inhibitor added is preferably from about 0.01 to about 5% by weight based on the total solid content of the photosensitive layer.

Higher Fatty Acid Derivative

In the photosensitive layer according to the invention, for example, a higher fatty acid derivative, e.g., behenic acid or behenic acid amide may be added and localized on the surface of the photosensitive layer during the process of drying after coating in order to avoid polymerization inhibition due to oxygen. The amount of the higher fatty acid derivative added is preferably from about 0.1 to about 10% by weight based on the total solid content of the photosensitive layer.

Plasticizer

The photosensitive layer according to the invention may contain a plasticizer. Preferable examples of the plasticizer include a phthalic acid ester, for example, dimethyl phthalate, diethyl phthalate, dibutyl phthalate, diisobutyl phthalate, diocyl phthalate, octyl capryl phthalate, dicyclohexyl phthalate, ditridecyl phthalate, butyl benzyl phthalate, diisodecyl phthalate or diallyl phthalate; a glycol ester, for example, dimethyl glycol phthalate, ethyl phthalylethyl glycolate, methyl phthalylethyl glycolate, butyl phthalylbutyl glycolate or triethylene glycol dicaprylic acid ester; a phosphoric acid ester, for example, tricresyl phosphate or triphenyl phosphate; an aliphatic dibasic acid ester, for example, diisobutyl adipate, dioctyl adipate, dimethyl sebacate, dibutyl sebacate, dioctyl azelate or dibutyl maleate; polyglycidyl methacrylate, triethyl citrate, glycerin triacetyl ester and butyl laurate. The content of the plasticizer is preferably about 30% by weight or less based on the total solid content of the photosensitive layer.

Fine Inorganic Particle

The photosensitive layer according to the invention may contain fine inorganic particle in order to increase strength of the hardened layer in the image area. The fine inorganic particle preferably includes, for example, silica, alumina, magnesium oxide, titanium oxide, magnesium carbonate, calcium alginate and a mixture thereof Even if the fine inorganic particle has no light to heat converting property, it can be used, for example, for strengthening the layer or enhancing interface adhesion property due to surface roughening. The fine inorganic particle preferably has an average particle size from 5 nm to 10 µm and more preferably from 0.5 to 3 µm. In the above-described range, it is stably dispersed in the photosensitive layer, sufficiently maintains the film strength of the photosensitive layer and can form the non-image area excellent in hydrophilicity and preventing from stain at the printing.

The fine inorganic particle described above is easily available as a commercial product, for example, colloidal silica dispersion.

The content of the fine inorganic particle is preferably 20% by weight or less, and more preferably 10% by weight or less based on the total solid content of the photosensitive layer.

Hydrophilic Low Molecular Weight Compound

The photosensitive layer according to the invention may contain a hydrophilic low molecular weight compound in order to improve the developing property. The hydrophilic low molecular weight compound includes a water-soluble organic compound, for example, a glycol compound, e.g., ethylene glycol, diethylene glycol, triethylene glycol, propylene glycol, dipropylene glycol or tripropylene glycol, or an ether or ester derivative thereof, a polyhydroxy compound, e.g., glycerine or pentaerythritol, an organic amine, e.g., triethanol amine, diethanol amine or monoethanol amine, or a salt thereof, an organic sulfonic acid, e.g., toluene sulfonic acid or benzene sulfonic acid, or a salt thereof, an organic phosphonic acid, e.g., phenyl phosphonic acid, or a salt thereof, an organic carboxylic acid, e.g., tartaric acid, oxalic acid, citric acid, maleic acid, lactic acid, gluconic acid or an amino acid, or a salt thereof, and an organic quaternary ammonium salt, e.g., tetraethyl ammonium hydrochloride.

Into the photosensitive layer according to the invention, in addition to the components described above, for example, a co-sensitizer may be incorporated.

Formation of Photosensitive Layer

The photosensitive layer according to the invention is formed by dispersing or dissolving each of the necessary constituting components described above to prepare a coating solution for the photopolymerizable composition and coating the solution. The solvent used include, for example, ethylene dichloride, cyclohexanone, methyl ethyl ketone, methanol, ethanol, propanol, ethylene glycol monomethyl ether, 1-methoxy-2-propanol, 2-methxyethyl acetate, 1-methoxy-2-propyl acetate, dimethoxyethane, methyl lactate, ethyl lactate, N,N-dimethylacetamide, N,N-dimethylformamide, tetramethylurea, N-methylpyrrolidone, dimethylsulfoxide, sulfolane, γ-butyrolactone, toluene and water, but the invention should not be construed as being limited thereto. The solvents may be used individually or as a mixture. The solid concentration of the coating solution is preferably from 1 to 50% byweight.

The photosensitive layer according to the invention may also be formed by preparing plural coating solutions by dispersing or dissolving the same or different components described above into the same or different solvents and conducting repeatedly plural coating and drying.

The coating amount (solid content) of the photosensitive layer on the support after the coating and drying may be varied depending on the use, but ordinarily, it is preferably from 0.3 to 3.0 g/m². In the above-described range, the preferable sensitivity and good film property of the photosensitive layer can be obtained.

Various methods can be used for the coating. Examples of the method include bar coater coating, spin coating, spray coating, curtain coating, dip coating, air knife coating, blade coating and roll coating.

Protective Layer

In the lithographic printing plate precursor according to the invention, a protective layer (oxygen-blocking layer) is preferably provided on the photosensitive layer in order to prevent diffusion and penetration of oxygen which inhibits the polymerization reaction at the time of exposure. The protective layer for use in the invention preferably has oxygen permeability (A) at 25° C. under one atmosphere of $1.0 \leqq (A) \leqq 20$ (ml/m²·day). When the oxygen permeability (A) is extremely lower than 1.0 (ml/m²·day), problems may occur in that an undesirable polymerization reaction arises during the production or preservation before image exposure and in that undesirable fog or spread of image line occurs at the image exposure. On the contrary, when the oxygen permeability (A) greatly exceeds 20 (ml/m²·day), decrease in sensitivity may be incurred. The oxygen permeability (A) is more preferably in a range of $1.5 \leqq (A) \leqq 12$ (ml/m²·day), and still more preferably in a range of $2.0 \leqq (A) \leqq 10.0$ (ml/m²·day). Besides the above described oxygen permeability, as for the characteristics required of the protective layer, it is desired that the protective layer does not substantially hinder the transmission of light for the exposure, is excellent in adhesion to the photosensitive layer, and can be easily removed during a development step after the exposure. Contrivances on the protective layer have been heretofore made and described in detail in U.S. Pat. No. 3,458,311 and JP-B-55-49729.

As the material of the protective layer, a water-soluble polymer compound relatively excellent in crystallizability is preferably used. Specifically, a water-soluble polymer, for example, polyvinyl alcohol, vinyl alcohol/vinyl phthalate copolymer, vinyl acetate/vinyl alcohol/vinyl phthalate copolymer, vinyl acetate/crotonic acid copolymer, polyvinyl pyrrolidone, acidic cellulose, gelatin, gum arabic, polyacrylic acid or polyacrylamide is enumerated. The water-soluble polymer compounds may be used individually or as a mixture. Of the compounds, when polyvinyl alcohol is used as a main component, the best results can be obtained in the fundamental characteristics, for example, oxygen-blocking property and removability of the protective layer by development.

Polyvinyl alcohol for use in the protective layer may be partially substituted with ester, ether or acetal as long as it contains unsubstituted vinyl alcohol units for achieving the necessary oxygen-blocking property and water solubility. Also, a part of polyvinyl alcohol may have other copolymer component. As specific examples of polyvinyl alcohol, those having a hydrolyzing rate of 71 to 100% and a polymerization repeating unit number of 300 to 2,400 are exemplified. Specific examples thereof include PVA-105, PVA-110, PVA-117, PVA-117H, PVA-120, PVA-124, PVA-124H, PVA-CS, PVA-CST, PVA-HC, PVA-203, PVA-204, PVA-205, PVA-210, PVA-217, PVA-220, PVA-224, PVA-217EE, PVA-217E, PVA-220E, PVA-224E, PVA-405, PVA-420, PVA-613 and L-8 (produced by Kuraray Co., Ltd.). They can be used individually or as a mixture. According to a preferred embodiment, the content of polyvinyl alcohol in the protective layer is from 20 to 95% by weight, more preferably from 30 to 90% by weight.

Also, known modified polyvinyl alcohol can be preferably used. For instance, polyvinyl alcohols of various polymerization degrees having at random a various kind of hydrophilic modified cites, for example, an anion-modified cite modified with an anion, e.g., a carboxyl group or a sulfo group, a cation-modified cite modified with a cation, e.g., an amino group or an ammonium group, a silanol-modified cite or a thiol-modified cite, and polyvinyl alcohols of various polymerization degrees having at the terminal of the polymer a various kind of modified cites, for example, the above-described anion-modified cite, cation modified cite, silanol-modified cite or thiol-modified cite, an alkoxy-modified cite, a sulfide-modified cite, an ester modified cite of vinyl alcohol with a various kind of organic acids, an ester modified cite of the above-described anion-modified cite with an alcohol or an epoxy-modified cite are exemplified.

As a component used as a mixture with polyvinyl alcohol, polyvinyl pyrrolidone or a modified product thereof is preferable from the viewpoint of the oxygen-blocking property and removability by development. The content thereof is ordinarily from 3.5 to 80% by weight, preferably from 10 to 60% by weight, and more preferably from 15 to 30% by weight, in the protective layer.

The components of the protective layer (selection of PVA and use of additives) and the coating amount are determined taking into consideration fogging property, adhesion property and scratch resistance besides the oxygen-blocking property and removability by development. In general, the higher the hydrolyzing rate of the PVA used (the higher the unsubstituted vinyl alcohol unit content in the protective layer) and the larger the layer thickness, the higher is the oxygen-blocking property, thus it is advantageous in the point of sensitivity. The molecular weight of the (co)polymer, for example, polyvinyl alcohol (PVA) is ordinarily from 2,000 to 10,000,000, and preferably from 20,000 to 3,000,000.

As other additive of the protective layer, glycerin, dipropylene glycol or the like can be added in an amount corresponding to several % by weight of the (co)polymer to provide flexibility. Further, an anionic surfactant, for example, sodium alkylsulfate or sodium alkylsulfonate; an amphoteric surfactant, for example, alkylaminocarboxylate and alkylaminodicarboxylate; or a nonionic surfactant, for example, polyoxyethylene alkyl phenyl ether can be added in an amount corresponding to several % by weight of the (co)polymer.

The adhesion property of the protective layer to the photosensitive layer and scratch resistance are also extremely important in view of handling of the printing plate precursor. Specifically, when a hydrophilic layer comprising a water-soluble polymer is laminated on a oleophilic photosensitive layer, layer peeling due to insufficient adhesion is liable to occur, and the peeled portion causes such a defect as failure in hardening of the photosensitive layer due to polymerization inhibition by oxygen. Various proposals have been made for improving the adhesion between the photosensitive layer and the protective layer. For example, it is described in U.S. patent application Ser. Nos. 292,501 and 44,563 that a sufficient adhesion property can be obtained by mixing from 20 to 60% by weight of an acryl-based emulsion or a water-insoluble vinyl pyrrolidone/vinyl acetate copolymer with a hydrophilic polymer mainly comprising polyvinyl alcohol and laminating the resulting mixture on the photosensitive layer. Any of these known techniques can be applied to the protective layer according to the invention. Coating methods of the protective layer are described in detail, for example, in U.S. Pat. No. 3,458,311 and JP-B-55-49729.

Further, it is also preferred to incorporate an inorganic stratiform compound into the protective layer of the lithographic printing plate precursor according to the invention for the purpose of improving the oxygen-blocking property and property for protecting the surface of photosensitive layer.

The inorganic stratiform compound used here is a particle having a thin tabular shape and includes, for instance, mica, for example, natural mica represented by the following formula: $A(B, C)_{2-5} D_4 D_{10} (OH, F, O)_2$, (wherein A represents any one of K, Na and Ca, B and C each represents any one of Fe (II), Fe(III), Mn, Al, Mg and V, and D represents Si or Al) or synthetic mica; talc represented by the following formula: $3MgO.4SiO.H_2O$; teniolite; montmorillonite; saponite; hectolite; and zirconium phosphate.

Of the micas, examples of the natural mica include muscovite, paragonite, phlogopite, biotite and lepidolite. Examples of the synthetic mica include non-swellable mica, for example, fluorphlogopite $KMg_3(AlSi_3O_{10})F_2$ or potassium tetrasilic mica $KMg_{2.5}(Si_4O_{10})F_2$, and swellable mica, for example, Na tetrasilic mica $NaMg_{2.5}(Si_4O_{10})F_2$, Na or Li teniolite $(Na, Li)Mg_2Li(Si_4O_{10})F_2$, or montmorillonite based Na or Li hectolite $(Na, Li)_{1/8}Mg_{2/5}Li_{1/8}(Si_4O_{10})F_2$. Synthetic smectite is also useful.

Of the inorganic stratiform compounds, fluorine based swellable mica, which is a synthetic inorganic stratiform compound, is particularly useful in the invention. Specifically, the swellable synthetic mica and an swellable clay mineral, for example, montmorillonite, saponite, hectolite or bentonite have a stratiform structure comprising a unit crystal lattice layer having thickness of approximately 10 to 15 angstroms, and metallic atom substitution in the lattices thereof is remarkably large in comparison with other clay minerals. As a result, the lattice layer results in lack of positive charge and to compensate it, a cation, for example, $Na^+$, $Ca^{2+}$ or $Mg^{2+}$, is adsorbed between the lattice layers. The cation existing between the lattice layers is referred to as an exchangeable cation and is exchangeable with various cations. In particular, in the case where the cation between the lattice layers is $Li+$ or $Na^+$, because of a small ionic radius, a bond between the stratiform crystal lattices is week, and the inorganic stratiform compound greatly swells upon contact with water. When share is applied under such condition, the stratiform crystal lattices are easily cleaved to form a stable sol in water. The bentnite and sweflable synthetic mica have strongly such tendency and are useful in the invention. Particularly, the swellable synthetic mica is preferably used.

With respect to the shape of the inorganic stratiform compound used in the invention, the thinner the thickness or the larger the plain size as long as smoothness of coated surface and transmission of actinic radiation are not damaged, the better from the standpoint of control of diffusion. Therefore, an aspect ratio of the inorganic stratiform compound is ordinarily 20 or more, preferably 100 or more, and particularly preferably 200 or more. The aspect ratio is a ratio of thickness to major axis of particle and can be determined, for example, from a projection drawing of particle by a microphotography. The larger the aspect ratio, the greater the effect obtained.

As for the particle size of the inorganic stratiform compound used in the invention, an average major axis is ordinarily from 0.3 to 20 μm, preferably from 0.5 to 10 μm, and particularly preferably from 1 to 5 μm. An average thickness of the particle is ordinarily 0.1 μm or less, preferably 0.05 μm or less, and particularly preferably 0.01 μm or less. For example, in the swellable synthetic mica that is the representative compound of the inorganic stratiform compounds, thickness is approximately from 1 to 50 nm and plain size is approximately from 1 to 20 μm.

When such an inorganic stratiform compound particle having a large aspect ratio is incorporated into the protective layer, strength of coated layer increases and penetration of oxygen or moisture can be effectively inhibited so that the protective layer can be prevented from deterioration due to deformation, and even when the lithographic printing plate precursor is preserved for a long period of time under a high humidity condition, it is prevented from decrease in the image-forming property thereof due to the change of humidity and exhibits excellent preservation stability.

The content of the inorganic stratiform compound in the protective layer is preferably from 5/1 to 1/00 in terms of weight ratio to the amount of binder used in the protective layer. When a plurality of inorganic stratiform compounds is used in combination, it is also preferred that the total amount of the inorganic stratiform compounds fulfills the above-described weight ratio.

An example of common dispersing method for the inorganic stratiform compound used in the protective layer is described below. Specifically, from 5 to 10 parts by weight of a swellable stratiform compound that is exemplified as a preferred inorganic stratiform compound is added to 100 parts by weight of water to adapt the compound to water and to be swollen, followed by dispersing using a dispersing machine. The dispersing machine used include, for example, a variety of mills conducting dispersion by directly applying mechanical power, a high-speed agitation type dispersing machine providing a large shear force and a dispersion machine providing ultrasonic energy of high intensity. Specific examples thereof include a ball mill, a sand a grinder mill, a visco mill, a colloid mill, a homogenizer, a dissolver, a polytron, a homomixer, a homoblender, a keddy mill, a jet agitor, a capillary type emulsifying device, a liquid siren, an electromagnetic strain type ultrasonic generator and an emulsifying device having a Polman whistle. A dispersion containing from 5 to 10% by weight of the inorganic stratiform compound thus prepared is highly viscous or gelled and exhibits extremely good preservation stability. In the formation of a coating solution for protective layer using the dispersion, it is preferred that the dispersion is diluted with water, sufficiently stirred and then mixed with a binder solution.

To the coating solution for protective layer can be added known additives, for example, a surfactant for improving coating property or a water-soluble plasticizer for improving physical property of coated layer in addition to the inorganic stratiform compound. Examples of the water-soluble plasticizer include propionamide, cyclohexanediol, glycerin or sorbitol. Also, a water-soluble (meth)acrylic polymer can be added. Further, to the coating solution may be added known additives for increasing adhesion to the photosensitive layer or for improving preservation stability of the coating solution.

The coating solution for protective layer thus-prepared is coated on the photosensitive layer provided on the support and then dried to form a protective layer. The coating solvent may be appropriately selected in view of the binder used, and when a water-soluble polymer is used, distilled water or purified water is preferably used as the solvent. A coating method of the protective layer is not particularly limited, and known methods, for example, methods described in U.S. Pat. No. 3,458,311 and JP-B-55-49729 can be utilized. Specific examples of the coating method for the protective layer include a blade coating method, an air knife coating method, a gravure coating method, a roll coating method, a spray coating method, a dip coating method and a bar coating method.

A coating amount of the protective layer is preferably in a range from 0.05 to 10 μm$^2$ in terms of the coating amount after drying. When the protective layer contains the inorganic stratiform compound, it is more preferably in a range from 0.1 to 0.5 g/m$^2$, and when the protective layer does not contain the inorganic stratiform compound, it is more preferably in a range from 0.5 to 5 g/m$^2$.

Undercoat Layer

In the lithographic printing plate precursor according to the invention, an undercoat layer comprising a compound having a polymerizable group is preferably provided on the support. When the undercoat layer is used, the photosensitive layer is provided on the undercoat layer. The undercoat layer has the effects of strengthening an adhesion property between the support and the photosensitive layer in the exposed area and facilitating separation of the photosensitive layer from the support in the unexposed area, so that the developing property can be improved.

Specific preferable examples of the undercoat layer include a silane coupling agent having an addition-polymerizable ethylenic double bond reactive group described in JP-A-10-282679, and a phosphorus compound having an ethylenic double bond reactive group described in JP-A-2-304441. A particularly preferable compound is a compound having both a polymerizable group, for example, a methacryl group or an allyl group and a support-adsorbing group, for example, a sulfonic acid group, a phosphoric acid group or a phosphoric acid ester group. A compound having a hydrophilicity-imparting group, for example, an ethylene oxide group, in addition to the polymerizable group and the support-adsorbing group is also exemplified as a preferable compound.

A coating amount (solid content) of the undercoat layer is preferably from 0.1 to 100 mg/m$^2$, more preferably from 1 to 30 mg/m$^2$.

Backcoat Layer

After applying the surface treatment to the support or forming the undercoat layer on the support, a backcoat layer can be provided on the back surface of the support, if desired.

The back coat layer preferably includes, for example, a coating layer comprising an organic polymer compound described in JP-A-5-45885, and a coating layer comprising a metal oxide obtained by hydrolysis and polycondensation of an organic metal compound or an inorganic metal compound described in JP-A-6-35174. Among them, use of an alkoxy compound of silicon, for example, $Si(OCH_3)_4$, $Si(OC_2H_5)_4$, $Si(OC_3H_7)_4$ or $Si(OC_4H_9)_4$ is preferred since the starting material thereof is inexpensive and easily available.

Plate-making Method

Now, a plate-making method of the lithographic printing plate precursor described above (plate-making method according to the invention) is described below.

According to a preferable embodiment, the lithographic printing plate precursor according to the invention is exposed imagewise by a light source of 360 to 450 nm, and then rubbed a surface of the exposed lithographic printing plate precursor with a rubbing member in the presence of a developer having pH of 2 to 10 in an automatic processor to remove the protective layer and the unexposed area of the photosensitive layer all at once, whereby an image can be formed on the surface of aluminum plate support.

Specifically, after removing the protective layer and the unexposed area of the photosensitive layer all at once, the resulting printing plate is immediately mounted on a printing machine to conduct printing.

The processing by the automatic processor in such a manner is advantageous in view of being free from the measures against development scum resulting from the protective layer and photosensitive layer encountered in case of on-machine development.

Exposure

The lithographic printing plate precursor according to the invention is exposed through a transparent original having a line image, a halftone dot image or the like, or imagewise exposed, for example, by scanning of laser beam based on digital data.

The exposure mechanism may be any of an internal drum system, an external drum system and a flat bed system.

Other examples of the exposure light source which can be used in the invention include an ultra-high pressure mercury lamp, a high pressure mercury lamp, a medium pressure mercury lamp, a low pressure mercury lamp, a chemical lamp, a carbon arc lamp, a xenon lamp, a metal halide lamp, various visible or ultraviolet laser lamps, a fluorescent lamp, a tungsten lamp and sunlight.

The exposure apparatus for use in the invention includes an exposure apparatus equipped with a light source having an emission maximum in a range of 360 to 450 nm, and particularly, a laser of 405 nm commercially available, for example, from Nichia Corp. is preferably employed.

As for the exposure apparatus for the lithographic printing plate precursor of scanning exposure system, the exposure mechanism includes an internal drum system, an external drum system and a flat bed system. As the light source, among the light sources described above, those capable of conducting continuous oscillation can be preferably utilized. In practice, the exposure apparatuses described below are particularly preferable in view of the relationship between the sensitivity of photosensitive material and the time for plate-making.

A single beam to triple beam exposure apparatus of internal drum system, using one or more gas or solid laser light sources so as to provide a semiconductor laser having a total output of 20 mW or more A multi-beam (from 1 to 10 beams) exposure apparatus of flat bed system, using one or more semiconductor, gas or solid lasers so as to provide a total output of 20 mW or more A multi-beam (from 1 to 9 beams) exposure apparatus of external drum system, using one or more semiconductor, gas or solid lasers so as to provide a total output of 20 mW or more A multi-beam (10 or more beams) exposure apparatus of external drum system, using one or more semiconductor or solid lasers so as to provide a total output of 20 mW or more In the laser direct drawing-type lithographic printing plate precursor, the following equation (eq 1) is ordinarily established among the sensitivity X (J/cm$^2$) of photosensitive material, the exposure area S (cm$^2$) of photosensitive material, the power q (W) of one laser light source, the number n of lasers and the total exposure time t (s):

$$X \cdot S = n \cdot q \cdot t \quad (eq\ 1)$$

i) In the case of the internal drum (single beam) system

The following equation (eq 2) is ordinarily established among the laser revolution number f (radian/s), the sub-scanning length Lx (cm) of photosensitive material, the resolution Z (dot/cm) and the total exposure time t (s):

$$f \cdot Z \cdot t = Lx \quad (eq\ 2)$$

ii) In the case of the external drum (multi-beam) system

The following equation (eq 3) is ordinarily established among the drum revolution number F (radian/s), the sub-scanning length Lx (cm) of photosensitive material, the resolution Z (dot/cm), the total exposure time t (s) and the number (n) of beams:

$$F \cdot Z \cdot n \cdot t = Lx \quad (eq\ 3)$$

iii) In the case of the flat bed (multi-beam) system

The following equation (eq 4) is ordinarily established among the revolution number H (radian/s) of polygon mirror, the sub-scanning length Lx (cm) of photosensitive material, the resolution Z (dot/cm), the total exposure time t (s) and the number (n) of beams:

$$H \cdot Z \cdot n \cdot t = Lx \quad (eq\ 4)$$

When the resolution (2,560 dpi) required for a practical printing plate, the plate size (A1/B1, sub-scanning length: 42 inch), the exposure condition of about 20 sheets/hour and the photosensitive characteristics (photosensitive wavelength, sensitivity: about 0.1 mJ/cm$^2$) of the lithographic printing plate precursor according to the invention are substituted for the above equations, it can be understood that the lithographic printing plate precursor according to the invention is preferably combined with a multi-beam exposure system using a laser having a total output of 20 mW or more, and on taking account of operability, cost and the like, most preferably combined with an external drum system semiconductor laser multi-beam (10 or more beams) exposure apparatus.

Development

After the imagewise exposure of the lithographic printing plate precursor according to the invention, the surface of the exposed lithographic printing plate precursor is rubbed with a rubbing member in the presence of a developer having pH of 2 to 10 to remove the photosensitive layer thereof in the unexposed area (also a protective layer, when the protective layer is provided) so that the image can be formed on the surface of aluminum plate support.

The developer for use in the invention is an aqueous solution having pH of 2 to 10. For instance, the developer is preferably water alone or an aqueous solution containing water as a main component (containing 60% by weight or more of water). Particularly, an aqueous solution having the same composition as conventionally known dampening water, an aqueous solution containing a surfactant (for example, an anionic, nonionic or cationic surfactant) and an aqueous solution containing a water-soluble polymer compound are preferable. An aqueous solution containing both a surfactant and a water-soluble polymer compound is especially preferable. The pH of the developer is preferably from 3 to 8, and more preferably from 4 to 7.

The anionic surfactant for use in the developer according to the invention includes, for example, fatty acid salts, abietic acid salts, hydroxyalkanesulfonic acid salts, alkanesulfonic acid salts, dialkylsulfosuccinic acid salts, straight-chain alkylbenzenesulfonic acid salts, branched alkylbenzenesulfonic acid salts, alkylnaphthalenesulfonic acid salts, alkylphenoxypolyoxy ethylene propylsulfonic acid salts, polyoxyethylene alkylsulfophenyl ether salts, N-methyl-N-oleyltaurine sodium salt, N-alkylsulfosuccinic acid monoamide disodium salts, petroleum sulfonic acid salts, sulfated castor oil, sulfated beef tallow oil, sulfate ester slats of fatty acid alkyl ester, alkyl sulfate ester salts, polyoxyethylene alkyl ether sulfate ester salts, fatty acid monoglyceride sulfate ester salts, polyoxyethylene alkyl phenyl ether sulfate ester salts, polyoxyethylene styryl phenyl ether sulfate ester salts, alkyl phosphate ester salts, polyoxyethylene alkyl ether phosphate ester salts, polyoxyethylene alkyl phenyl ether phosphate ester salts, partially saponified products of styrene-maleic anhydride copolymer, partially saponified products of olefin-maleic anhydride copolymer and naphthalene sulfonate formalin condensates. Of the compounds, dialkylsulfosuccinic acid salts, alkyl sulfate ester salts and alkylnaphthalenesulfonic acid salts are particularly preferably used.

The cationic surfactant for use in the developer according to the invention is not particularly limited and conventionally known cationic surfactants can be used. Examples of the cationic surfactant include alkylamine salts, quaternary ammonium salts, polyoxyethylene alkyl amine salts and polyethylene polyamine derivatives.

The nonionic surfactant for use in the developer according to the invention includes, for example, polyethylene glycol type higher alcohol ethylene oxide addacts, alkylphenol ethylene oxide addacts, fatty acid ethylene oxide addacts, polyhydric alcohol fatty acid ester ethylene oxide addacts, higher alkylamine ethylene oxide addacts, fatty acid amide ethylene oxide addacts, ethylene oxide addacts of fat, polypropylene glycol ethylene oxide addacts, dimethylsiloxane-ethylene oxide block copolymers, dimethylsiloxane-(propylene oxide-ethylene oxide) block copolymers, fatty acid esters of polyhydric alcohol type glycerol, fatty acid esters of pentaerythritol, fatty acid esters of sorbitol and sorbitan, fatty acid esters of sucrose, alkyl ethers of polyhydric alcohols and fatty acid amides of alkanolamines.

The nonionic surfactants may be used individually or as a mixture of two or more thereof In the invention, ethylene oxide addacts of sorbitol and/or sorbitan fatty acid esters, polypropylene glycol ethylene oxide addacts, dimethylsiloxane-ethylene oxide block copolymers, dimethylsiloxane-(propylene oxide-ethylene oxide) block copolymers and fatty acid esters of polyhydric alcohols are more preferable.

Further, from the standpoint of stable solubility in water or opacity, with respect to the nonionic surfactant used in the developer according to the invention, the HLB (hydrophile-lipophile balance) value thereof is preferably 6 or more, and more preferably 8 or more. Moreover, an amount of the nonionic surfactant contained in the developer is preferably from 0.01 to 10% byweight, and more preferably from 0.01 to 5% by weight.

Furthermore, an oxyethylene adduct of acetylene glycol type or acetylene alcohol type or a surfactant, for example, a fluorine-based surfactant or a silicon-based surfactant can also be used.

Of the surfactants used in the developer according to the invention, the nonionic surfactant is particularly preferred in view of foam depressing property.

The water-soluble polymer compound for use in the developer according to the invention includes, for example, soybean polysaccharide, modified starch, gum arabic, dextrin, a cellulose derivative (for example, carboxymethyl cellulose, carboxyethyl cellulose or methyl cellulose) or a modified product thereof, pllulan, polyvinyl alcohol or a derivative thereof, polyvinyl pyrrolidone, polyacrylamide, an acrylamide copolymer, a vinyl methyl ether/maleic anhydride copolymer, a vinyl acetate/maleic anhydride copolymer and a styrene/maleic anhydride copolymer.

As the soybean polysaccharide, those known can be used. For example, as a commercial product, Soyafive (trade name, produced by Fuji Oil Co., Ltd.) is available and various grade products can be used. The soybean polysaccharide preferably used has viscosity in a range from 10 to 100 mPa/sec in a 10% by weight aqueous solution thereof As the modified starch, known modified starch can be used. The modified starch can be prepared, for example, by a method wherein starch, for example, of corn, potato, tapioca, rice or wheat is decomposed, for example, with an acid or an enzyme to an extent that the number of glucose residue per molecule is from 5 to 30 and then oxypropylene is added thereto in an alkali.

Two or more of the water-soluble polymer compounds may be used in combination. The content of the water-soluble polymer compound is preferably from 0.1 to 20% by weight, and more preferably from 0.5 to 10% by weight, in the developer.

The developer for use in the invention may contain an organic solvent. The organic solvent that can be contained in the developer include, for example, an aliphatic hydrocarbon (e.g., hexane, heptane, Isopar E, Isopar H, Isopar G (produced by Esso Chemical Co., Ltd.), gasoline or kerosene), an aromatic hydrocarbon (e.g., toluene or xylene), a halogenated hydrocarbon (methylene dichloride, ethylene dichloride, trichlene or nomochlorobenzene) and a polar solvent.

Examples of the polar solvent include an alcohol (e.g., methanol, ethanol, propanol, isopropanol, benzyl alcohol, ethylene glycol monomethyl ether, 2-ethyoxyethanol, diethylene glycol monoethyl ether, diethylene glycol monohexyl ether, triethylene glycol monomethyl ether, propylene glycol monoethyl ether, dipropylene glycol monomethyl ether, polyethylene glycol monomethyl ether, polypropylene glycol, tetraethylene glycol, ethylene glycol monobutyl ether, ethylene glycol monobenzyl ether, ethylene glycol monophenyl ether, methyl phenyl carbinol, n-amyl alcohol or methylamyl alcohol), a ketone (e.g., acetone, methyl ethyl ketone, ethyl butyl ketone, methyl isobutyl ketone or cyclohexanone), an ester (e.g., ethyl acetate, propyl acetate, butyl acetate, amyl acetate, benzyl acetate, methyl lactate, butyl lactate, ethylene glycol monobutyl acetate, polyethylene glycol monomethyl ether acetate, diethylene glycol acetate, diethyl phthalate or butyl levulinate) and others (e.g., triethyl phosphate, tricresyl phosphate, N-phenylethanolamine or N-phenyldiethanolamine).

Further, when the organic solvent is insoluble in water, it may be employed by being solubilized in water using a surfactant or the like. In the case where the developer contains the organic solvent, the concentration of the organic solvent is desirably less than 40% by weight in view of safety and inflammability.

Into the developer for use in the invention, an antiseptic agent, a chelating agent, a defoaming agent, an organic acid, an inorganic acid, an inorganic salt or the like can be incorporated in addition to the above components.

As the antiseptic agent, for example, phenol or a derivative thereof, formalin, an imidazole derivative, sodium dehydroacetate, a 4-isothiazolin-3-one derivative, benzisotiazolin-3-one, a benzotriazole derivative, an amidine guanidine derivative, a quaternary ammonium salt, a pyridine derivative, a quinoline derivative, a guanidine derivative, diazine, a triazole derivative, oxazole, an oxazine derivative and a nitro bromo alcohol, e.g., 2-bromo-2-nitropropane-1,3-diol, 1,1-dibromo-1-nitro-2-ethanol or 1,1-dibromo-1-nitro-2-propanol are preferably used.

As the chelating agent, for example, ethylenediaminetetraacetic acid, potassium salt thereof, sodium salt thereof; diethylenetriaminepentaacetic acid, potassium salt thereof, sodium salt thereof; triethylenetetraminehexaacetic acid, potassium salt thereof, sodium salt thereof; hydroxyethylethylenediaminetriacetic acid, potassium salt thereof, sodium salt thereof; nitrilotriacetic acid, sodium salt thereof; organic phosphonic acids, for example, 1-hydroxyethane-1,1-diphosphonic acid, potassium salt thereof, sodium salt thereof; aminotri(methylenephosphonic acid), potassium salt thereof, sodium salt thereof; and phophonoalkanetricarboxylic acids are illustrated. A salt of an organic amine is also effectively used in place of the sodium salt or potassium salt in the chelating agents.

As the defoaming agent, for example, a conventional silicone-based self-emulsifying type or emulsifying type defoaming agent, and a nonionic surfactant having HLB of 5 or less are used. The silicone defoaming agent is preferably used. Any of emulsifying dispersing type and solubilizing type can be used.

As the organic acid, for example, citric acid, acetic acid, oxalic acid, malonic acid, salicylic acid, caprylic acid, tartaric acid, malic acid, lactic acid, levulinic acid, p-toluenesulfonic acid, xylenesulfonic acid, phytic acid and an organic phosphonic acid are illustrated. The organic acid can also be used in the form of an alkali metal salt or an ammonium salt.

As the inorganic acid and inorganic salt, for example, phosphoric acid, methaphosphoric acid, ammonium primary phosphate, ammonium secondary phosphate, sodium primary phosphate, sodium secondary phosphate, potassium primary phosphate, potassium secondary phosphate, sodium tripolyphosphate, potassium pyrophosphate, sodium hexamethaphosphate, magnesium nitrate, sodium nitrate, potassium nitrate, ammonium nitrate, sodium sulfate, potassium sulfate, ammonium sulfate, sodium sulfite, ammonium sulfite, sodium hydrogen sulfate and nickel sulfate are illustrated.

The developer described above can be used as a developer and a development replenisher for an exposed negative-working lithographic printing plate precursor, and it is preferably applied to an automatic processor described hereinafter. In the case of conducting the development processing using an automatic processor, the developer becomes fatigued in accordance with the processing amount, and hence the processing ability may be restored using a replenisher or a fresh developer. Such a replenishment system can be preferably applied to the plate-making method of the lithographic printing plate precursor according to the invention.

The development processing using the aqueous solution having pH of 2 to 10 according to the invention is preferably performed by an automatic processor equipped with a supplying means for a developer and a rubbing member. As the automatic processor, there are illustrated an automatic processor in which a lithographic printing plate precursor after image-recording is subjected to a rubbing treatment while it is transporting described in JP-A-2-220061 and JP-A-60-59351, and an automatic processor in which a lithographic printing plate precursor after image-recording placed on a cylinder is subjected to a rubbing treatment while rotating the cylinder described in U.S. Pat. Nos. 5,148,746 and 5,568,768 and British Patent 2,297,719. Among them, the automatic processor using a rotating brush roll as the rubbing member is particularly preferred.

The rotating brush roller which can be preferably used in the invention can be appropriately selected by taking account, for example, of scratch resistance of the image area and nerve strength of the support of the lithographic printing plate precursor. As for the rotating brush roller, a known rotating brush roller produced by implanting a brush material in a plastic or metal roller can be used. For example, a rotating brush roller described in JP-A-58-159533 and JP-A-3-100554, or a brush roller described in JP-U-B-62-167253 (the term "JP-UM-B" as used herein means an "examined Japanese utility model publication"), in which a metal or plastic groove-type member having implanted therein in rows a brush material is closely radially wound around a plastic or metal roller acting as a core, can be used.

As the brush material, a plastic fiber (for example, a polyester-based synthetic fiber, e.g., polyethylene terephthalate or polybutylene terephthalate; a polyamide-based synthetic fiber, e.g., nylon 6.6 or nylon 6.10; a polyacrylic synthetic fiber, e.g., polyacrylonitrile or polyalkyl (meth)acrylate; and a polyolefin-based synthetic fiber, e.g., polypropylene or polystyrene) can be used. For instance, a brush material having a fiber bristle diameter of 20 to 400 μm and a bristle length of 5 to 30 mm can be preferably used.

The outer diameter of the rotating brush roller is preferably from 30 to 200 mm, and the peripheral velocity at the tip of the brush rubbing the plate surface is preferably from 0.1 to 5 m/sec.

Further, it is preferred to use a plurality, that is, two or more of the rotating brush rollers.

The rotary direction of the rotating brush roller for use in the invention may be the same direction or the opposite direction with respect to the transporting direction of the lithographic printing plate precursor of the invention, but when two or more rotating brush rollers are used in an automatic processor as shown in FIG. 1, it is preferred that at least one rotating brush roller rotates in the same direction and at least one rotating brush roller rotates in the opposite direction with respect to the transporting direction. By such arrangement, the photosensitive layer in the non-image area can be more steadily removed. Further, a technique of rocking the rotating brush roller in the rotation axis direction of the brush roller is also effective.

The developer can be used at an appropriate temperature, and the developer temperature is preferably from 10 to 50° C.

In the invention, the lithographic printing plate after the rubbing treatment may be subsequently subjected to water washing, a drying treatment and an oil-desensitization treatment, if desired. In the oil-desensitization treatment, a known oil-desensitizing solution can be used.

Further, in a plate-making process of the lithographic printing plate precursor to prepare a lithographic printing plate according to the invention, the entire surface of the lithographic printing plate precursor may be heated, if desired, before or during the exposure or between the exposure and the development. By the heating, the image-forming reaction in the photosensitive layer is accelerated and advantages, for example, improvement in the sensitivity and printing durability and stabilization of the sensitivity are achieved. For the purpose of increasing the image strength and printing durability, it is also effective to perform entire after-heating or entire exposure of the image after the development. Ordinarily, the heating before the development is preferably performed under 70° C. or more, for example, a mild condition of 70 to 150° C. When the temperature is too high, a problem may arise in that undesirable fog occurs in the non-image area. On the other hand, the heating after the development can be performed using a very strong condition. Ordinarily, the heat treatment is carried out in a temperature range of 200 to 500° C. When the temperature is too low, a sufficient effect of strengthening the image may not be obtained, whereas when it is excessively high, problems of deterioration of the support and thermal decomposition of the image area may occur.

The plate-making process is described in more detail below.

In the invention, although the development processing can be carried out just after the exposure step, the heat treatment step may intervene between the exposure step and the development step as described above. The heat treatment is effective for increasing the printing durability and improving uniformity of the image hardness degree in the entire surface of printing plate precursor. The conditions of the heat treatment can be appropriately determined in a range for providing such effects. Examples of the heating means include a conventional convection oven, an IR irradiation apparatus, an IR laser, a microwave apparatus or a Wisconsin oven. For instance, the heat treatment can be conducted by maintaining the printing plate precursor at a plate surface temperature ranging from 70 to 150° C. for a period of one second to 5 minutes, preferably at 80 to 140° C. for 5 seconds to one minute, more preferably at 90 to 130° C. for 10 to 30 seconds. In the above-described range, the effects described above are efficiently achieved and an adverse affect, for example, change in shape of the printing plate precursor due to the heat can be preferably avoided.

According to the invention, the development processing step is conducted after the exposure step, preferably after the exposure step and the heat treatment step to prepare a lithographic printing plate. It is preferable that a plate setter used in the exposure step, a heat treatment means used in the heat treatment step and a development apparatus used in the development processing step are connected with each other and the lithographic printing plate precursor is subjected to automatically continuous processing. Specifically, a plate-making line wherein the plate setter and the development apparatus are connected with each other by transport means, for example, a conveyer is illustrated. Also, the heat treatment means may be placed between the plate setter and the development apparatus or the heat treatment means and the development apparatus may constitute a unit apparatus.

In case where the lithographic printing plate precursor used is apt to be influenced by surrounding light under a working environment, it is preferable that the plate-making line is blinded by a filter, a cover or the like.

After the image formation as described above, the entire surface of lithographic printing plate may be exposed to active ray, for example, ultraviolet light to accelerate hardening of the image area. As a light source for the entire surface exposure, for example, a carbon arc lamp, a mercury lamp, a gallium lamp, a metal halide lamp, a xenon lamp, a tungsten lamp or various laser beams are exemplified. In order to obtain sufficient printing durability, the amount of the entire surface exposure is preferably 10 mJ/cm² or more, more preferably 100 mJ/cm² or more.

Heating may be performed at the same time with the entire surface exposure. By performing the heating, further improvement in the printing durability is recognized. Examples of the heating means include a conventional convection oven, an IR irradiation apparatus, an IR laser, a microwave apparatus or a Wisconsin oven. The plate surface temperature at the heating is preferably from 30 to 150° C., more preferably from 35 to 130° C., and still more preferably from 40 to 120° C.

The lithographic printing plate thus obtained through the treatments as described above is mounted on an offset printing machine to perform printing of a large number of prints.

As a plate cleaner which can be used for removing stain on the printing plate at the printing, conventionally known plate cleaners for PS plate may be used. Examples thereof include CL-1, CL-2, CP, CN-4, CN, CG-1, PC-1, SR and IC (produced by Fuji Photo Film Co., Ltd.).

EXAMPLES

The present invention will be described in more detail with reference to the following examples, but the invention should not be construed as being limited thereto.

Preparation Example of Organic Pigment Dispersion

Organic Pigment Dispersion (1)

A composition for organic pigment dispersion shown below was mixed and stirred to prepare a coarse dispersion.

| | |
|---|---|
| Propylene glycol monomethyl ether acetate | 17.5 parts by weight |
| Cyclohexanone | 17.5 parts by weight |
| Methoxy propanol | 40.0 parts by weight |
| Pigment Dispersant DB-2 | 10.0 parts by weight |
| Organic pigment: C.I. Pigment Blue 15:6 (ε-phthalocyanine) | 15.0 parts by weight |

The resulting coarse dispersion was dispersed in a sand mill filled with glass beads of 0.8 mm Φ at a circumferential velocity of 15 m/sec for 30 minutes to prepare Organic Pigment Dispersion (1). The absorption maximum peaks of the dispersion were 615 nm and 772 nm.

Organic Pigment Dispersion (2)

An organic pigment dispersion obtained by conducting dispersion in the same manners as in Organic Pigment Dispersion (1) except for changing the organic pigment of Organic Pigment Dispersion (1) to 15.0 parts by weight of C. I. Pigment Blue 15:3 (β-phthalocyanine) was designated as Organic Pigment Dispersion (2). The absorption maximum peaks of the dispersion were 617 nm and 710 nm.

Organic Pigment Dispersion (3)

An organic pigment dispersion obtained by conducting dispersion in the same manners as in Organic Pigment Dispersion (1) except for changing the organic pigment of Organic Pigment Dispersion (1) to 15.0 parts by weight of C. I. Pigment Blue 60 was designated as Organic Pigment Dispersion (3). The absorption maximum peak of the dispersion was 635 nm.

Organic Pigment Dispersions (4) to (20)

A composition for organic pigment dispersion shown below was mixed and stirred to prepare a coarse dispersion.

| | |
|---|---|
| Propylene glycol monomethyl ether acetate | 17.5 parts by weight |
| Cyclohexanone | 17.5 parts by weight |
| Methoxy propanol | 40.0 parts by weight |
| Pigment Dispersant shown in Table 1 | 10.0 parts by weight |
| Phthalocyanine blue | 15.0 parts by weight |

The resulting coarse dispersion was dispersed in a sand mill filled with glass beads of 0.8 mm Φ at a circumferential velocity of 15 m/sec for 30 minutes to prepare Organic Pigment Dispersions (4) to (20). The absorption maximum peaks of each of the dispersions were 610 nm and 710 nm.

Organic Pigment Dispersion (23)

An organic pigment dispersion obtained by conducting dispersion in the same manners as in Organic Pigment Dispersion (1) except for changing Pigment Dispersant DB-2 of Organic Pigment Dispersion (1) to the pigment dispersant shown in Table 1 was designated as Organic Pigment Dispersion (23). The absorption maximum peaks of the dispersion were 615 nm and 772 nm.

Organic Pigment Dispersion (24)

An organic pigment dispersion obtained by conducting dispersion in the same manners as in Organic Pigment Dispersion (2) except for changing Pigment Dispersant DB-2 of Organic Pigment Dispersion (2) to the pigment dispersant shown in Table 1 was designated as Organic Pigment Dispersion (24). The absorption maximum peaks of the dispersion were 617 nm and 710 nm.

Organic Pigment Dispersion (25)

An organic pigment dispersion obtained by conducting dispersion in the same manners as in Organic Pigment Dispersion (3) except for changing Pigment Dispersant DB-2 of Organic Pigment Dispersion (3) to the pigment dispersant shown in Table 1 was designated as Organic Pigment Dispersion (25). The absorption maximum peak of the dispersion was 635 nm.

Organic Pigment Dispersions (26) to (28)

Organic pigment dispersions obtained by conducting dispersion in the same manners as in Organic Pigment Dispersion (4) except for changing Pigment Dispersant DB-1 of Organic Pigment Dispersion (4) to the pigment dispersant shown in Table 1 were designated as Organic Pigment Dispersions (26) to (28), respectively. The absorption maximum peaks of each of the dispersions were 610 nm and 710 nm.

Measurement of Particle Size of Pigment Dispersion

The organic pigment dispersion obtained was diluted 0.3% by weight with methyl ethyl ketone (MEK) and measured by an ultracentrifugal automatic particle size distribution measurement device (CAPA-700, produced by Horiba, Ltd.) to determine an average particle size. The results are shown in Table 1.

Preparation of Support 1

An aluminum plate (material: 1050) having a thickness of 0.3 mm was subjected to a degrease treatment with an aqueous 10% by weight sodium aluminate solution at 50° C. for 30 seconds in order to remove rolling oil on the surface thereof. Thereafter, the aluminum plate surface was grained using three nylon brushes implanted with bundled bristles having a diameter of 0.3 mm and an aqueous suspension (specific gravity: 1.1 g/cm³) of pumice having a median diameter of 25 μm and then thoroughly washed with water. The plate was etched by dipping it in an aqueous 25% by weight sodium hydroxide solution at 45° C. for 9 seconds and after washing with water, dipped in an aqueous 20% by weight nitric acid solution at 60° C. for 20 seconds, followed by washing with water. The etching amount of the grained surface was about 3 g/m².

Subsequently, the aluminum plate was subjected to a continuous electrochemical surface roughening treatment using alternate current voltage of 60 Hz. The electrolytic solution used was an aqueous 1% by weight nitric acid solution (containing 0.5% by weight of aluminum ion) at a liquid temperature of 50° C. The electrochemical surface roughening treatment was performed using a rectangular wave alternate current having a trapezoidal waveform such that the time TP necessary for the current value to reach the peak from zero was 0.8 msec and the duty ratio was 1:1, and disposing a carbon electrode as the counter electrode. The auxiliary anode used was ferrite. The current density was 30 A/dm² in terms of the peak value of current, and 5% of the current flowing from the power source was divided to the auxiliary anode. The quantity of electricity at the nitric acid electrolysis was 175 C/dm² when the aluminum plate was serving as the anode. Then, the aluminum plate was washed with water by spraying.

Subsequently, the aluminum plate was subjected to an electrochemical surface roughening treatment in the same manner as in the nitric acid electrolysis above using, as the electrolytic solution, an aqueous 0.5% by weight hydrochloric acid solution (containing 0.5% by weight of aluminum ion) at a liquid temperature of 50° C. under the conditions that the quantity of electricity was 50 C/dm² when the aluminum plate was serving as the anode, and then washed with water by spraying. The plate was then treated in an aqueous 15% by weight sulfuric acid solution (containing 0.5% by weight of aluminum ion) as the electrolytic solution at a current density of 15 A/dm² to provide a direct current anodic oxide film of 2.5 g/m², thereafter washed with water and dried.

The center line average roughness (Ra) of the thus-treated aluminum plate was measured using a stylus having a diameter of 2 μm and found to be 0.51 μm.

Further, Undercoat Solution (1) shown below was coated using a bar to have a dry coating amount of 10 mg/m² and dried in an oven at 80° C. for 10 seconds to prepare Support (1) having an undercoat layer to be used in the experiments described below.

| <Undercoat Solution (1)> | |
|---|---|
| Undercoat Compound (1) shown below | 0.017 g |
| Methanol | 9.00 g |
| Water | 1.00 g |

Undercoat Compound (1)

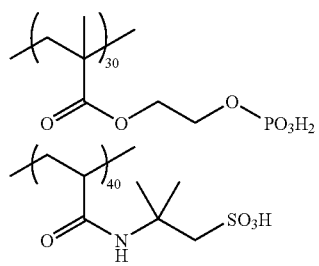

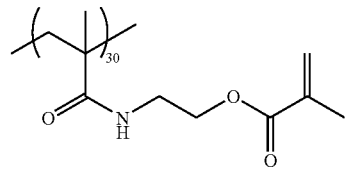

Preparation of Lithographic Printing Plate Precursors (1) to (28)

On the support having the undercoat layer prepared above, a coating solution for photosensitive layer having the composition shown below was coated using a bar and dried in an oven at 70° C. for 60 seconds to form a photosensitive layer having a dry coating amount of 1.1 g/m². On the photosensitive layer, Coating Solution (1) for Protective Layer having the composition shown below was coated using a bar to have a dry coating amount of 0.75 g/m² and dried at 125° C. for 70 seconds to prepare Lithographic Printing Plate Precursors (1) to (28), respectively.

| <Coating Solution for Photosensitive Layer> | |
|---|---|
| Binder Polymer (1) shown below (average molecular weight: 80,000, acid value: 0 meq/g) | 0.54 g |
| Polymerizable compound Isocyanuric acid EO-modified triacrylate (Aronics M-315, produced by Toa Gosei Co., Ltd.) | 0.40 g |
| Polymerizable compound Ethoxylated trimethylolpropane triacrylate (SR9035, EO addition molar number: 15, molecular weight: 1,000, produced by Nippon Kayaku Co., Ltd.) | 0.08 g |
| Sensitizing Dye (1) shown below | 0.06 g |
| Polymerization Initiator (1) shown below | 0.18 g |
| Co-sensitizer (1) shown below | 0.07 g |
| Organic pigment dispersion shown in Table 1 | 0.40 g |
| Thermal polymerization inhibitor N-nitrosophenylhydroxylamine aluminum salt | 0.01 g |
| Fluorine-Based Surfactant (1) shown below | 0.001 g |
| Polyoxyethylene-polyoxypropylene condensate (Pluronic L44, produced by ADEKA Corp.) | 0.04 g |
| Tetraethylamine hydrochloride | 0.01 g |
| 1-Methoxy-2-propanol | 3.5 g |
| Methyl ethyl ketone | 8.0 g |

Binder Polymer (1)

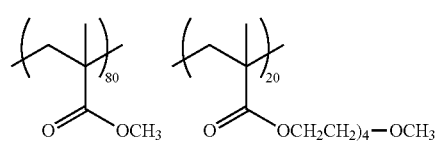

Sensitizing Dye (1)

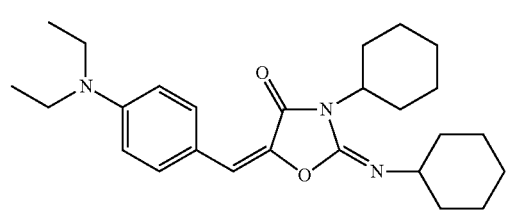

Polymerization Initiator (1)

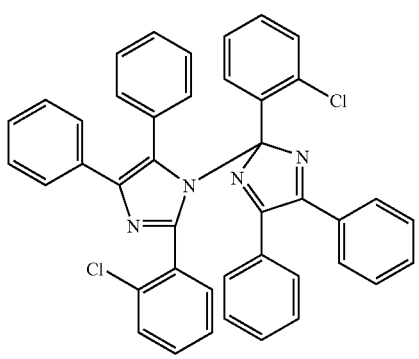

Co-sensitizer (1)

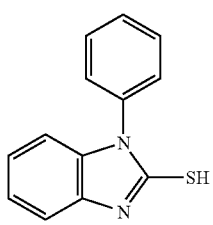

Fluorine-Based Surfactant (1)

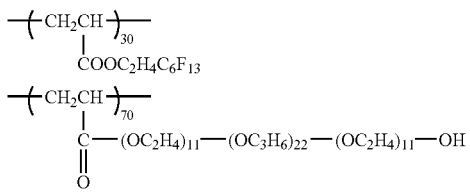

| <Coating Solution (1) for Protective Layer> | |
|---|---|
| Polyvinyl alcohol (saponification degree: 98% by mole; polymerization degree: 500) | 40 g |
| Polyvinyl pyrrolidone (molecular weight: 50,000) | 5 g |
| Vinyl pyrrolidone/vinyl acetate (1/1) copolymer (molecular weight: 70,000) | 0.5 g |
| Surfactant (Emalex 710, produced by Nihon-Emulsion Co., Ltd.) | 0.5 g |
| Water | 950 g |

TABLE 1

| Organic Pigment Dispersion | Pigment Dispersant | Average Particle Size (μm) |
|---|---|---|
| (1) | DB-2 (x/y = 20/80) | 0.125 |
| (2) | DB-2 (x/y = 20/80) | 0.133 |
| (3) | DB-2 (x/y = 20/80) | 0.138 |
| (4) | DB-1 (x/y = 20/80) | 0.141 |
| (5) | DB-2 (x/y = 20/80) | 0.111 |
| (6) | DB-3 (x/y = 20/80) | 0.122 |
| (7) | DB-5 (x/y = 20/80) | 0.115 |
| (8) | DB-10 (x/y = 30/70) | 0.136 |
| (9) | DB-13 (x/y = 30/70) | 0.118 |

TABLE 1-continued

| Organic Pigment Dispersion | Pigment Dispersant | Average Particle Size (μm) |
|---|---|---|
| (10) | DB-14 (x/y = 20/80) | 0.138 |
| (11) | DB-18 (x/y = 20/80) | 0.129 |
| (12) | DB-20 (x/y = 20/80) | 0.121 |
| (13) | DB-21 (x/y = 20/80) | 0.119 |
| (14) | DB-22 (x/y = 20/80) | 0.12 |
| (15) | DB-26 | 0.156 |
| (16) | DB-30 | 0.178 |
| (17) | DB-41 (x/y = 10/90) | 0.121 |
| (18) | DB-42 (x/y = 10/90) | 0.119 |
| (19) | DB-43 (x/y = 10/90) | 0.179 |
| (20) | DB-45 (x/y = 10/90) | 0.181 |
| (21) | DB-46 (x/y = 50/50) | 0.351 |
| (22) | DB-47 (x/y = 50/50) | 0.289 |
| (23) | DB-48 (x/y = 20/80) | 0.135 |
| (24) | DB-48 (x/y = 20/80) | 0.141 |
| (25) | DB-48 (x/y = 20/80) | 0.146 |
| (26) | DB-48 (x/y = 20/80) | 0.128 |
| (27) | DB-49 (x/y = 20/80) | 0.121 |
| (28) | DB-50 (x/y = 20/80) | 0.119 |

DB-46

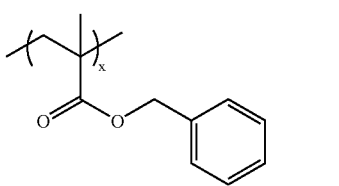

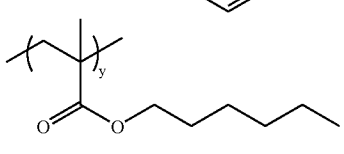

DB-47

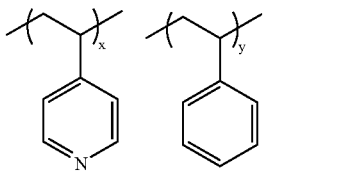

DB-48

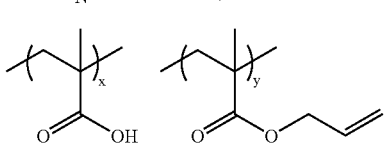

DB-49

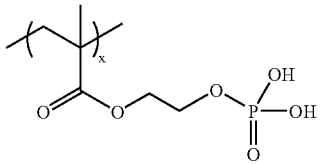
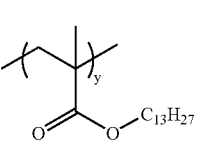

DB-50

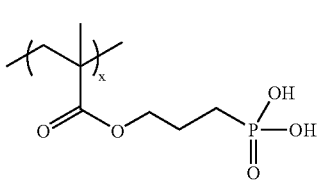

-continued

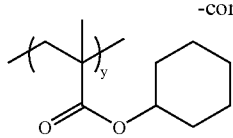

Preparation of Lithographic Printing Plate Precursor (29)

Lithographic Printing Plate Precursor (29) was prepared in the same manner as in the preparation of Lithographic Printing Plate Precursor (1) except for changing Sensitizing Dye (1), Polymerization Initiator (1) and Co-sensitizer (1) in Coating Solution for Photosensitive Layer to Sensitizing Dye (2), Polymerization Initiator (2) and Co-sensitizer (2) shown below, respectively.

Sensitizing Dye (2)

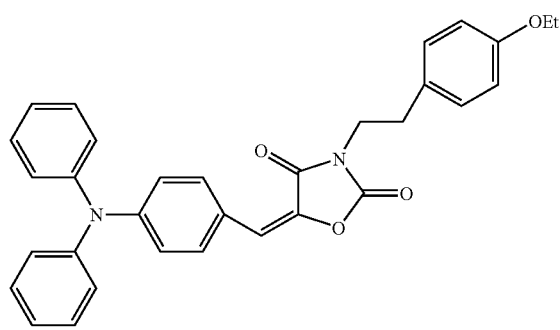

Polymerization Initiator (2)

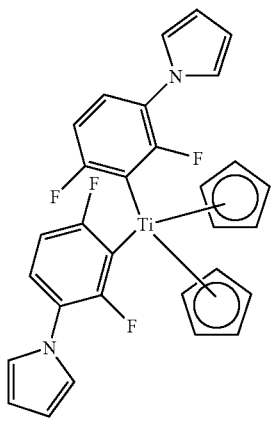

Co-sensitizer (2)

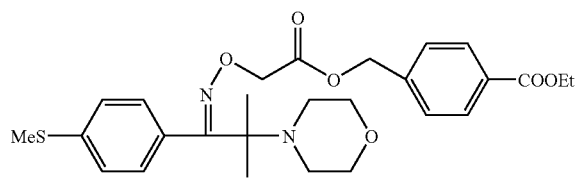

Preparation of Lithographic Printing Plate Precursor (30)

Lithographic Printing Plate Precursor (30) was prepared in the same manner as in the preparation of Lithographic Printing Plate Precursor (23) except for changing Sensitizing Dye (1), Polymerization Initiator (1) and Co-sensitizer (1) in Coating Solution for Photosensitive Layer to Sensitizing Dye (2), Polymerization Initiator (2) and Co-sensitizer (2) shown below, respectively.

Preparation of Lithographic Printing Plate Precursor (31)

Lithographic Printing Plate Precursor (31) was prepared in the same manner as in the preparation of Lithographic Printing Plate Precursor (1) except for changing the coating solution for photosensitive layer to a coating solution for photosensitive layer having the composition shown below.

| <Coating Solution for Photosensitive Layer> | |
|---|---|
| Polymerization Initiator (1) shown above | 0.2 g |
| Sensitizing Dye (1) shown above | 0.1 g |
| Binder Polymer (1) shown above (average molecular weight: 80,000) | 3.0 g |
| Polymerizable compound: Isocyanuric acid EO-modified diacrylate (Aronics M-215, produced by Toa Gosei Co., Ltd.) | 6.2 g |
| Organic Pigment Dispersion (1) shown above | 0.2 g |
| Fluorine-based Surfactant (1) shown above | 0.1 g |
| Dispersion of Microcapsule (1) shown below | 25.0 g |
| Methyl ethyl ketone | 35.0 g |
| 1-Methoxy-2-propanol | 35.0 g |

Preparation of Dispersion of Microcapsule (1)

As an oil phase component, 10 g of adduct of trimethylolpropane and xylene diisocyanate (Takenate D-110N, produced by Mitsui Takeda Chemicals, Inc.), 4.15 g of Isocyanuric acid EO-modified diacrylate (Aronics M-215, produced by Toa Gosei Co., Ltd.) and 0.1 g of Pionin A-41C (produced by Takemoto Oil & Fat Co., Ltd.) were dissolved in 17 g of ethyl acetate. As an aqueous phase component, 40 g of an aqueous 4% by weight PVA-205 solution was prepared. The oil phase component and the aqueous phase component were mixed and emulsified using a homogenizer at 12,000 rpm for 10 minutes. The resulting emulsion was added to 25 g of distilled water and the mixture was stirred at room temperature for 30 minutes and then stirred at 40° C. for 3 hours. The thus-obtained microcapsule solution was diluted with distilled water to have a solid content concentration of 20% by weight to prepare Dispersion of Microcapsule (1). The average particle diameter of the microcapsule was 0.25 μm.

Preparation of Lithographic Printing Plate Precursor (32)

Lithographic Printing Plate Precursor (32) was prepared in the same manner as in the preparation of Lithographic Printing Plate Precursor (31) except for changing Organic Pigment Dispersion (1) in Coating Solution for Photosensitive layer to Organic Pigment Dispersion (23) described above.

Preparation of Lithographic Printing Plate Precursor (33)

Lithographic Printing Plate Precursor (33) was prepared in the same manner as in the preparation of Lithographic Printing Plate Precursor (1) except for changing Coating Solution (1) for Protective Layer to Coating Solution (2) for Protective Layer having the composition shown below and coating using a bar to have a dry coating amount of 0.2 g/m².

| <Coating Solution (2) for Protective Layer> | |
|---|---|
| Dispersion of Mica (1) shown below | 13.0 g |
| Polyvinyl alcohol (saponification degree: 98% by mole; polymerization degree: 500) | 1.3 g |
| Sodium 2-ethylhexylsulfosuccinate | 0.2 g |
| Vinyl pyrrolidone/vinyl acetate (1/1) copolymer (molecular weight: 70,000) | 0.05 g |

| <Coating Solution (2) for Protective Layer> | |
|---|---|
| Surfactant (Emalex 710, produced by Nihon-Emulsion Co., Ltd.) | 0.05 g |
| Water | 133 g |

Preparation of Dispersion of Mica (1)

In 368 g of water was added 32 g of synthetic mica (SOMASIF ME-100, produced by CO-OP Chemical Co., Ltd.; aspect ratio: 1,000 or more) and dispersed using a homogenizer until the average particle diameter (measured by a laser scattering method) became 0.5 μm to obtain Dispersion of Mica (1).

Preparation of Lithographic Printing Plate Precursor (34)

Lithographic Printing Plate Precursor (34) was prepared in the same manner as in the preparation of Lithographic Printing Plate Precursor (23) except for changing Coating Solution (1) for Protective Layer to Coating Solution (2) for Protective Layer having the composition shown above and coating using a bar to have a dry coating amount of 0.2 g/m².

Examples 1 to 25 and Comparative Examples 1 to 9

(1) Exposure, Development and Printing

Each of Lithographic Printing Plate Precursors (1) to (34) was subjected to imagewise exposure using a semiconductor laser of 405 nm having an output of 100 mW while changing energy density.

Then, development processing was performed in an automatic development processor having a structure shown in FIG. 1 using Developer (1) having the composition shown below. The pH of the developer was 5. The automatic development processor was an automatic processor having two rotating brush rollers. As for the rotating brush rollers used, the first brush roller was a brush roller having an outer diameter of 90 mm and being implanted with fiber of polybutylene terephthalate (bristle diameter: 200 μm, bristle length: 17 mm), and the brush roller was rotated at 200 rpm in the same direction as the transporting direction (peripheral velocity at the tip of brush: 0.94 m/sec). The second brush roller was a brush roller having an outer diameter of 60 mm and being implanted with fiber of polybutylene terephthalate (bristle diameter: 200 μm, bristle length: 17 mm), and the brush roller was rotated at 200 rpm in the opposite direction to the transporting direction (peripheral velocity at the tip of brush: 0.63 m/sec). The transportation of the lithographic printing plate precursor was performed at a transporting speed of 100 cm/min.

The developer was supplied on the surface of the lithographic printing plate precursor by showering from a spray pipe using a circulation pump. The tank volume for the developer was 10 liters.

On the other hand, each of Lithographic Printing Plate Precursors (1) to (34) was incubated in an oven of 60° C. for 3 days and then subjected to the image exposure and development processing in the same manner as described above.

| Developer (1) | |
|---|---|
| Water | 100.00 g |
| Benzyl alcohol | 1.00 g |
| Polyoxyethylene naphthyl ether (average number of oxyethylene: n = 13) | 1.00 g |
| Sodium salt of dioctylsulfosuccinic acid ester | 0.50 g |
| Gum arabic | 1.00 g |
| Ethylene glycol | 0.50 g |
| Ammonium primary phosphate | 0.05 g |
| Citric acid | 0.05 g |
| Tetrasodium salt of ethylenediaminetetraacetate | 0.05 g |

The lithographic printing plate after development was mounted on a printing machine, SOR-M, produced by Heidelberg, and printing was performed at a printing speed of 6,000 sheets per hour using dampening water (EU-3 (etching solution, produced by Fuji Photo Film Co., Ltd.))/water/isopropyl alcohol=1/89/10 (by volume ratio)) and TRANS-G (N) black ink (produced by Dai-Nippon Ink & Chemicals, Inc.).

(2) Evaluation

Using the lithographic printing plate precursors prepared above and the lithographic printing plate precursors incubated in an oven of 60° C. for 3 days, the coloring property, color remaining property and stain preventing property were evaluated in the following manner. The results obtained are shown in Table 2 below.

Coloring Property

Cyan density of the photosensitive layer of the lithographic printing plate before image exposure was measured by a Macbeth densitometer and the coloring property was evaluated according to the value of density. As the value is large, the coloring property is high.

Color Remaining Property

Cyan density of the non-image area of the lithographic printing plate after the development processing in the manner described above was measured by a Macbeth densitometer and the color remaining property was evaluated according to the value of density. As the value is small, the residual color is small and the color remaining property is good.

Stain Preventing Property

After performing the printing of 500 sheets in the manner described above, ink stain occurred in the non-image area was visually determined. With respect to the 500$^{th}$ printed material, a case where the non-image area was not stained at all was rated 10 and a case where the non-image area was almost stained with ink was rated 1. The rate of 10 to 9 in the stain preventing property means a level where the stain in the non-image area is not determined even by observing through a loupe and the rate of 8 to 6 mans a level where the stain in the non-image area is determined by observing through a loupe (8) or the stain in the non-image area is visually determined (6).

TABLE 2

| | Lithographic Printing Plate Precursor | Coloring Property | Color Remaining Property | | Stain Preventing Property | |
|---|---|---|---|---|---|---|
| | | | Without incubation | 60° C., 3 days | Without incubation | 60° C., 3 days |
| Example 1 | (1) | 1.41 | 0.64 | 0.64 | 10 | 10 |
| Example 2 | (2) | 1.4 | 0.64 | 0.64 | 10 | 10 |
| Example 3 | (3) | 1.51 | 0.65 | 0.65 | 10 | 10 |

TABLE 2-continued

| | Lithographic Printing Plate Precursor | Coloring Property | Color Remaining Property | | Stain Preventing Property | |
|---|---|---|---|---|---|---|
| | | | Without incubation | 60° C., 3 days | Without incubation | 60° C., 3 days |
| Example 4 | (4) | 1.32 | 0.64 | 0.64 | 10 | 10 |
| Example 5 | (5) | 1.43 | 0.64 | 0.64 | 10 | 10 |
| Example 6 | (6) | 1.42 | 0.64 | 0.64 | 10 | 10 |
| Example 7 | (7) | 1.41 | 0.64 | 0.64 | 10 | 10 |
| Example 8 | (8) | 1.36 | 0.64 | 0.64 | 10 | 10 |
| Example 9 | (9) | 1.41 | 0.65 | 0.65 | 10 | 10 |
| Example 10 | (10) | 1.35 | 0.64 | 0.64 | 10 | 10 |
| Example 11 | (11) | 1.37 | 0.64 | 0.64 | 10 | 10 |
| Example 12 | (12) | 1.42 | 0.64 | 0.64 | 10 | 10 |
| Example 13 | (13) | 1.43 | 0.64 | 0.64 | 10 | 10 |
| Example 14 | (14) | 1.42 | 0.64 | 0.64 | 10 | 10 |
| Example 15 | (15) | 1.25 | 0.65 | 0.65 | 9 | 9 |
| Example 16 | (16) | 1.25 | 0.65 | 0.65 | 9 | 9 |
| Example 17 | (17) | 1.59 | 0.64 | 0.64 | 10 | 10 |
| Example 18 | (18) | 1.61 | 0.64 | 0.64 | 10 | 10 |
| Example 19 | (19) | 1.51 | 0.64 | 0.64 | 10 | 10 |
| Example 20 | (20) | 1.50 | 0.64 | 0.64 | 10 | 10 |
| Example 21 | (21) | 1.19 | 0.65 | 0.65 | 9 | 9 |
| Example 22 | (22) | 1.2 | 0.65 | 0.65 | 9 | 9 |
| Example 23 | (29) | 1.41 | 0.64 | 0.64 | 10 | 10 |
| Example 24 | (31) | 1.42 | 0.64 | 0.64 | 10 | 10 |
| Example 25 | (33) | 1.41 | 0.64 | 0.64 | 10 | 10 |
| Comparative Example 1 | (23) | 1.41 | 0.71 | 0.83 | 8 | 4 |
| Comparative Example 2 | (24) | 1.40 | 0.71 | 0.84 | 8 | 4 |
| Comparative Example 3 | (25) | 1.51 | 0.73 | 0.86 | 7 | 2 |
| Comparative Example 4 | (26) | 1.42 | 0.72 | 0.87 | 8 | 4 |
| Comparative Example 5 | (27) | 1.42 | 0.72 | 0.88 | 6 | 3 |
| Comparative Example 6 | (28) | 1.43 | 0.71 | 0.92 | 6 | 2 |
| Comparative Example 7 | (29) | 1.41 | 0.71 | 0.81 | 7 | 3 |
| Comparative Example 8 | (32) | 1.41 | 0.72 | 0.83 | 7 | 3 |
| Comparative Example 9 | (34) | 1.41 | 0.71 | 0.85 | 7 | 3 |

From the results shown in Table 2, it can be seen that in the cases (the examples) where the pigment dispersant which does not have any of a —COOH group, a —PO$_3$H$_2$ group and a —OPO$_3$H$_2$ group is used, the color remaining property and stain preventing property are excellent in comparison with the cases (the comparative examples) where the pigment dispersant which has a —COOH group, a —PO$_3$H$_2$ group or a —OPO$_3$H$_2$ group is used. Therefore, according to the lithographic printing plate precursor of the invention, the pigment in the non-image area can be well removed after the development, so that the plate-inspecting property can be improved due to elimination of residual color in the non-image area and the occurrence of stain during printing can be prevented.

Examples 26 to 30

The image exposure, development processing and printing were conducted in the same manner as in Example 1 except that within 30 seconds after the image exposure of Lithographic Printing Plate Precursors (1) to (5) conducted in the same manner as in Example 1, each of the exposed lithographic printing plate precursors was put in an oven and heated the whole surface of the lithographic printing plate precursor by blowing hot air to maintain at 110° C. for 15 seconds and after that the development processing was performed within 30 seconds in the same manner as in Example 1.

With the printing plates thus-obtained, the color remaining property and stain preventing property were evaluated in the same manner as in Example 1 and the sensitivity and printing durability were evaluated in the following manner. The results obtained are shown in Table 3 together with the evaluation results of Examples 1 to 5 including the sensitivity and printing durability.

Sensitivity

After performing printing of 100 sheets as described above and confirming that a printed material free from ink stain in the non-image area was obtained, 500 sheets were continuously printed. Thus, 600 sheets in total were printed. The exposure amount for causing no unevenness in the ink density of the image area on the 600$^{th}$ printed material was determined and defined as the sensitivity.

Printing Durability

As increase in the number of printing sheets under the above-described printing conditions, the photosensitive layer was gradually abraded to cause decrease in the ink receptivity, resulting in decrease of ink density on printing paper. A number of printed materials obtained until the ink density (reflection density) decreased by 0.1 from that at the initiation of printing was determined to evaluate the printing durability.

TABLE 3

| Lithographic Printing Plate Precursor | Color Remaining Property | Stain Preventing Property | Sensitivity (mJ/cm$^2$) | Printing Durability ($\times 10^5$ sheets) |
|---|---|---|---|---|
| Example 1 | (1) | 0.64 | 10 | 0.2 | 9 |
| Example 2 | (2) | 0.64 | 10 | 0.21 | 9 |
| Example 3 | (3) | 0.65 | 10 | 0.23 | 8 |
| Example 4 | (4) | 0.64 | 10 | 0.26 | 7 |
| Example 5 | (5) | 0.64 | 10 | 0.22 | 8 |
| Example 26 | (1) | 0.64 | 10 | 0.11 | 11 |
| Example 27 | (2) | 0.64 | 10 | 0.11 | 12 |
| Example 28 | (3) | 0.64 | 10 | 0.12 | 11 |
| Example 29 | (4) | 0.65 | 10 | 0.17 | 10 |
| Example 30 | (5) | 0.64 | 10 | 0.1 | 11 |

Examples 31 to 35

Each of Lithographic Printing Plate Precursors (1) to (5) was subjected to image exposure by a violet semiconductor laser plate setter Vx9600 (having InGaN semiconductor laser: emission: 405 nm±10 nm/output: 30 mW, produced by FUJIFILM Electronic Imaging, Ltd.). As for the image, halftone dots of 35% were drawn using an FM screen (TAFFETA 20, produced by Fuji Photo Film Co., Ltd.) in a plate surface exposure amount of 0.09 mJ/cm$^2$ and at resolution of 2,438 dpi. The exposed lithographic printing plate precursor was subjected to development processing within 30 seconds after the image exposure using an automatic processor (LP1250PLX, produced by Fuji Photo Film Co., Ltd.). The automatic processor was composed of a heating unit, a water-washing unit, a developing unit, a rinsing unit and a finishing unit in this order. The heating condition in the heating unit was 100° C. for 10 seconds. In all bathes of the water-washing unit, developing unit, rinsing unit and finishing unit, Developer (1) described above was charged. The temperature of the developer was 28° C. and the transportation of the lithographic printing plate precursor was performed at a transporting speed of 110 cm/min.

After the development processing, the non-image area and image area of the resulting lithographic printing plate were visually observed. As a result, it was found that the residual color in the non-image area was not present and the uniform halftone dot image free from unevenness was formed. Further, the printing was conducted using the lithographic printing plate under the conditions same as in Example 1. As a result, good printed materials of uniform halftone dot image free from unevenness and without stain in the non-image area were obtained.

This application is based on Japanese Patent application JP 2006-202035, filed Jul. 25, 2006, the entire content of which is hereby incorporated by reference, the same as if fully set forth herein.

Although the invention has been described above in relation to preferred embodiments and modifications thereof, it will be understood by those skilled in the art that other variations and modifications can be effected in these preferred embodiments without departing from the scope and spirit of the invention.

What is claimed is:

1. A lithographic printing plate precursor comprising: an aluminum support having a hydrophilic surface; and a photosensitive layer comprising a binder polymer having an acid value of 0.3 meq/g or less, wherein the photosensitive layer comprises a pigment dispersed with a pigment dispersant which is free from a —COOH group, a —PO$_3$H$_2$ group and a —OPO$_3$H$_2$ group, and is a compound comprising (a) a unit having a functional group adsorbing to the pigment, the functional group being selected from groups represented by the following formulae, and (b) a unit having a functional group imparting dispersibility in an organic solvent:

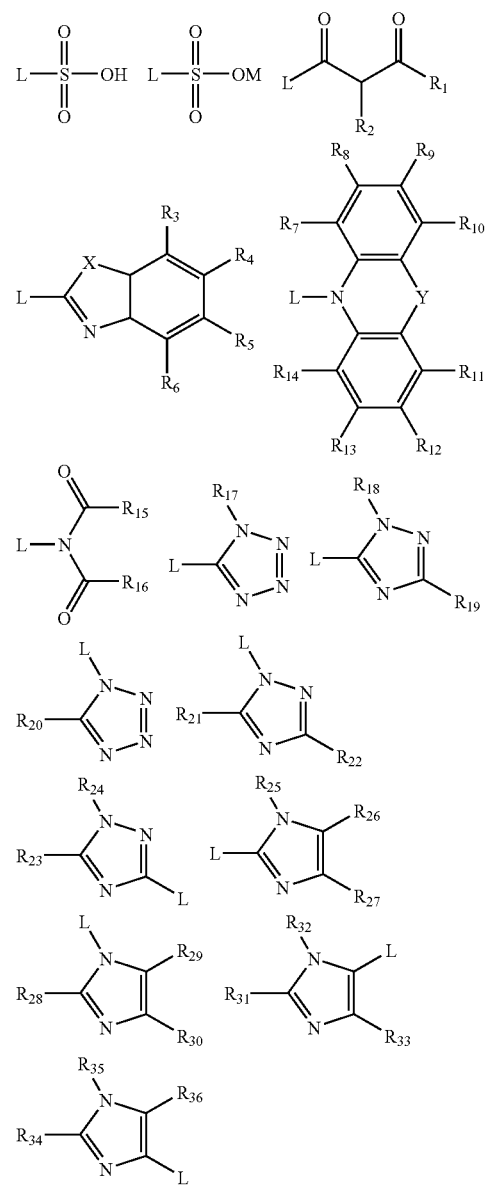

wherein $R_1$ to $R_{36}$ each independently represents an alkyl group which may have a substituent, an aryl group which may have a substituent, an alkenyl group which may have a substituent, an alkynyl group which may have a substituent, —OR, —NRR', —SR, —COR, —COOR, —CONRR', —OCOR, —OCONRR', —OCOOR, —NRCOR', —NRCOOR', —NRCONR'R", —N=R, —SO$_2$R, —SO$_3$R, —SO$_2$NRR', a hydrogen atom, a halogen atom, a cyano group, a nitro group, a hydroxy group or a mercapto group, in which R, R' and R"each represents an alkyl group, an aryl group, an alkenyl group, an alkynyl group or a hydrogen atom or may be connected with each other to form a ring, provided that a —COOH group is not formed, or $R_1$ to $R_{36}$ may be connected with each other to form a ring, L represents a divalent connecting group for connecting to a compound skeleton and comprising one or more atoms selected from a carbon atom, an oxygen atom, a nitrogen atom, a sulfur atom, a phosphorus atom, a silicon atom, a halogen atom and a boron atom, X represents an oxygen atom, a sulfur atom, a selenium atom or $NR_{37}$ in which $R_{37}$ has the same meaning as $R_1$, Y represents a covalent bond, an oxygen atom, a sulfur atom, $NR_{38}$ in which $R_{38}$ has the same meaning as $R_1$, CO or $SO_2$, and M represents an alkali metal;

wherein the pigment dispersant has a weight average molecular weight of from 1,000 to 1,000,000;

wherein the functional group imparting dispersibility in an organic solvent included in the unit (b) comprises a hydrocarbon group having 6 or more carbon atoms;

wherein the lithographic printing plate precursor further comprises an undercoat layer between the aluminum support and the photosensitive layer, the undercoat layer comprising a compound having a polymerizable group, and wherein the undercoat layer does not comprise a pigment dispersed with the pigment dispersant.

2. The lithographic printing plate precursor as claimed in claim 1, wherein the photosensitive layer further comprises a radical polymerizable compound.

3. The lithographic printing plate precursor as claimed in claim 1, wherein the binder polymer having an acid value of 0.3 meq/g or less has a weight average molecular weight of 10,000 or more.

4. The lithographic printing plate precursor as claimed in claim 1, wherein the photosensitive layer further comprises a sensitizing dye having absorption in a wavelength range of from 360 to 450 nm.

5. The lithographic printing plate precursor as claimed in claim 1, which further comprises a protective layer so that the aluminum support, the photosensitive layer and the protective layer are provided in this order.

6. A method for preparing a lithographic printing plate comprising:
exposing imagewise the lithographic printing plate precursor as claimed in claim 1 with a laser having an oscillation wavelength in a wavelength range of from 360 to 450 nm; and
rubbing a surface of the exposed lithographic printing plate precursor with a rubbing member in the presence of a developer having pH of from 2 to 10 in an automatic processor equipped with the rubbing member to remove an unexposed area of the photosensitive layer.

7. The method for preparing a lithographic printing plate according to claim 6 comprising:
heating the exposed lithographic printing plate precursor at temperature of 70° C. or more; and
rubbing a surface of the heated lithographic printing plate precursor with a rubbing member in the presence of a developer having pH of from 2 to 10 in an automatic processor equipped with the rubbing member to remove an unexposed area of the photosensitive layer.

8. A method for preparing a lithographic printing plate comprising:
exposing imagewise with a laser a lithographic printing plate precursor according to claim 1 comprising an aluminum support having a hydrophilic surface and a photosensitive layer comprising a binder polymer, wherein the photosensitive layer comprises a pigment dispersed with a pigment dispersant comprising (a) a unit having a functional group adsorbing to the pigment and (b) a unit having a functional group imparting dispersibility in an organic solvent; and
developing the exposed lithographic printing plate precursor with a developer having pH of from 2 to 10.

9. The lithographic printing plate precursor as claimed in claim 1, wherein the photosensitive layer further comprises a radical polymerizable compound.

10. The lithographic printing plate precursor as claimed in claim 1, wherein the binder polymer having an acid value of 0.3 meq/g or less has a weight average molecular weight of 10,000 or more.

11. The lithographic printing plate precursor as claimed in claim 2, wherein the binder polymer having an acid value of 0.3 meq/g or less has a weight average molecular weight of 10,000 or more.

12. The lithographic printing plate precursor as claimed in claim 9, wherein the binder polymer having an acid value of 0.3 meq/g or less has a weight average molecular weight of 10,000 or more.

13. The lithographic printing plate precursor as claimed in claim 1, wherein the photosensitive layer further comprises a sensitizing dye having absorption in a wavelength range of from 360 to 450 nm.

14. The lithographic printing plate precursor as claimed in claim 2, wherein the photosensitive layer further comprises a sensitizing dye having absorption in a wavelength range of from 360 to 450 nm.

15. The lithographic printing plate precursor as claimed in claim 3, wherein the photosensitive layer further comprises a sensitizing dye having absorption in a wavelength range of from 360 to 450 nm.

16. The lithographic printing plate precursor as claimed in claim 9, wherein the photosensitive layer further comprises a sensitizing dye having absorption in a wavelength range of from 360 to 450 nm.

17. The lithographic printing plate precursor as claimed in claim 10, wherein the photosensitive layer further comprises a sensitizing dye having absorption in a wavelength range of from 360 to 450 nm.

18. The lithographic printing plate precursor as claimed in claim 11, wherein the photosensitive layer further comprises a sensitizing dye having absorption in a wavelength range of from 360 to 450 nm.

19. The lithographic printing plate precursor as claimed in claim 12, wherein the photosensitive layer further comprises a sensitizing dye having absorption in a wavelength range of from 360 to 450 nm.

20. The lithographic printing plate precursor as claimed in claim 1, wherein the functional group adsorbing to the pigment is selected from groups represented by the following formulae:

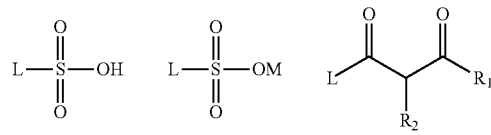

-continued

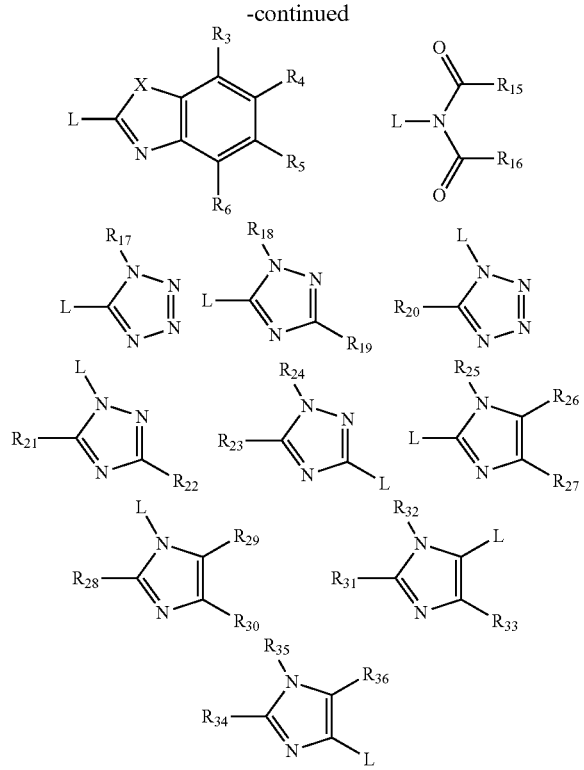

wherein $R_1$ to $R_{36}$ each independently represents an alkyl group which may have a substituent, an aryl group which may have a substituent, an alkenyl group which may have a substituent, an alkynyl group which may have a substituent, —OR, —NRR', —SR, —COR, —COOR, —CONRR', —OCOR, —OCONRR', —OCOOR, —NRCOR', —NRCOOR', —NRCONR'R", —N=R, —SO$_2$R, —SO$_3$R, —SO$_2$NRR', a hydrogen atom, a halogen atom, a cyano group, a nitro group, a hydroxy group or a mercapto group, in which R, R' and R"each represents an alkyl group, an aryl group, an alkenyl group, an alkynyl group or a hydrogen atom or may be connected with each other to form a ring, provided that a —COOH group is not formed, or $R_1$ to $R_{36}$ may be connected with each other to form a ring, L represents a divalent connecting group for connecting to a compound skeleton and comprising one or more atoms selected from a carbon atom, an oxygen atom, a nitrogen atom, a sulfur atom, a phosphorus atom, a silicon atom, a halogen atom and a boron atom, X represents an oxygen atom, a sulfur atom, a selenium atom or $NR_{37}$ in which $R_{37}$ has the same meaning as $R_1$, and M represents an alkali metal.

21. The lithographic printing plate precursor as claimed in claim 1, wherein the divalent connecting group represented by L further comprises a hydrogen atom.

22. The lithographic printing plate precursor as claimed in claim 20, wherein the divalent connecting group represented by L further comprises a hydrogen atom.

\* \* \* \* \*